(12) United States Patent
Diebel et al.

(10) Patent No.: US 9,402,452 B2
(45) Date of Patent: Aug. 2, 2016

(54) METHOD OF MAKING A SMARTPHONE CASE WITH A BATTERY

(71) Applicant: MOPHIE, INC., Tustin, CA (US)

(72) Inventors: Markus Diebel, San Francisco, CA (US); David Johnson, San Francisco, CA (US)

(73) Assignee: mophie, inc., Tustin, CA (US)

( * ) Notice: Subject to any disclaimer, the term of this patent is extended or adjusted under 35 U.S.C. 154(b) by 108 days.

(21) Appl. No.: 14/020,710

(22) Filed: Sep. 6, 2013

(65) Prior Publication Data

US 2014/0165379 A1   Jun. 19, 2014

Related U.S. Application Data

(63) Continuation of application No. 13/026,022, filed on Feb. 11, 2011, now Pat. No. 8,531,833, which is a continuation of application No. 12/862,552, filed on Aug. 24, 2010, now Pat. No. 7,889,498, which is a continuation of application No. 12/580,977, filed on Oct. 16, 2009, now Pat. No. 7,782,610, which is a continuation of application No. 12/464,059, filed on May 11, 2009, now Pat. No. 7,612,997.

(60) Provisional application No. 61/115,529, filed on Nov. 17, 2008, provisional application No. 61/157,111, filed on Mar. 3, 2009, provisional application No. 61/171,455, filed on Apr. 21, 2009.

(51) Int. Cl.
| | |
|---|---|
| *H01S 4/00* | (2006.01) |
| *A45C 11/00* | (2006.01) |
| *G06F 1/16* | (2006.01) |
| *H04B 1/3883* | (2015.01) |
| *H04M 1/02* | (2006.01) |
| *H04M 1/04* | (2006.01) |

(Continued)

(52) U.S. Cl.
CPC ............. *A45C 11/00* (2013.01); *G06F 1/1628* (2013.01); *G06F 1/189* (2013.01); *H04B 1/3883* (2013.01); *H04M 1/0262* (2013.01); *H04M 1/04* (2013.01); *H05K 13/00* (2013.01); *A45C 2011/001* (2013.01); *A45C 2011/003* (2013.01); *Y10T 29/49002* (2015.01); *Y10T 29/49826* (2015.01)

(58) Field of Classification Search
CPC .......... Y10T 29/49002; H01M 2/1022; H01M 10/46; H01M 2220/30
USPC ........................ 29/592.1; 361/679.56, 679.41
See application file for complete search history.

(56) References Cited

U.S. PATENT DOCUMENTS

| | | | |
|---|---|---|---|
| 3,851,126 | A | 11/1974 | Keller |
| 4,028,515 | A | 6/1977 | Desio et al. |

(Continued)

FOREIGN PATENT DOCUMENTS

| | | |
|---|---|---|
| CN | 201252577 Y | 6/2009 |
| CN | 202364273 U | 8/2012 |

(Continued)

OTHER PUBLICATIONS

Reexamination Control No. 90/013,319, Sep. 18, 2014 Filing Date, Huang et al.

(Continued)

*Primary Examiner* — Paul D Kim
(74) *Attorney, Agent, or Firm* — Knobbe, Martens, Olson & Bear, LLP

(57) ABSTRACT

A case for a smartphone electronic device protects and extends the battery life of the smartphone. The case has a first case portion and a second case portion, which assemble together to protect the top, side, and bottom edges of the smartphone. The lower case portion includes a battery to extend the battery life of the electronic device.

6 Claims, 25 Drawing Sheets

(51) Int. Cl.
*H05K 13/00* (2006.01)
*G06F 1/18* (2006.01)

(56) References Cited

U.S. PATENT DOCUMENTS

| | | | |
|---|---|---|---|
| D267,795 S | 2/1983 | Mallon | |
| 4,479,596 A | 10/1984 | Swanson | |
| 4,515,272 A | 5/1985 | Newhouse | |
| D284,372 S | 6/1986 | Carpenter | |
| 4,951,817 A | 8/1990 | Barletta et al. | |
| D312,534 S | 12/1990 | Nelson et al. | |
| 5,001,772 A | 3/1991 | Holcomb et al. | |
| D322,719 S | 12/1991 | Jayez | |
| D327,868 S | 7/1992 | Oka | |
| 5,360,108 A | 11/1994 | Alagia | |
| 5,368,159 A * | 11/1994 | Doria | 206/320 |
| 5,383,091 A | 1/1995 | Snell | |
| 5,386,084 A | 1/1995 | Risko | |
| 5,508,123 A | 4/1996 | Fan | |
| D372,896 S * | 8/1996 | Nagele et al. | D13/103 |
| 5,586,002 A * | 12/1996 | Notarianni | 361/679.26 |
| 5,604,050 A * | 2/1997 | Brunette et al. | 429/97 |
| 5,610,979 A * | 3/1997 | Yu | 379/455 |
| D384,327 S | 9/1997 | Nakui | |
| 5,708,707 A * | 1/1998 | Halttunen et al. | 379/446 |
| 5,711,013 A * | 1/1998 | Collett et al. | 455/558 |
| D392,248 S * | 3/1998 | Johansson | D13/103 |
| D392,939 S * | 3/1998 | Finke-Anlauff | D13/103 |
| 5,786,106 A | 7/1998 | Armani | |
| 5,816,459 A | 10/1998 | Armistead | |
| D400,495 S * | 11/1998 | Deslyper et al. | D13/103 |
| D400,496 S | 11/1998 | Barber et al. | |
| 5,859,481 A | 1/1999 | Banyas | |
| 5,864,766 A * | 1/1999 | Chiang | 455/572 |
| D405,801 S | 2/1999 | Nagele et al. | |
| D407,063 S | 3/1999 | Reis et al. | |
| 5,876,351 A | 3/1999 | Rohde | |
| D407,708 S | 4/1999 | Nagele et al. | |
| 5,896,277 A | 4/1999 | Leon et al. | |
| 5,932,855 A | 8/1999 | Wang et al. | |
| 5,959,433 A | 9/1999 | Rohde | |
| 5,973,477 A | 10/1999 | Chang | |
| D417,189 S | 11/1999 | Amero, Jr. et al. | |
| 6,043,626 A * | 3/2000 | Snyder et al. | 320/113 |
| D424,512 S | 5/2000 | Ho | |
| 6,069,332 A | 5/2000 | Suchanek et al. | |
| 6,081,595 A | 6/2000 | Picaud | |
| D428,019 S | 7/2000 | Amron | |
| 6,082,535 A | 7/2000 | Mitchell | |
| 6,171,138 B1 | 1/2001 | Lefebvre et al. | |
| D438,004 S | 2/2001 | Watson et al. | |
| 6,184,654 B1 * | 2/2001 | Bachner et al. | 320/114 |
| D439,218 S | 3/2001 | Yu | |
| 6,201,867 B1 | 3/2001 | Koike | |
| 6,208,115 B1 | 3/2001 | Binder | |
| 6,266,539 B1 | 7/2001 | Pardo | |
| D446,497 S | 8/2001 | Yu | |
| 6,273,252 B1 | 8/2001 | Mitchell | |
| D447,462 S | 9/2001 | Kosiba | |
| 6,313,982 B1 | 11/2001 | Hino | |
| 6,317,313 B1 * | 11/2001 | Mosgrove et al. | 361/679.3 |
| 6,324,380 B1 * | 11/2001 | Kiuchi et al. | 455/12.1 |
| 6,346,791 B1 | 2/2002 | Barguirdjian | |
| 6,405,056 B1 | 6/2002 | Altschul et al. | |
| D460,411 S * | 7/2002 | Wang | D13/103 |
| D460,761 S | 7/2002 | Croley | |
| 6,415,138 B2 | 7/2002 | Sirola et al. | |
| 6,445,577 B1 | 9/2002 | Madsen et al. | |
| 6,471,056 B1 | 10/2002 | Tzeng | |
| D469,427 S | 1/2003 | Ma et al. | |
| 6,536,589 B2 | 3/2003 | Chang | |
| 6,538,413 B1 * | 3/2003 | Beard et al. | 320/114 |
| D472,384 S | 4/2003 | Richardson | |
| 6,552,513 B1 | 4/2003 | Li | |
| 6,555,990 B1 * | 4/2003 | Yang | 320/113 |
| 6,583,601 B2 | 6/2003 | Simoes et al. | |
| 6,594,472 B1 | 7/2003 | Curtis et al. | |
| 6,614,722 B2 * | 9/2003 | Polany et al. | 367/131 |
| 6,626,362 B1 | 9/2003 | Steiner et al. | |
| D481,716 S | 11/2003 | He et al. | |
| D482,529 S | 11/2003 | Hardigg et al. | |
| 6,646,864 B2 | 11/2003 | Richardson | |
| D484,874 S | 1/2004 | Chang et al. | |
| D485,834 S | 1/2004 | Davetas | |
| 6,681,003 B2 | 1/2004 | Linder et al. | |
| 6,701,159 B1 | 3/2004 | Powell | |
| 6,708,887 B1 | 3/2004 | Garrett et al. | |
| 6,714,802 B1 | 3/2004 | Barvesten | |
| 6,785,566 B1 | 8/2004 | Irizarry | |
| 6,819,549 B1 | 11/2004 | Lammers-Meis et al. | |
| D500,041 S | 12/2004 | Tsujimoto | |
| D506,612 S | 6/2005 | Rosa et al. | |
| D508,495 S | 8/2005 | Bone et al. | |
| D513,123 S | 12/2005 | Richardson et al. | |
| 6,980,777 B2 | 12/2005 | Shepherd et al. | |
| D513,451 S | 1/2006 | Richardson et al. | |
| 6,992,461 B2 * | 1/2006 | Liang et al. | 320/107 |
| D514,808 S | 2/2006 | Morine et al. | |
| D516,309 S | 3/2006 | Richardson et al. | |
| D516,553 S | 3/2006 | Richardson et al. | |
| D516,554 S | 3/2006 | Richardson et al. | |
| D516,807 S | 3/2006 | Richardson et al. | |
| D517,007 S | 3/2006 | Yong-Jian et al. | |
| D520,744 S | 5/2006 | Pangrec et al. | |
| 7,050,841 B1 | 5/2006 | Onda | |
| 7,069,063 B2 | 6/2006 | Halkosaari et al. | |
| D525,582 S | 7/2006 | Chan | |
| 7,072,699 B2 | 7/2006 | Eiden | |
| 7,079,879 B1 | 7/2006 | Sylvester et al. | |
| 7,081,736 B2 | 7/2006 | Seil et al. | |
| D526,780 S | 8/2006 | Richardson et al. | |
| D526,958 S | 8/2006 | Shimizu | |
| D530,079 S | 10/2006 | Thomas et al. | |
| D535,252 S | 1/2007 | Sandnes | |
| 7,158,376 B2 | 1/2007 | Richardson et al. | |
| 7,166,987 B2 * | 1/2007 | Lee et al. | 320/114 |
| D537,063 S | 2/2007 | Kim et al. | |
| 7,180,735 B2 | 2/2007 | Thomas et al. | |
| 7,180,754 B2 | 2/2007 | Qin et al. | |
| 7,194,291 B2 | 3/2007 | Peng | |
| D540,539 S | 4/2007 | Gutierrez | |
| 7,203,467 B2 | 4/2007 | Siddiqui | |
| D542,286 S | 5/2007 | Taniyama et al. | |
| D542,524 S | 5/2007 | Richardson et al. | |
| D543,541 S | 5/2007 | Chung et al. | |
| D544,486 S | 6/2007 | Hussaini et al. | |
| 7,230,823 B2 | 6/2007 | Richardson et al. | |
| D547,056 S * | 7/2007 | Griffin et al. | D3/218 |
| D547,057 S * | 7/2007 | Griffin et al. | D3/218 |
| D550,455 S | 9/2007 | Barnhart | |
| D551,252 S | 9/2007 | Andre et al. | |
| 7,266,391 B2 | 9/2007 | Warren | |
| D551,856 S | 10/2007 | Ko et al. | |
| D553,857 S | 10/2007 | Pendergraph et al. | |
| D556,679 S | 12/2007 | Weinstein et al. | |
| D556,681 S * | 12/2007 | Kim | D13/103 |
| D557,205 S | 12/2007 | Kim | |
| D557,264 S | 12/2007 | Richardson et al. | |
| D557,494 S | 12/2007 | Mayette et al. | |
| D557,897 S | 12/2007 | Richardson et al. | |
| 7,312,984 B2 | 12/2007 | Richardson et al. | |
| D558,667 S | 1/2008 | Park et al. | |
| D558,757 S | 1/2008 | Andre et al. | |
| D558,972 S * | 1/2008 | Oh | D3/201 |
| D558,973 S * | 1/2008 | Hussaini et al. | D3/201 |
| D559,267 S | 1/2008 | Griffin | |
| D560,229 S | 1/2008 | Yagi | |
| D561,092 S * | 2/2008 | Kim | D13/103 |
| 7,336,973 B2 | 2/2008 | Goldthwaite et al. | |
| D563,093 S | 3/2008 | Nussberger | |
| 7,343,184 B2 | 3/2008 | Rostami | |
| D565,291 S | 4/2008 | Brandenburg et al. | |
| 7,397,658 B2 | 7/2008 | Finke-Anlauff et al. | |
| 7,400,917 B2 | 7/2008 | Wood et al. | |

(56) References Cited

U.S. PATENT DOCUMENTS

| | | | |
|---|---|---|---|
| D574,326 S | 8/2008 | Lim | |
| D574,819 S | 8/2008 | Andre et al. | |
| D575,056 S * | 8/2008 | Tan | D3/218 |
| 7,428,427 B2 * | 9/2008 | Brunstrom et al. | 455/550.1 |
| D577,904 S | 10/2008 | Sasaki | |
| D581,151 S * | 11/2008 | Aipa | D3/201 |
| D581,155 S | 11/2008 | Richardson et al. | |
| D581,421 S | 11/2008 | Richardson et al. | |
| D582,149 S * | 12/2008 | Tan | D3/218 |
| 7,464,814 B2 | 12/2008 | Carnevali | |
| D584,732 S | 1/2009 | Cho et al. | |
| 7,479,759 B2 * | 1/2009 | Vilanov et al. | 320/115 |
| D587,008 S | 2/2009 | Richardson et al. | |
| D587,896 S * | 3/2009 | Aipa | D3/201 |
| D589,016 S | 3/2009 | Richardson et al. | |
| 7,536,099 B2 | 5/2009 | Dalby et al. | |
| D593,319 S | 6/2009 | Richardson et al. | |
| D593,746 S | 6/2009 | Richardson et al. | |
| D594,849 S | 6/2009 | Ko | |
| 7,555,325 B2 | 6/2009 | Goros | |
| D597,089 S | 7/2009 | Khan et al. | |
| 7,562,813 B2 | 7/2009 | Humphrey et al. | |
| D597,301 S | 8/2009 | Richardson et al. | |
| D598,407 S | 8/2009 | Richardson et al. | |
| 7,577,462 B2 | 8/2009 | Kumar | |
| D600,640 S | 9/2009 | Stein et al. | |
| D600,908 S | 9/2009 | Richardson et al. | |
| D601,955 S | 10/2009 | Ekmekdje | |
| D601,959 S | 10/2009 | Lee et al. | |
| D601,960 S | 10/2009 | Dai | |
| 7,609,512 B2 | 10/2009 | Richardson et al. | |
| D603,602 S | 11/2009 | Richardson et al. | |
| D603,603 S | 11/2009 | Laine et al. | |
| 7,612,997 B1 * | 11/2009 | Diebel et al. | 361/679.56 |
| D605,850 S | 12/2009 | Richardson et al. | |
| D606,528 S | 12/2009 | Khan et al. | |
| D606,529 S | 12/2009 | Ferrari et al. | |
| 7,635,086 B2 | 12/2009 | Spencer, II | |
| 7,638,969 B2 | 12/2009 | Woud | |
| 7,647,082 B2 | 1/2010 | Holmberg | |
| D609,228 S | 2/2010 | Ferrari et al. | |
| D609,463 S | 2/2010 | Bullen | |
| D610,538 S | 2/2010 | Wu et al. | |
| 7,656,120 B2 | 2/2010 | Neu et al. | |
| 7,663,878 B2 | 2/2010 | Swan et al. | |
| 7,667,433 B1 | 2/2010 | Smith | |
| D610,807 S | 3/2010 | Bau | |
| D611,042 S | 3/2010 | Ferrari et al. | |
| D611,478 S | 3/2010 | Richardson et al. | |
| 7,669,829 B2 | 3/2010 | Ogatsu | |
| D613,282 S | 4/2010 | Richardson et al. | |
| D615,077 S | 5/2010 | Richardson et al. | |
| D615,535 S | 5/2010 | Richardson et al. | |
| D615,536 S | 5/2010 | Richardson et al. | |
| D615,967 S | 5/2010 | Richardson et al. | |
| D616,360 S | 5/2010 | Huang | |
| D616,361 S | 5/2010 | Huang | |
| D617,753 S | 6/2010 | Cheng | |
| D617,784 S | 6/2010 | Richardson et al. | |
| D617,785 S | 6/2010 | Richardson et al. | |
| D617,786 S | 6/2010 | Richardson et al. | |
| D617,787 S | 6/2010 | Richardson et al. | |
| D618,231 S | 6/2010 | Fahrendorff et al. | |
| 7,733,637 B1 | 6/2010 | Lam | |
| D619,573 S | 7/2010 | Khan et al. | |
| D619,574 S | 7/2010 | Richardson et al. | |
| D619,991 S | 7/2010 | Huang | |
| D620,000 S | 7/2010 | Bau | |
| D620,487 S | 7/2010 | Richardson et al. | |
| D621,394 S | 8/2010 | Richardson et al. | |
| D621,395 S | 8/2010 | Richardson et al. | |
| D621,821 S | 8/2010 | Richardson et al. | |
| D621,822 S | 8/2010 | Richardson et al. | |
| 7,778,023 B1 * | 8/2010 | Mohoney | 361/679.41 |
| 7,782,610 B2 * | 8/2010 | Diebel et al. | 361/679.56 |
| D623,179 S | 9/2010 | Richardson et al. | |
| D623,180 S | 9/2010 | Diebel | |
| D623,638 S | 9/2010 | Richardson et al. | |
| D623,639 S | 9/2010 | Richardson et al. | |
| D623,640 S | 9/2010 | Freeman | |
| D624,317 S | 9/2010 | Wenchel et al. | |
| D624,533 S | 9/2010 | Richardson et al. | |
| D624,908 S | 10/2010 | Huskinson | |
| D624,909 S | 10/2010 | Huskinson | |
| D624,910 S | 10/2010 | Richardson et al. | |
| D625,303 S | 10/2010 | Kim | |
| D626,120 S | 10/2010 | Richardson et al. | |
| D626,121 S | 10/2010 | Richardson et al. | |
| D626,538 S | 11/2010 | Brown et al. | |
| D626,539 S | 11/2010 | Brown et al. | |
| D626,540 S | 11/2010 | Brown et al. | |
| D626,964 S | 11/2010 | Richardson et al. | |
| D628,568 S | 12/2010 | Richardson et al. | |
| D628,994 S | 12/2010 | Griffin, Jr. et al. | |
| 7,859,222 B2 | 12/2010 | Woud | |
| D631,246 S | 1/2011 | Boettner | |
| 7,863,856 B2 | 1/2011 | Sherman et al. | |
| 7,863,862 B2 | 1/2011 | Idzik et al. | |
| D631,877 S | 2/2011 | Rak et al. | |
| D632,648 S | 2/2011 | Yang | |
| D632,683 S | 2/2011 | Richardson et al. | |
| D632,684 S | 2/2011 | Richardson et al. | |
| D632,685 S | 2/2011 | Richardson et al. | |
| D632,686 S | 2/2011 | Magness et al. | |
| 7,889,489 B2 * | 2/2011 | Richardson et al. | 361/679.32 |
| 7,889,498 B2 | 2/2011 | Diebel et al. | |
| D634,704 S | 3/2011 | Tieleman et al. | |
| D634,741 S | 3/2011 | Richardson et al. | |
| 7,899,397 B2 | 3/2011 | Kumar | |
| 7,907,394 B2 | 3/2011 | Richardson et al. | |
| 7,911,530 B2 | 3/2011 | Sawachi | |
| D636,386 S | 4/2011 | Richardson et al. | |
| D636,387 S | 4/2011 | Willes et al. | |
| 7,930,011 B2 | 4/2011 | Shi et al. | |
| 7,933,122 B2 | 4/2011 | Richardson et al. | |
| D637,588 S | 5/2011 | Richardson et al. | |
| D637,589 S | 5/2011 | Willes et al. | |
| D637,590 S | 5/2011 | Michie et al. | |
| D637,591 S | 5/2011 | Willes et al. | |
| D637,592 S | 5/2011 | Magness et al. | |
| D637,952 S | 5/2011 | Tan | |
| D638,005 S | 5/2011 | Richardson et al. | |
| D638,411 S | 5/2011 | Willes et al. | |
| D638,413 S | 5/2011 | Magness et al. | |
| D638,414 S | 5/2011 | Magness et al. | |
| D638,828 S | 5/2011 | Melanson et al. | |
| D638,829 S | 5/2011 | Melanson et al. | |
| D638,830 S | 5/2011 | Magness et al. | |
| D639,731 S | 6/2011 | Sun | |
| D640,679 S | 6/2011 | Willes et al. | |
| D640,680 S | 6/2011 | Magness et al. | |
| 7,957,524 B2 | 6/2011 | Chipping | |
| D641,013 S | 7/2011 | Richardson et al. | |
| D641,014 S | 7/2011 | Smith et al. | |
| D641,974 S | 7/2011 | Stampfli | |
| D642,170 S | 7/2011 | Johnson et al. | |
| D642,171 S | 7/2011 | Melanson et al. | |
| D642,558 S | 8/2011 | Magness | |
| D643,029 S | 8/2011 | Feng | |
| D643,424 S | 8/2011 | Richardson et al. | |
| D644,215 S | 8/2011 | Dong | |
| D644,216 S | 8/2011 | Richardson et al. | |
| D644,219 S | 8/2011 | Sawada | |
| 7,988,010 B2 | 8/2011 | Yang et al. | |
| 8,004,962 B2 | 8/2011 | Yang et al. | |
| D644,635 S | 9/2011 | Richardson et al. | |
| D644,639 S | 9/2011 | Weller et al. | |
| D647,084 S | 10/2011 | Fathollahi | |
| D647,108 S | 10/2011 | Lee | |
| 8,028,794 B1 | 10/2011 | Freeman | |
| 8,046,039 B2 | 10/2011 | Lee et al. | |
| D648,714 S | 11/2011 | Jones, III et al. | |
| D648,715 S | 11/2011 | Jones, III et al. | |
| D648,716 S | 11/2011 | Jones, III et al. | |

(56) References Cited

U.S. PATENT DOCUMENTS

| | | | |
|---|---|---|---|
| D648,717 S | 11/2011 | Fahrendorff et al. |
| D649,143 S | 11/2011 | Jones, III et al. |
| D649,539 S | 11/2011 | Hong |
| D650,810 S | 12/2011 | Lemelman et al. |
| D652,827 S | 1/2012 | Fahrendorff et al. |
| D652,828 S | 1/2012 | Fahrendorff et al. |
| D653,202 S | 1/2012 | Hasbrook et al. |
| D653,659 S | 2/2012 | Fahrendorff et al. |
| D654,069 S | 2/2012 | Kwon et al. |
| D654,483 S | 2/2012 | Richardson et al. |
| D654,931 S | 2/2012 | Lemelman et al. |
| D655,281 S | 3/2012 | Turocy |
| D655,699 S | 3/2012 | Bau |
| D656,495 S | 3/2012 | Andre et al. |
| D658,165 S | 4/2012 | Freeman |
| 8,150,485 B2 | 4/2012 | Lee |
| D658,643 S | 5/2012 | Fahrendorff et al. |
| 8,167,127 B2 | 5/2012 | Martin et al. |
| D662,923 S | 7/2012 | Piedra et al. |
| D663,263 S | 7/2012 | Gupta et al. |
| D663,319 S | 7/2012 | Chen et al. |
| D664,091 S | 7/2012 | Pliner et al. |
| 8,224,408 B2 | 7/2012 | Tomasini et al. |
| D665,386 S | 8/2012 | Fathollahi |
| D665,735 S | 8/2012 | Kang et al. |
| 8,245,842 B2 | 8/2012 | Bau |
| 8,247,102 B2 | 8/2012 | Hua |
| D667,783 S | 9/2012 | Zhang et al. |
| D670,281 S | 11/2012 | Corpuz et al. |
| D670,689 S | 11/2012 | Wang |
| D671,105 S | 11/2012 | Rothbaum et al. |
| D671,106 S | 11/2012 | Rothbaum et al. |
| D671,493 S | 11/2012 | Hasbrook et al. |
| 8,321,619 B2 | 11/2012 | Kular et al. |
| 8,328,008 B2 | 12/2012 | Diebel et al. |
| D674,394 S | 1/2013 | Kajimoto |
| 8,342,325 B2 | 1/2013 | Rayner |
| D675,603 S | 2/2013 | Melanson et al. |
| D676,032 S | 2/2013 | Stump et al. |
| D676,432 S | 2/2013 | Hasbrook et al. |
| 8,367,235 B2 | 2/2013 | Huang et al. |
| 8,380,264 B2 | 2/2013 | Hung et al. |
| D677,249 S | 3/2013 | Li et al. |
| D678,869 S | 3/2013 | Diebel |
| 8,390,255 B1 | 3/2013 | Fathollahi |
| 8,393,466 B2 | 3/2013 | Rayner |
| D679,271 S | 4/2013 | Liu |
| D679,684 S | 4/2013 | Baker et al. |
| D681,020 S | 4/2013 | Magness et al. |
| D682,196 S | 5/2013 | Leung |
| D682,815 S | 5/2013 | Chang |
| D683,338 S | 5/2013 | Wilson et al. |
| 8,439,191 B1 | 5/2013 | Lu |
| 8,452,242 B2 | 5/2013 | Spencer, II |
| 8,457,701 B2 | 6/2013 | Diebel |
| D685,356 S | 7/2013 | Diebel |
| D686,152 S | 7/2013 | Lee et al. |
| D686,606 S | 7/2013 | Hong |
| 8,483,758 B2 | 7/2013 | Huang |
| D687,426 S | 8/2013 | Requa |
| D688,233 S | 8/2013 | Dong |
| 8,499,933 B2 | 8/2013 | Ziemba |
| 8,505,718 B2 | 8/2013 | Griffin, Jr. et al. |
| 8,509,864 B1 | 8/2013 | Diebel |
| 8,509,865 B1 | 8/2013 | LaColla et al. |
| 8,531,833 B2 | 9/2013 | Diebel et al. |
| D691,990 S | 10/2013 | Rayner |
| 8,560,014 B1 | 10/2013 | Hu et al. |
| D693,801 S | 11/2013 | Rayner |
| 8,579,172 B2 | 11/2013 | Monaco et al. |
| D696,234 S | 12/2013 | Wright |
| D697,502 S | 1/2014 | Chu et al. |
| D698,774 S | 2/2014 | Wardy |
| D703,652 S | 4/2014 | Melanson et al. |
| D704,182 S | 5/2014 | Smith |
| D704,688 S | 5/2014 | Reivo et al. |
| D706,255 S | 6/2014 | Akana et al. |
| D706,256 S | 6/2014 | Ward et al. |
| D706,272 S | 6/2014 | Poon |
| D709,058 S | 7/2014 | Hemesath et al. |
| D710,344 S | 8/2014 | Smith et al. |
| D710,795 S | 8/2014 | Gupta et al. |
| D710,839 S | 8/2014 | Chang |
| D711,312 S | 8/2014 | Tien |
| D711,362 S | 8/2014 | Poon |
| D711,863 S | 8/2014 | Wen |
| D714,278 S | 9/2014 | Case et al. |
| D716,784 S | 11/2014 | Wen |
| D716,785 S | 11/2014 | White |
| 8,917,506 B2 | 12/2014 | Diebel et al. |
| D721,356 S | 1/2015 | Hasbrook et al. |
| D721,685 S | 1/2015 | Hasbrook et al. |
| D721,687 S | 1/2015 | To et al. |
| 8,954,117 B2 | 2/2015 | Huang |
| D723,530 S | 3/2015 | Namminga et al. |
| 8,971,039 B2 | 3/2015 | Huang et al. |
| D727,883 S | 4/2015 | Brand et al. |
| 9,026,187 B2 | 5/2015 | Huang |
| D732,012 S | 6/2015 | Tsai et al. |
| 9,077,013 B2 | 7/2015 | Huang et al. |
| 9,088,028 B2 | 7/2015 | Huang et al. |
| 9,088,029 B2 | 7/2015 | Huang et al. |
| 9,123,935 B2 | 9/2015 | Huang |
| 2001/0054148 A1 | 12/2001 | Hoornaert et al. |
| 2002/0065054 A1 | 5/2002 | Humphreys et al. |
| 2002/0111189 A1 | 8/2002 | Chou |
| 2002/0147035 A1* | 10/2002 | Su .................. 455/572 |
| 2002/0193136 A1 | 12/2002 | Halkosaari et al. |
| 2002/0197965 A1 | 12/2002 | Peng |
| 2003/0000984 A1 | 1/2003 | Vick, III |
| 2003/0096642 A1* | 5/2003 | Bessa et al. .............. 455/573 |
| 2003/0151890 A1 | 8/2003 | Huang et al. |
| 2003/0217210 A1 | 11/2003 | Carau, Sr. |
| 2003/0218445 A1* | 11/2003 | Behar .......................... 320/114 |
| 2003/0228866 A1 | 12/2003 | Pezeshki |
| 2004/0096054 A1 | 5/2004 | Nuovo |
| 2004/0097256 A1* | 5/2004 | Kujawski ................ 455/550.1 |
| 2004/0104268 A1 | 6/2004 | Bailey |
| 2004/0247113 A1 | 12/2004 | Akatsu |
| 2004/0268005 A1 | 12/2004 | Dickie |
| 2005/0049016 A1 | 3/2005 | Cho et al. |
| 2005/0088141 A1 | 4/2005 | Lee et al. |
| 2005/0090301 A1* | 4/2005 | Lange et al. ............... 455/575.8 |
| 2005/0093510 A1 | 5/2005 | Seil et al. |
| 2005/0116684 A1 | 6/2005 | Kim |
| 2005/0130721 A1 | 6/2005 | Gartrell |
| 2005/0231159 A1* | 10/2005 | Jones et al. .................. 320/114 |
| 2005/0247787 A1 | 11/2005 | Von Mueller et al. |
| 2005/0248312 A1* | 11/2005 | Cao et al. .................... 320/114 |
| 2005/0286212 A1 | 12/2005 | Brignone et al. |
| 2006/0010588 A1 | 1/2006 | Schuster et al. |
| 2006/0052064 A1 | 3/2006 | Goradesky |
| 2006/0058073 A1* | 3/2006 | Kim .......................... 455/573 |
| 2006/0063569 A1 | 3/2006 | Jacobs et al. |
| 2006/0099999 A1* | 5/2006 | Park .......................... 455/573 |
| 2006/0105722 A1* | 5/2006 | Kumar ....................... 455/90.3 |
| 2006/0105824 A1 | 5/2006 | Kim et al. |
| 2006/0125445 A1 | 6/2006 | Cao et al. |
| 2006/0140461 A1 | 6/2006 | Kim |
| 2006/0197674 A1 | 9/2006 | Nakajima |
| 2006/0205447 A1 | 9/2006 | Park et al. |
| 2006/0255493 A1 | 11/2006 | Fouladpour |
| 2007/0004450 A1 | 1/2007 | Parikh |
| 2007/0019804 A1 | 1/2007 | Kramer |
| 2007/0093140 A1 | 4/2007 | Begic et al. |
| 2007/0123316 A1 | 5/2007 | Little |
| 2007/0142097 A1 | 6/2007 | Hamasaki et al. |
| 2007/0152633 A1* | 7/2007 | Lee .......................... 320/114 |
| 2007/0161404 A1 | 7/2007 | Yasujima et al. |
| 2007/0167190 A1* | 7/2007 | Moosavi et al. ............. 455/557 |
| 2007/0187563 A1 | 8/2007 | Ogatsu |
| 2007/0225031 A1 | 9/2007 | Bodkin et al. |
| 2007/0236180 A1* | 10/2007 | Rodgers ..................... 320/115 |
| 2007/0261978 A1 | 11/2007 | Sanderson |

(56) References Cited

U.S. PATENT DOCUMENTS

| | | |
|---|---|---|
| 2007/0297149 A1 | 12/2007 | Richardson et al. |
| 2008/0007214 A1* | 1/2008 | Cheng ............................ 320/114 |
| 2008/0026794 A1 | 1/2008 | Warren |
| 2008/0026803 A1 | 1/2008 | Demuynck |
| 2008/0032758 A1 | 2/2008 | Rostami |
| 2008/0053770 A1 | 3/2008 | Tynyk |
| 2008/0058010 A1 | 3/2008 | Lee |
| 2008/0096620 A1* | 4/2008 | Lee et al. .................... 455/575.8 |
| 2008/0108395 A1* | 5/2008 | Lee et al. ....................... 455/572 |
| 2008/0119244 A1 | 5/2008 | Malhotra |
| 2008/0123287 A1* | 5/2008 | Rossell et al. ................. 361/686 |
| 2008/0132289 A1* | 6/2008 | Wood et al. .................... 455/566 |
| 2008/0139258 A1 | 6/2008 | Park et al. |
| 2008/0150367 A1 | 6/2008 | Oh et al. |
| 2009/0009945 A1 | 1/2009 | Johnson et al. |
| 2009/0017883 A1 | 1/2009 | Lin |
| 2009/0051319 A1 | 2/2009 | Fang et al. |
| 2009/0069050 A1* | 3/2009 | Jain et al. ....................... 455/558 |
| 2009/0073650 A1* | 3/2009 | Huang et al. .............. 361/679.56 |
| 2009/0096417 A1 | 4/2009 | Idzik et al. |
| 2009/0108800 A1 | 4/2009 | Woud |
| 2009/0111543 A1 | 4/2009 | Tai et al. |
| 2009/0114556 A1 | 5/2009 | Tai et al. |
| 2009/0117955 A1 | 5/2009 | Lo |
| 2009/0128092 A1 | 5/2009 | Woud |
| 2009/0143104 A1 | 6/2009 | Loh et al. |
| 2009/0144456 A1 | 6/2009 | Gelf et al. |
| 2009/0146898 A1 | 6/2009 | Akiho et al. |
| 2009/0152089 A1 | 6/2009 | Hanes |
| 2009/0160399 A1 | 6/2009 | Woud |
| 2009/0160400 A1 | 6/2009 | Woud |
| 2009/0181729 A1 | 7/2009 | Griffin, Jr. et al. |
| 2009/0186264 A1* | 7/2009 | Huang .............................. 429/96 |
| 2009/0205983 A1 | 8/2009 | Estlander |
| 2009/0247244 A1 | 10/2009 | Mittleman et al. |
| 2009/0284216 A1 | 11/2009 | Bessa et al. |
| 2009/0301289 A1 | 12/2009 | Gynes |
| 2009/0312058 A9 | 12/2009 | Wood et al. |
| 2009/0314400 A1 | 12/2009 | Liu |
| 2009/0325657 A1 | 12/2009 | Ramsdell et al. |
| 2010/0013470 A1 | 1/2010 | Liu |
| 2010/0022277 A1 | 1/2010 | An et al. |
| 2010/0026589 A1 | 2/2010 | Dou et al. |
| 2010/0048267 A1 | 2/2010 | Lin |
| 2010/0056054 A1 | 3/2010 | Yamato et al. |
| 2010/0064883 A1 | 3/2010 | Gynes |
| 2010/0078343 A1 | 4/2010 | Hoellwarth et al. |
| 2010/0088439 A1 | 4/2010 | Ang et al. |
| 2010/0093412 A1 | 4/2010 | Serra et al. |
| 2010/0096284 A1 | 4/2010 | Bau |
| 2010/0113106 A1 | 5/2010 | Supran |
| 2010/0132724 A1 | 6/2010 | Seidel et al. |
| 2010/0154062 A1 | 6/2010 | Baram et al. |
| 2010/0195279 A1 | 8/2010 | Michael |
| 2010/0200456 A1 | 8/2010 | Parkinson |
| 2010/0203931 A1 | 8/2010 | Hynecek et al. |
| 2010/0224519 A1 | 9/2010 | Kao |
| 2010/0243516 A1 | 9/2010 | Martin et al. |
| 2010/0302716 A1 | 12/2010 | Gandhi |
| 2010/0328203 A1 | 12/2010 | Hsu |
| 2011/0021255 A1 | 1/2011 | Kim et al. |
| 2011/0034221 A1 | 2/2011 | Hung et al. |
| 2011/0049005 A1 | 3/2011 | Wilson et al. |
| 2011/0055447 A1 | 3/2011 | Costa |
| 2011/0084081 A1 | 4/2011 | Chung et al. |
| 2011/0090626 A1 | 4/2011 | Hoellwarth et al. |
| 2011/0117974 A1 | 5/2011 | Spitalnik et al. |
| 2011/0136555 A1 | 6/2011 | Ramies et al. |
| 2011/0199041 A1 | 8/2011 | Yang |
| 2011/0253569 A1 | 10/2011 | Lord |
| 2011/0259664 A1 | 10/2011 | Freeman |
| 2011/0261511 A1 | 10/2011 | Alderson et al. |
| 2011/0297578 A1 | 12/2011 | Stiehl et al. |
| 2012/0013295 A1 | 1/2012 | Yeh |
| 2012/0071214 A1 | 3/2012 | Ash, Jr. et al. |
| 2012/0088555 A1 | 4/2012 | Hu |
| 2012/0088558 A1 | 4/2012 | Song |
| 2012/0115551 A1 | 5/2012 | Cho et al. |
| 2012/0122520 A1 | 5/2012 | Phillips |
| 2012/0161696 A1 | 6/2012 | Cook et al. |
| 2012/0177967 A1 | 7/2012 | Wang |
| 2012/0209745 A1 | 8/2012 | Spencer, II |
| 2012/0282977 A1 | 11/2012 | Haleluk |
| 2012/0320501 A1 | 12/2012 | Ackloo |
| 2012/0325637 A1 | 12/2012 | Kikuchi |
| 2013/0045775 A1 | 2/2013 | Heywood |
| 2013/0084799 A1 | 4/2013 | Marholev et al. |
| 2013/0125251 A1 | 5/2013 | Johnson |
| 2013/0189923 A1 | 7/2013 | Lewin |
| 2013/0210475 A1 | 8/2013 | Nylund |
| 2013/0248339 A1 | 9/2013 | Koepsell |
| 2013/0273983 A1 | 10/2013 | Hsu |
| 2013/0307818 A1 | 11/2013 | Pope et al. |
| 2013/0314880 A1 | 11/2013 | Sun et al. |
| 2014/0069825 A1 | 3/2014 | Macrina et al. |
| 2014/0165379 A1 | 6/2014 | Diebel et al. |
| 2015/0072744 A1 | 3/2015 | Huang |
| 2015/0084593 A1 | 3/2015 | Huang et al. |
| 2015/0140386 A1 | 5/2015 | Huang et al. |
| 2015/0148093 A1 | 5/2015 | Huang et al. |
| 2015/0214993 A1 | 7/2015 | Huang |

FOREIGN PATENT DOCUMENTS

| | | |
|---|---|---|
| CN | 202535667 U | 11/2012 |
| CN | 302510329 S | 7/2013 |
| CN | 302573150 S | 9/2013 |
| EP | 1732291 A1 | 12/2006 |
| JP | 8-18637 | 1/1996 |
| JP | 2000-175720 | 6/2000 |
| KR | 10-2005-0027961 | 3/2005 |
| KR | 10-2008-0017688 | 2/2008 |
| KR | 20-2010-0005030 | 5/2010 |
| KR | 10-2010-0132724 | 12/2010 |
| KR | 10-2011-0005507 | 1/2011 |
| KR | 30-0650361 | 7/2012 |
| TW | D150044 | 11/2012 |
| TW | D156538 | 10/2013 |
| WO | WO 95/15619 | 6/1995 |
| WO | WO 97/33497 | 9/1997 |
| WO | WO 03/065227 A1 | 8/2003 |
| WO | WO 2008/151362 A2 | 12/2008 |

OTHER PUBLICATIONS

U.S. Appl. No. 14/749,300, filed Jun. 24, 2015, Huang et al.
U.S. Appl. No. 14/800,530, filed Jul. 15, 2015, Huang.
U.S. Appl. No. 14/187,046, filed Feb. 21, 2014, To et al.
U.S. Appl. No. 14/205,024, filed Mar. 11, 2014, Huang et al.
U.S. Appl. No. 14/205,167, filed Mar. 11, 2014, Huang et al.
U.S. Appl. No. 29/382,515, filed Jan. 4, 2011, Gallouzi et al.
U.S. Appl. No. 29/406,346, filed Nov. 11, 2011, Brand.
U.S. Appl. No. 29/464,620, filed Aug. 19, 2013, Tsai.
U.S. Appl. No. 29/438,697, filed Nov. 30, 2012, Namminga et al.
U.S. Appl. No. 29/435,907, filed Oct. 30, 2012, To et al.
U.S. Appl. No. 29/438,877, filed Dec. 4, 2012, To et al.
U.S. Appl. No. 29/440,062, filed Dec. 18, 2012, To et al.
U.S. Appl. No. 29/478,391, filed Jan. 3, 2014, Namminga et al.
U.S. Appl. No. 29/478,390, filed Jan. 3, 2014, Dang et al.
U.S. Appl. No. 29/478,383, filed Jan. 3, 2014, Dang et al.
U.S. Appl. No. 29/478,388, filed Jan. 3, 2014, Kim et al.
U.S. Appl. No. 14/675,067, filed Mar. 31, 2015, To et al.
U.S. Appl. No. 29/499,868, filed Aug. 19, 2014, Mophie, Inc.
U.S. Appl. No. 29/510,154, filed Nov. 25, 2014, Mophie, Inc.
U.S. Appl. No. 29/510,153, filed Nov. 25, 2014, Mophie, Inc.
U.S. Appl. No. 29/522,987, filed Apr. 6, 2015, Gjøvik et al.
U.S. Appl. No. 29/510,839, filed Dec. 3, 2014, Mophie, Inc.
U.S. Appl. No. 29/523,211, filed Apr. 7, 2015, To et al.
U.S. Appl. No. 29/523,209, filed Apr. 7, 2015, Mophie, Inc.
U.S. Appl. No. 29/528,266, filed May 27, 2015, Gjøvik et al.
International Search Report and Written Opinion of the International Searching Authority for PCT/US2011/037244, dated Jul. 19, 2011.

(56) References Cited

OTHER PUBLICATIONS

International Preliminary Report on Patentability for PCT/US2011/037244, dated Nov. 29, 2012.
International Search Report and Written Opinion of the International Searching Authority for PCT/US2011/037249, dated Jul. 13, 2011.
International Preliminary Report on Patentability for PCT/US2011/037249, dated Nov. 29, 2012.
International Search Report and Written Opinion of the International Searching Authority for PCT/US2011/037254, dated Jul. 13, 2011.
International Preliminary Report on Patentability for PCT/US2011/037254, dated Nov. 29, 2012.
International Search Report and Written Opinion of the International Searching Authority for PCT/US2011/037257, dated Sep. 22, 2011.
International Preliminary Report on Patentability for PCT/US2011/037257, dated Nov. 29, 2012.
International Search Report and Written Opinion of the International Searching Authority for PCT/US2012/041768, dated Feb. 27, 2013.
International Preliminary Report on Patentability for PCT/US2012/041768, dated Dec. 27, 2013.
International Search Report and Written Opinion of the International Searching Authority for PCT/US2013/057276, dated Dec. 10, 2013.
International Preliminary Report on Patentability for PCT/US2013/057276, dated Mar. 3, 2015.
International Search Report and Written Opinion of the International Searching Authority for PCT/US2014/017781, dated Jun. 8, 2014.
International Preliminary Report on Patentability for PCT/US2014/017781, dated Aug. 25, 2015.
International Search Report and Written Opinion of the International Searching Authority for PCT/US2014/023592, dated Aug. 28, 2014.
International Preliminary Report on Patentability for PCT/US2014/023592, dated Sep. 15, 2015.
International Search Report and Written Opinion fcir PCT/US2014/067470, dated Mar. 31, 2015.
Mophie Pulse for iPod Touch 4G, http://www.mophie.com/pulse-iPod-Touch-4th-Gen-vibrating-gaming-case-p/2015_PUL-T4-GRY.htm.
"Sandberg BatteryCase for iPhone 4/4S delivers more band for your buck," dated Mar. 15, 2012, http://www.gizmag.com/sanberg-batterycase-iphone/21839.
Shawn Brown, "Incase Power Slider battery doubles as a case," dated Nov. 19, 2008, http://www.iphonebuzz.com/incase-power-slider-battery-doubles-as-a-case-195224.php.
Nick Guy, "Incipio offGRID Battery Case for iPhone 5/5s," dated Oct. 9, 2013, http://www.ilounge.com/index.php/reviews/entry/incipio-offgrid-battery-case-for-iphone-5-5s/.
Jeremy Horwitz, "Mophie Juice Pack Plus for iPhone 5," dated May 21, 2013, http://www.ilounge.com/index.php/reviews/entry/mophie-juice-pack-plus-for-iphone-5/.
Nick Guy, "RND Power Solutions Sync & Charge Dock with Lightning Connector," dated Nov. 18, 2013, http://www.ilounge.com/index.php/reviews/entry/tylt-energi-sl.
Jeremy Horwitz, "Kensington Mini Battery Pack and Charger for iPhone and iPod," dated May 16, 2008, http://www.ilounge.conn/index.php/reviews/entry/kensington-mini-battery-pack-and-charger-for-iphone-and-ipod/.
Kensington Mini Battery Pack and Charger for iPhone and iPod, dated Sep. 30, 2008, 1 Page.
Sven Rafferty, "Mybat External Battery for iPhone and iPod," dated May 18, 2008, http://svenontech.com/reviews/?p=74.
Dave Rees, "Richard Solo Backup Battery for iPhone / iPod Review," dated Jun. 16, 2008, http://the-gadgeteer.com/2008/06/16/richard_solo_backup_battery_for_iphone_ipod/.
Devin Coldewey, "Combination iPhone battery pack and flash from FastMac," dated Nov. 4, 2008, http://crunchgear.com/2008/11/04/combination-iphone-battery-pack-and-flash-from-fastmac/.
"Cheap DIY iPhone External Battery," dated Jul. 22, 2008, http://fastdad.wordpress.com/2008/07/22/cheap-diy-iphone-external-battery/.
Jeremy Horwitz, "iLuv i603 / i604 Rechargeable Lithium Polymer Batteries with Silicone Skin," dated Jun. 27, 2006, http://www.ilounge.com/index.php/reviews/entry/iluv-i603-rechargeable-lithium-polymer-battery-with-silicone-skin/.
Julie Strietelmeier, "Seidio INNODock Desktop Cradle for Treo 650," dated Jul. 28, 2005, http://the-gadgeteer.com/2005/07/28/seidio_innodock_desktop_cradlefor_treo_650/.
Brian Nyhuis, "Mophie Juice Pack Battery Case for Samsung Galaxy S III Review," dated Nov. 28, 2012, http://www.legitreviews.com/mophie-juice-pack-battery-case-for-samsung-galaxy-s-iii-review_2084.
"PowerSkin Samsung Galaxy S3 Case with Backup Battery," dated Aug. 19, 2012, http://gadgetsin.com/powerskin-samsung-galaxy-s3-case-with-backup-battery.htm.
"iPhone 4 Case with Battery Pack," dated Sep. 28, 2010, http://gadgetsin.com/iphone-4-case-with-battery-pack.htm.
Jonathan Pena, "iPhone 5 Cases, Round 3," dated Sep. 16, 2012, http://www.technologytell.com/apple/103833/iphone-5-cases-round-3/.
Jeremy Horwitz, "Mophie Juice Pack for iPhone," dated Dec. 7, 2007, http://www.ilounge.com/index.php/reviews/entry/mophie-juice-pack-for-iphone/.
Dr. Macenstein, "Review: Mophie Juice Pack for iPhone," dated Apr. 27, 2008, http://macenstein.com/default/archives/1314.
Wayne Schulz, "iPhone Extended Battery Review—Mophie Juice Pack," dated Jun. 17, 2008, http://www.geardiary.com/2008/06/17/iphone-extended-battery-review-mophie-juice-pack/.
Mophie Juice Pack iPhone 1G Product—Figures 1-7—Retrieved from http://www.mophie.com/products/juice-pack on Apr. 10, 2009.
Mophie Juice Pack iPhone 1G Product—Figure 8—Retrieved from http://www.mophie.com/pages/information/ on Apr. 10, 2009.
Mophie Juice Pack iPhone 1G Product—Figures 9-14—Retrieved from http://www.mophie.com/blogs/Juice_Pack_FAQ on Apr. 10, 2009.
Mophie Juice Pack iPhone 1G Product—Figures 15-16—Retrieved from http://mophie.com/blogs/Juice_Pack_FAQ on Apr. 20, 2009. Figure 16 is dated May 1, 2008.
Tomas Ratas, "Mophie Juice Pack—iPhone 3G," dated Dec. 9, 2008, http://www.testfreaks.com/blog/review/mophie-juice-pack-iphone-3g/.
Dr. Macenstein, "Review: Mophie Juice Pack 3G for iPhone," dated Nov. 27, 2008, http://macenstein.com/default/archives/1820.
Ewdison Then, "Mophie Juice Pack iPhone 3G Review," dated Nov. 12, 2008, http://www.slashgear.com/mophie-juice-pack-iphone-3g-review-1222446/.
Mophie Juice Pack iPhone 3G Product—Figures 1-8—Retrieved from http://www.mophie.com/products/juice-pack-iphone-3g on Apr. 10, 2009.
Mophie Juice Pack iPhone 3G Product—Figures 9-10—Retrieved from http://www.mophie.com/pages/iphone-3g-details on Apr. 10, 2009.
Mophie Juice Pack iPhone 3G Product—Figures 11-14—Retrieved from http://mophie.com/blogs/Juice_Pack_3G_FAQ on Apr. 10, 2009.
Mophie Juice Pack iPhone 3G Product—Figures 15-16—Retrieved from http://mophie.com/blogs/press on Apr. 20, 2009. Figure 15 is dated Aug. 4, 2008, and Figure 16 is dated Nov. 10, 2008.
Mophie Juice Pack iPhone 3G User Manual—Retrieved from http://static3.shopify.com/s/files/1/0008/4942/assets/mophie_juice_pack_3G_manual_rl.pdf on Apr. 10, 2009.
Panasonic Lithium Ion Batteries Technical Handbook, dated 2007.
Chris Foresman, "Several Backup Batteries Can Extend Your Daily iPhone 3G Use," dated Jul. 18, 2008, http://arstechnica.com/apple/2008/07/several-backup-batteries-can-extend-your-daily-iphone-3g-use/.
Using Your Treo 650 Smartphone by palmOne, dated 2005.
Lisa Gade, "Palm Treo 750," dated Jan. 17, 2007, http://www.mobiletechreview.com/phones/Treo-750.htm.
Incase Power Slider 3G for iPhone 3G Product Reference, alleged by Incase to be available on Nov. 28, 2008.
iPhone User's Guide, 2007.
"Power Slider," Web Archive Date Dec. 4, 2008, https://web.archive.org/web/20081204105303/http://goincase.com/products/detail/power-slider-ec20003/?.

(56) References Cited

OTHER PUBLICATIONS

Azadeh Ensha, "A Case for Filling the iPhone 3G's Power Vacuum," Dated Nov. 27, 2008.
Joseph Flatley, "Incase Power Slider for iPhone 3G Doubles the Juice, Lets You Sync," dated Nov. 17, 2008.
Darren Quick, "Mophie Juice Pack for iPhone 3G now shipping," dated Nov. 10, 2008, http://www.gizmag.com/mophie-juice-pack-iphone-3g/10342/.
Otterbox Catalog, 2006.
Jeremy Horowitz, "PhoneSuit MiLi Power Pack for iPhone," Jan. 29, 2009, http://www.ilounge.com/index.php/reviews/entry/phonesuit-mili-power-pack-for-iphone/.
Jeremy Horowitz, "FastMac TruePower iV Universal Battery Charger," Dec. 11, 2008, http://www.ilounge.com/index.php/reviews/entry/fastmac-truepower-iv-universal-battery-charger/.
Jeremy Horowitz, "Konnet PowerKZ Extended Power for iPhone," Apr. 2, 2009, http://www.ilounge.com/index.php/reviews/entry/konnet-powerkz-extended-power-for-iphone/.
"Test: Batterie iPhone SKPAD" with Machine English Translation, Feb. 2, 2009, http://iphonesofa.com/2009/02/02/test-batterie-iphone-skpad.
Kanamori et al., "USB battery-charger designs meet new industry standards," EDN pp. 63-70, dated Feb. 21, 2008.
AVR458: Charging Lithium-Ion Batteries with ATAVRBC100, which appear to include a date of Aug. 2008.
Battery Charging Specification, dated Apr. 15, 2009.
BCM2033 Product Brief, 2 pages, dated Nov. 1, 2002.
"USB battery charger detector intelligently powers mobiles," Dec. 17, 2007, http://www.eetasia.com/ART_8800493819_765245_NP_10b171b6.HTMce#.
Webpage Archive, Mophie.com, Nov. 25, 2007.
Ben Kaufman, "Behind the Invention: The mophie Juice Pack," dated Dec. 31, 2013, https://medium.com/@benkaufman/behind-the-invention-the-mophie-juice-pack-a0620f74efcf.
Mophie Relo Recharge, dated Feb. 7, 2006, http://songsling.com/recharge.html.
Case—*Ari, LLC* v. *mStation, Inc.*, Case No. 1:2010-CV-01874 in the United States District Court for the Northern District of Georgia, filed Jun. 17, 2010 (Docket).
*Daniel Huang* v. *GC Technology, LLC*, Case No. CV10-4705 CAS (VBKx) in the United States District Court for the Central District of California, filed Jun. 24, 2010 (Docket).
*Hali-Power, Inc.* v. *mStation Corp.*, Case No. 1:2010-CV-00773 in the United States District Court for the Northern District of New York, filed Jun. 30, 2010 (Docket).
*Mophie, Inc.* v. *Loza & Loza, LLP*, Case No. SACV11-00539 Doc (MLGx) in the United States District Court for the Central District of California, filed Apr. 7, 2011 (Docket).
Mophie's Complaint, filed Apr. 7, 2011 in *Mophie, Inc.* v. *Loza & Loza, LLP*, Case No. SACV11-00539 Doc (MLGx) in the United States District Court for the Central District of California.
*Mophie, Inc.* v. *Foreign Trade Corporation*, Case No. 8:12-CV-00292-JST-RNB in the United States District Court for the Central District of California, filed Feb. 24, 2012 (Docket).
*Mophie, Inc.* v. *Kdlinks Inc.*, Case No. 2:2012-CV-02639 in the United States District Court for the Central District of California, filed Mar. 27, 2012 (Docket).
*Otter Products, LLC* v. *Mophie, LLC*, Case No. 1:2012-CV-01969 in the United States District Court for the District of Colorado, filed Jul. 27, 2012 (Docket).
Mophie's Answer, filed Oct. 15, 2012 in *Otter Products, LLC* v. *Mophie, LLC*, Case No. 1:2012-CV-01969 in the United States District Court for the District of Colorado.
Otter's Motion for Summary Judgment of Infringement and Declaration in Support Thereof, filed May 13, 2013 in *Otter Products, LLC* v. *Mophie, LLC*, Case No. 1:2012-CV-01969 in the United States District Court for the District of Colorado.
Mophie's Opposition to Motion for Summary Judgment of Infringement, filed Jun. 6, 2013 in *Otter Products, LLC* v. *Mophie, LLC*, Case No. 1:2012-CV-01969 in the United States District Court for the District of Colorado.
Mophie's Claim Construction Brief, filed Jun. 14, 2013 in *Otter Products, LLC* v. *Mophie, LLC*, Case No. 1:2012-CV-01969 in the United States District Court for the District of Colorado.
Otter's Claim Construction Brief, filed Jun. 14, 2013 in *Otter Products, LLC* v. *Mophie, LLC*, Case No. 1:2012-CV-01969 in the United States District Court for the District of Colorado.
Mophie's Brief in Response to Otter's Claim Construction Brief, filed Jun. 24, 2013 in *Otter Products, LLC* v. *Mophie, LLC*, Case No. 1:2012-CV-01969 in the United States District Court for the District of Colorado.
Otter's Rebuttal Brief for Construction of Claim Terms and Declaration, filed Jun. 24, 2013 in *Otter Products, LLC* v. *Mophie, LLC*, Case No. 1:2012-CV-01969 in the United States District Court for the District of Colorado.
Otter's Reply in Support of Motion for Summary Judgment of Infringement, filed Jun. 24, 2013 in *Otter Products, LLC* v. *Mophie, LLC*, Case No. 1:2012-CV-01969 in the United States District Court for the District of Colorado.
Joint Claim Construction Statement, filed Jun. 26, 2013 in *Otter Products, LLC* v. *Mophie, LLC*, Case No. 1:2012-CV-01969 in the United States District Court for the District of Colorado.
*Incase Designs, Inc.* v. *Mophie, Inc.*, Case No. 3:2013-CV-00602 in the United States District Court for the Northern District of California, filed Feb. 12, 2013 (Docket).
Mophie's Amended Answer and Counterclaims, filed May 8, 2013 in *Incase Designs, Inc.* v. *Mophie, Inc.*, Case No. 3:2013-CV-00602 in the United States District Court for the Northern District of California.
Mophie's Opposition to Motion to Strike Amended Affirmative Defenses, Filed Jun. 12, 2013 in *Incase Designs, Inc.* v. *Mophie, Inc.*, Case No. 3:2013-CV-00602 in the United States District Court for the Northern District of California.
Mophie's Reply in Support of Motion to Stay and Supporting Declaration, filed Sep. 3, 2103 in *Incase Designs, Inc.* v. *Mophie, Inc.*, Case No. 3:2013-CV-00602 in the United States District Court for the Northern District of California.
*Incase Designs, Inc.* v. *Mophie, Inc.*, Case No. 3:2013-CV-03356 in the United States District Court for the Northern District of California, filed Jul. 18, 2013 (Docket).
*Incase Designs, Corp.* v. *Mophie, Inc.*, Case No. 3:2013-CV-04314 in the United States District Court for the Northern District of California, filed Sep. 18, 2013 (Docket).
Mophie Motion 1—To Be Accorded Benefit, filed Nov. 20, 2013 in Patent Interference No. 105,946(RES).
Declaration of John Feland, Ph.D, In Support of Mophie Motion 1 to Be Accorded Benefit, dated Nov. 20, 2013, in Patent Interference No. 105,946(RES).
Mophie Motion 2—For Judgment that Incase's Involved Claims Are Unpatentable, filed Nov. 20, 2013 in Patent Interference No. 105,946(RES).
Declaration of John Feland, Ph.D, In Support of Mophie Motion 2 for Judgement That Incase's Involved Claims Are Unpatentable, dated Nov. 20, 2013, in Patent Interference No. 105,946(RES).
Incase Motion 1—Motion for Benefit, filed Nov. 20, 2013 in Patent Interference No. 105,946(RES).
Incase Motion 2—Motion to Undesignate Claims, filed Nov. 20, 2013 in Patent Interference No. 105,946(RES).
Incase Motion 3—Motion for Judgment Based on Lack of Written Description, filed Nov. 20, 2013 in Patent Interference No. 105,946(RES).
Incase Motion 4—Motion for Unpatentability of Mophie Claims, filed Nov. 20, 2013 in Patent Interference No. 105,946(RES).
Declaration of Andrew Wolfe, filed Nov. 20, 2013 in Patent Interference No. 105,946(RES).
Declaration of Thomas Overthun, filed Nov. 20, 2013 in Patent Interference No. 105,946(RES).
Declaration of Gabriel Dan, filed Nov. 20, 2013 in Patent Interference No. 105,946(RES).

(56) References Cited

OTHER PUBLICATIONS

Mophie's Third Amended Complaint, filed Jun. 27, 2014, in *Mophie, Inc.* v. *Source Vista*, Case No. 8:13-CV-01321 in the United States District Court for the Central District of California.
LivingSocial's Answer to Mophie's Fifth Amended Complaint and Counterclaims, filed Sep. 24, 2014, in *Mophie, Inc.* v. *Source Vista*, Case No. 8:13-CV-01321 in the United States District Court for the Central District of California.
Shah's Answer, Affirmative Defenses, and Counterclaims to Plaintiff's Fifth Amended Complaint, filed Sep. 24, 2014, in *Mophie, Inc.* v. *Source Vista*, Case No. 8:13-CV-01321 in the United States District Court for the Central District of California.
Expert Report of Dr. David Munson, dated Aug. 28, 2014, in *Mophie, Inc.* v. *Source Vista*, Case No. 8:13-CV-01321 in the United States District Court for the Central District of California.
Expert Report of John Feland, Ph.D, dated Aug. 28, 2014, in *Mophie, Inc.* v. *Source Vista*, Case No. 8:13-CV-01321 in the United States District Court for the Central District of California.
Rebutal Expert Report of John Feland, Ph.D, dated Sep. 25, 2014, in *Mophie, Inc.* v. *Source Vista*, Case No. 8:13-CV-01321 in the United States District Court for the Central District of California.
Rebutal Expert Report of Dr. David Munson, dated Sep. 25, 2014, in *Mophie, Inc.* v. *Source Vista*, Case No. 8:13-CV-01321 in the United States District Court for the Central District of California.
Mophie's Second Amended Response to LivingSocial's Interrogatory No. 1[21], dated Aug. 28, 2014, in *Mophie, Inc.* v. *Source Vista*, Case No. 8:13-CV-01321 in the United States District Court for the Central District of California.
Mophie's Second Amended Response to Serve Global's Interrogatory No. 2, dated Aug. 28, 2014, in *Mophie, Inc.* v. *Source Vista*, Case No. 8:13-CV-01321 in the United States District Court for the Central District of California.
Defendant's Memorandum in Support of Motion for Partial Summary Judgement, dated Sep. 23, 2014, in *Mophie, Inc.* v. *Source Vista*, Case No. 8:13-CV-01321 in the United States District Court for the Central District of California.
Declaration of David Munson in Support of Defendant's Motion for Partial Summary Judgment, dated Sep. 22, 2014, in *Mophie, Inc.* v. *Source Vista*, Case No. 8:13-CV-01321 in the United States District Court for the Central District of California.
John Feland, Ph.D. Deposition Transcript, dated Sep. 30, 2014, in *Mophie, Inc.* v. *Source Vista*, Case No. 8:13-CV-01321 in the United States District Court for the Central District of California.
Matthew Brand Deposition Transcript, dated Jul. 23, 2014, in *Mophie, Inc.* v. *Source Vista*, Case No. 8:13-CV-01321 in the United States District Court for the Central District of California.
Dharmesh Shah Deposition Transcript, dated Jul. 11, 2014, in *Mophie, Inc.* v. *Source Vista*, Case No. 8:13-CV-01321 in the United States District Court for the Central District of California.
Defendants' Statement of Uncontroverted Material Fact and Contentions of Law, filed Sep. 22, 2014 in *Mophie, Inc.* v. *Source Vista*, Case No. 8:13-CV-01321 in the United States District Court for the Central District of California.
Memorandum of Points and Authorities in Support of Mophie's Motion for Summary Judgment, filed Sep. 22, 2014, in *Mophie, Inc.* v. *Source Vista*, Case No. 8:13-CV-01321 in the United States District Court for the Central District of California.
Statement of Uncontroverted Facts and Conclusions of Law in Support of Mophie's Motion for Summary Judgment, filed Sep. 22, 2014, in *Mophie, Inc.* v. *Source Vista*, Case No. 8:13-CV-01321 in the United States District Court for the Central District of California.
Mophie's Opposition to Shah and Serve Global's Motion for Partial Summary Judgment, dated Oct. 3, 2014, in *Mophie, Inc.* v. *Source Vista*, Case No. 8:13-CV-01321 in the United States District Court for the Central District of California.
Statement of Genuine Disputes of Material Fact in Opposition to Shah and Serve Global's Motion for Partial Summary Judgment, filed Oct. 3, 2014, in *Mophie, Inc.* v. *Source Vista*, Case No. 8:13-CV-01321 in the United States District Court for the Central District of California.
Opposition of LivingSocial to Mophie's Motion for Summary Judgment, dated Oct. 3, 2014, in *Mophie, Inc.* v. *Source Vista*, Case No. 8:13-CV-01321 in the United States District Court for the Central District of California.
Defendants' Opposition to Plaintiff's Motion for Summary Judgment, filed Oct. 3, 2014, in *Mophie, Inc.* v. *Source Vista*, Case No. 8:13-CV-01321 in the United States District Court for the Central District of California.
Defendants' Response to Plaintiffs Statement of Uncontroverted Material Fact and Contentions of Law, filed Oct. 3, 2014, in *Mophie, Inc.* v. *Source Vista*, Case No. 8:13-CV-01321 in the United States District Court for the Central District of California.
David Munson Deposition Transcript, dated Sep. 29, 2014, in *Mophie, Inc.* v. *Source Vista*, Case No. 8:13-CV-01321 in the United States District Court for the Central District of California.
Mophie's First Amended Complaint, filed Jun. 25, 2014, in *Mophie, Inc.* v. *UNU Electronics Inc.*, Case No. 8:13-CV-01705 in the United States District Court for the Central District of California.
UNU's Answer and Counterclaims, filed Jul. 10, 2014, in *Mophie, Inc.* v. *UNU Electronics Inc.*, Case No. 8:13-CV-01705 in the United States District Court for the Central District of California.
Mophie's Responses to Defendant's Third Set of Interrogatories (No. 12), dated Aug. 21, 2014, in *Mophie, Inc.* v. *UNU Electronics Inc.*, Case No. 8:13-CV-01705 in the United States District Court for the Central District of California.
Mophie's Responses to Defendant's First set of Requests for Admissions (Nos. 1-46), dated Aug. 19, 2014, in *Mophie, Inc.* v. *UNU Electronics Inc.*, Case No. 8:13-CV-01705 in the United States District Court for the Central District of California.
Mophie's Responses to Defendant's Second set of Requests for Admissions (Nos. 47-109), dated Aug. 19, 2014, in *Mophie, Inc.* v. *UNU Electronics Inc.*, Case No. 8:13-CV-01705 in the United States District Court for the Central District of California.
Request for Ex Parte Reexamination of U.S. Pat. No. 8,367,235, filed Aug. 14, 2014.
Corrected Request for Ex Parte Reexamination of U.S. Pat. No. 8,367,235, filed Sep. 18, 2014.
Declaration of John Feland, Ph.D. In Support of Mophie's Opposition to Defendants Motion for Partial Summary Judgment, filed Oct. 3, 2014, in *Mophie, Inc.* v. *Source Vista*, Case No. 8:13-CV-01321 in the United States District Court for the Central District of California.
LivingSocial's Reply in Support of Motion for Summary Judgment, Filed Oct. 10, 2014, in *Mophie, Inc.* v. *Source Vista*, Case No. 8:13-CV-01321 in the United States District Court for the Central District of California.
Defendants' Reply in Support of Motion for Partial Summary Judgment, Filed Oct. 10, 2014, in *Mophie, Inc.* v. *Source Vista*, Case No. 8:13-CV-01321 in the United States District Court for the Central District of California.
Reply in Support of Mophie's Motion for Summary Judgment, Filed Oct. 10, 2014, in *Mophie, Inc.* v. *Source Vista*, Case No. 8:13-CV-01321 in the United States District Court for the Central District of California.
Mophie's Reply to Counterclaims of LivingSocial, filed Oct. 14, 2014, in *Mophie, Inc.* v. *Source Vista*, Case No. 8:13-CV-01321 in the United States District Court for the Central District of California.
Mophie's Reply to Counterclaims of Shah, filed Oct. 14, 2014, in *Mophie, Inc.* v. *Source Vista*, Case No. 8:13-CV-01321 in the United States District Court for the Central District of California.
Defendant's Response to Mophie's Fourth Set of Interrogatories, dated Sep. 23, 2014, in *Mophie, Inc.* v. *UNU Electronics Inc.*, Case No. 8:13-CV-01705 in the United States District Court for the Central District of California.
Plaintiff Mophie's Preliminary Claim Constructions and Identification of Extrinsic Evidence, dated Oct. 14, 2014, in *Mophie, Inc.* v. *UNU Electronics Inc.*, Case No. 8:13-CV-01705 in the United States District Court for the Central District of California.
Defendant's Preliminary Claim Constructions and Extrinsic Evicence, dated Oct. 14, 2014, in *Mophie, Inc.* v. *UNU Electronics Inc.*, Case No. 8:13-CV-01705 in the United States District Court for the Central District of California.

(56) References Cited

OTHER PUBLICATIONS

Plaintiff Mophie's Opening Brief on Claim Construction, filed Oct. 29, 2014, in *Mophie, Inc. v. UNU Electronics Inc.*, Case No. 8:13-CV-01705 in the United States District Court for the Central District of California.
Declaration of John Feland, Ph.D. In Support of Plaintiff's Preliminary Claim Constructions, filed Oct. 29, 2014, in *Mophie, Inc. v. UNU Electronics Inc.*, Case No. 8:13-CV-01705 in the United States District Court for the Central District of California.
Supplemental Declaration of John Feland, Ph.D. In Support of Plaintiff's Claim Constructions, filed Oct. 29, 2014, in *Mophie, Inc. v. UNU Electronics Inc.*, Case No. 8:13-CV-01705 in the United States District Court for the Central District of California.
Declaration of Sheila N. Swaroop in Support of Mophie's Opening Claim Construction Brief, filed Oct. 29, 2014, in *Mophie, Inc. v. UNU Electronics Inc.*, Case No. 8:13-CV-01705 in the United States District Court for the Central District of California.
Transcript of Deposition of John Feland, dated Oct. 21, 2014, in *Mophie, Inc. v. UNU Electronics Inc.*, Case No. 8:13-CV-01705 in the United States District Court for the Central District of California.
Defendant's Opening Claim Construction Brief, dated Oct. 29, 2014, in *Mophie, Inc. v. UNU Electronics Inc.*, Case No. 8:13-CV-01705 in the United States District Court for the Central District of California.
Order Granting Request for Ex Parte Reexamination of U.S. Pat. No. 8,367,235, in Reexamination Control No. 90/013,319, dated Oct. 24, 2014.
Order Re LivingSocial's Motion for Summary Judgment, Mophie's Motion for Summary Judgment, Source Vista and Shah's Motion for Partial Summary Judgment, and Mophie's Motion to Bifurcate, dated Nov. 12, 2014, in *Mophie, Inc. v. Source Vista*, Case No. 8:13-CV-01321 in the United States District Court for the Central District of California.
Mophie's Memorandum in Support of its Motion for Reconsideration, filed Nov. 19, 2014, in *Mophie, Inc. v. Source Vista*, Case No. 8:13-CV-01321 in the United States District Court for the Central District of California.
Declaration of Sheila N. Swaroop in Support of Mophie's Motion for Reconsideration, filed Nov. 19, 2014, in *Mophie, Inc. v. Source Vista*, Case No. 8:13-CV-01321 in the United States District Court for the Central District of California.
Order Denying Plantiff's Motion for Reconsideration, dated Nov. 21, 2014, in *Mophie, Inc. v. Source Vista*, Case No. 8:13-CV-01321 in the United States District Court for the Central District of California.
Defendants Dharmesh Shah and Serve Global, LLC's Memorandum of Points and Authorities in Support of Defendants's Motion for Attorney's Fees, filed Mar. 21, 2015, in *Mophie, Inc. v. Source Vista*, Case No. 8:13-CV-01321 in the United States District Court for the Central District of California.
Memorandum of Points and Authorities in Support of Livingsocial, Inc.'s Motion for Legal Fees and Costs, filed Mar. 20, 2015, in *Mophie, Inc. v. Source Vista*, Case No. 8:13-CV-01321 in the United States District Court for the Central District of California.
Plaintiff Mophie, Inc.'s Opposition to Defendants Dharmesh Shah and Serve Global, LLC's Motion for Attorneys' Fees, filed Apr. 3, 2015, in *Mophie, Inc. v. Source Vista*, Case No. 8:13-CV-01321 in the United States District Court for the Central District of California.
Plaintiff Mophie, Inc.'s Opposition to Defendant Livingsocial, Inc.'s Motion for Attorneys' Fees, filed Apr. 3, 2015, in *Mophie, Inc. v. Source Vista*, Case No. 8:13-CV-01321 in the United States District Court for the Central District of California.
Reply to Plaintiff's Opposition to Defendants Dharmesh Shah and Serve Global, LLC's Motion for Attorney's Fees, filed Apr. 10, 2015, in *Mophie, Inc. v. Source Vista*, Case No. 8:13-CV-01321 in the United States District Court for the Central District of California.
Reply in Support of Livingsocial, Inc.'s Motion for Legal Fees and Costs, filed Apr. 10, 2015, in *Mophie, Inc. v. Source Vista*, Case No. 8:13-CV-01321 in the United States District Court for the Central District of California.
Amended Final Judgment and Permanent Injunction, dated Dec. 11, 2015, in *Mophie, Inc. v. Source Vista*, Case No. 8:13-CV-01321 in the United States District Court for the Central District of California.
Order Re Motions for Attorneys' Fees, Motion to Amend Permanent Injunction, Motions for Judgment as a Matter of Law, Motion for Relief From Judgment, and Motion for New Trial, dated Dec. 11, 2015, in *Mophie, Inc. v. Source Vista*, Case No. 8:13-CV-01321 in the United States District Court for the Central District of California.
Mophie's Complaint, filed Dec. 16, 2015, in *Mophie, Inc. v. Cute Mobile Inc.*, Case No. 8:15-cv-02086 in the United States District Court for the Central District of California.

\* cited by examiner

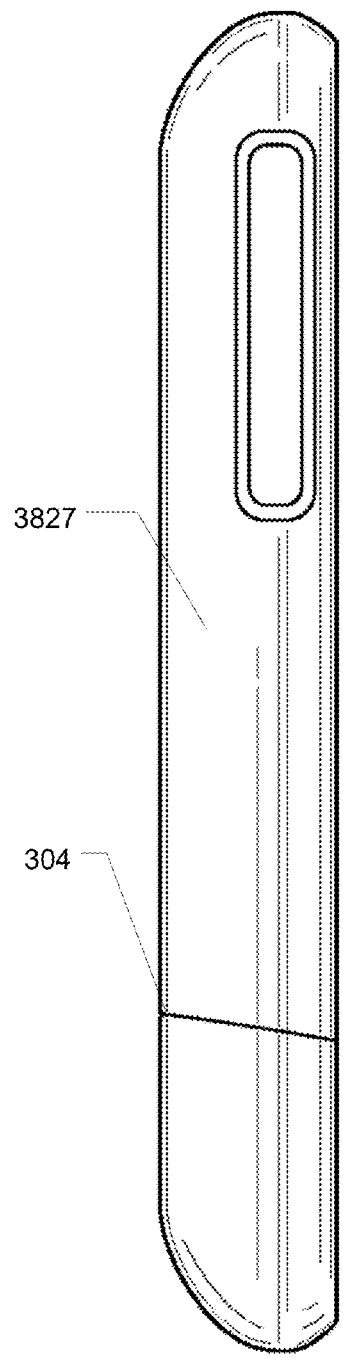
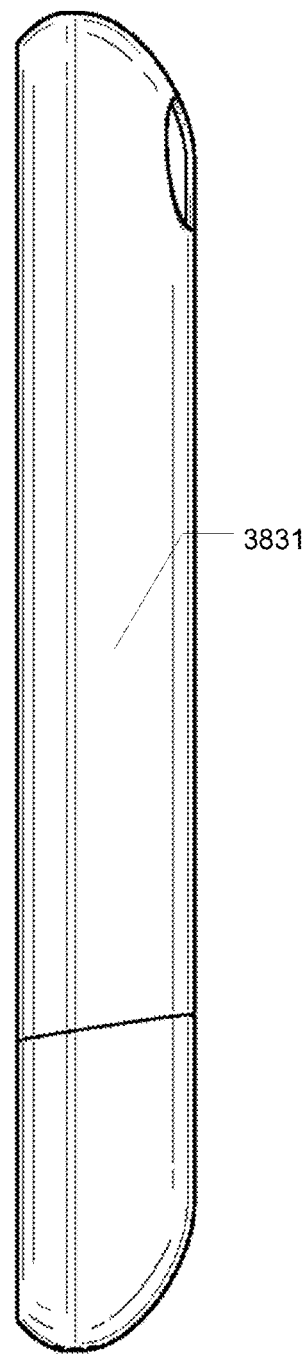
Figure 5
Figure 6

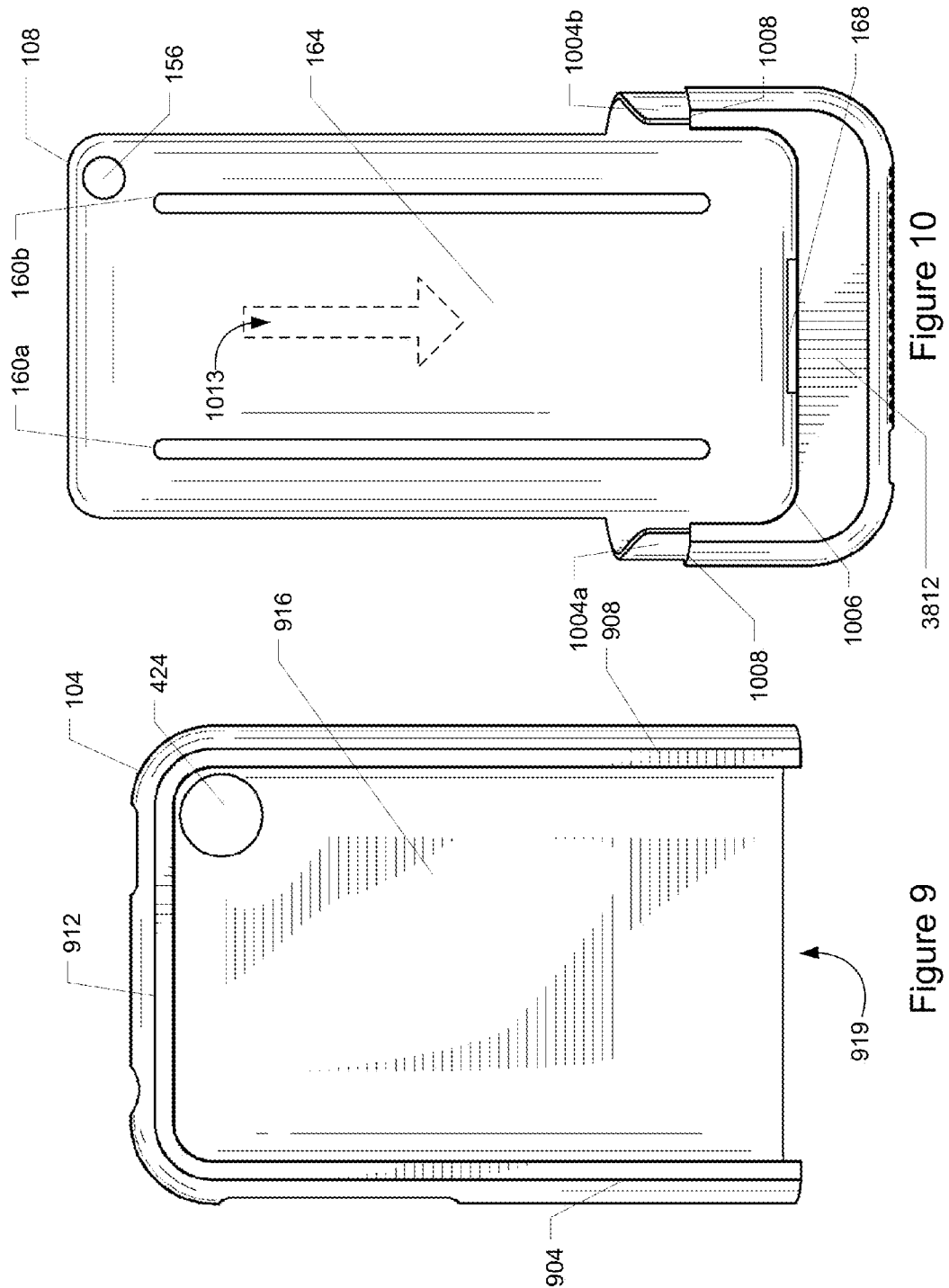

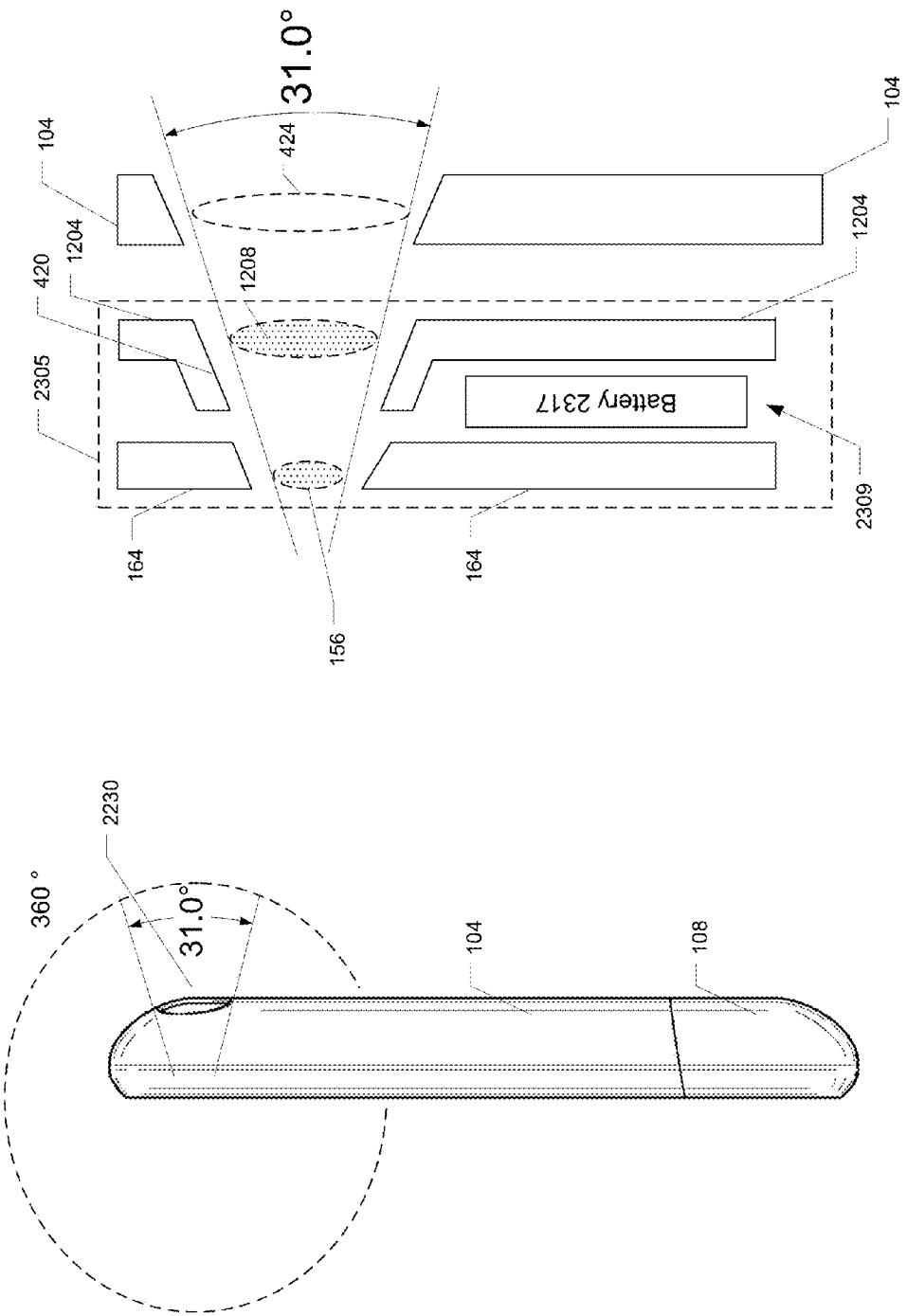

| Mode | Case USB Connector | Case Battery | Phone Battery | Case Status | Case Button | Case Indicator Lights | Phone Status |
|---|---|---|---|---|---|---|---|
| Power-Up | Connect to power | Charged | X (don't care) | | | 5th LED blinks once to indicate power is connected | Phone does not need to be in case, but if it is, phone status is normal |
| Charge Case Battery | Connect to power | Discharged | X (don't care) | Charge case battery until it is fully charged. Case battery charges phone battery (if discharged). | Push for fuel gauge; hold for sync mode | See fuel gauge and sync modes | Normal when phone battery is sufficiently charged |
| Fuel Gauge | X (don't care) | Charged | X (don't care) | | Push button to show battery level | 5 LEDs indicate charge level of case battery | Phone does not need to be in case, but if it is, phone status is normal |
| Charge Phone Battery | X (don't care) | Charged | Discharged | Case uses case battery to charge phone battery and top off as needed. If USB plug is connected to power, the case battery is charged. | Push for fuel gauge; hold for sync mode | See fuel gauge and sync modes | Normal after phone battery becomes sufficiently charged. If phone battery is completely discharged, it may take about 5 minutes to be sufficiently charged. Indicator on phone display may indicate charging. |
| Sleep Mode | Not connected | Completely Discharged | X (don't care) | Case is inactive. Battery display button and indicator lights do not function. Cannot enter sync mode and fuel gauge does not work. | Not functional | Not functional | Normal |

Figure 27

| Mode | Case USB Connector | Case Battery | Phone Battery | Case Status | Case Button | Case Indicator Lights | Phone Status |
|---|---|---|---|---|---|---|---|
| Extended Sleep Mode | Not connected | Charged | Phone not in case | Case will retain its battery power for a certain time period. To exit extended sleep mode: (1) put a phone in the case; (2) press case button (which activates fuel gauge); (3) connect case via cable to power source | Push button will exit extended sleep mode | Turned off | Phone is not in case |
| Initial Phone Connect | X (don't care) | Charged | Charged | | | | Normal; phone does not show a nag screen. |
| Sync | Connect to Computer | Charged | Charged | Upon entering sync mode, exit other modes (e.g., charging); connect phone and computer together through USB cable. Cable need not be connected to enter sync mode, but cable should be connected within 30 seconds, or case will automatically exit sync mode. | Push and hold button for 3 seconds to enter sync mode | 5th LED blinks continuously to indicate sync mode | Phone in sync mode (e.g., shows sync enabled on display). Phone may indicate not charging. |
| Exit Sync | Disconnecting cable will exit sync | Charged | Charged | To exit sync mode: (1) exits automatically after 30 seconds of inactivity; (2) disconnect cable; (3) press button (which activates fuel gauge). | Push button will exit sync | 5th LED turns off when sync mode exited | Phone exits sync mode and resumes normal operation |

Figure 28

METHOD OF MAKING A SMARTPHONE CASE WITH A BATTERY

CROSS-REFERENCE TO RELATED APPLICATIONS

This patent application is a continuation of U.S. patent application Ser. No. 13/026,022, filed Feb. 11, 2011, issued as U.S. Pat. No. 8,531,833 on Sep. 10, 2013, which is a continuation of U.S. patent application Ser. No. 12/862,552, filed Aug. 24, 2010, issued as U.S. Pat. No. 7,889,498 on Feb. 15, 2011, which is a continuation of U.S. patent application Ser. No. 12/580,977, filed Oct. 16, 2009, issued as U.S. Pat. No. 7,782,610 on Aug. 24, 2010, which is a continuation of U.S. patent application Ser. No. 12/464,059, filed May 11, 2009, issued as U.S. Pat. No. 7,612,997 on Nov. 3, 2009, which claims the benefit of U.S. provisional applications 61/115,529, filed Nov. 17, 2008, 61/157,111, filed Mar. 3, 2009, and 61/171,455, filed Apr. 21, 2009. These applications are incorporated by reference along with all other references cited in this application.

BACKGROUND OF THE INVENTION

This invention relates to a case for portable electronic devices, and more specifically, to a case with a battery.

There are many types of portable electronic devices including personal digital assistants (PDAs), computers, smartphones, mobile phones, satellite phones, cellular phones, pagers, music player, MP3 players, media players, digital cameras, video cameras, bar code scanner, global positioning system (GPS), and portable game consoles. Typically these devices are battery powered, so that people can carry and use the devices during their daily lives (e.g., on a bus or train, while in flight on an airplane, at the gym on the stair stepper, walking down an aisle, riding a bike, or driving a car).

These portable electronic devices allow people to play and record music, send and receive e-mail, send text messages, browse Web pages, make phone calls, play and record video, take and view pictures, edit documents, and much more. These devices continue to revolutionize the way people interact, learn, connect with other people, conduct business, and find things. They help people manage their daily lives and sometimes are an entertainment source.

Because portable electronic devices are somewhat fragile and used to carry valuable personal information (e.g. phone numbers, financial information, private photos or videos, and favorite music tracks), many people protect their portable electronic devices using cases. Depending on the particular case design, these cases protect the back, side, and front of the devices from scratches, dings, drops, and other physical damage. Some cases may even have pockets to hold extra batteries or memory. So, when a battery becomes discharged, the person can take the used battery out of the portable electronic device and replace it with a fresh battery from the case's pocket. Then the used battery can be recharged using a recharger at home.

Also as modern portable electronic devices evolve, they continue to provide more features and greater functionality. For example, screen sizes become larger and have greater resolution. The devices have greater wireless range or capabilities (e.g., 3G broadband wireless) and more numbers of sensors (e.g., touch screen, accelerometer, proximity sensor, and ambient light sensor). Applications that run on the devices also may use more processing power. All these improvements and changes usually are an additional drain on the battery, shortening how long these devices can be used on a single charge.

Therefore, it is desirable to increase the battery life of portable electronic devices and also to protect these devices from damage. There is a need for a portable electronic device case that also provides additional battery life.

BRIEF SUMMARY OF THE INVENTION

A case for an electronic device (e.g., smartphone) protects and extends the battery life of the electronic device. The case has a lower case portion and an upper case portion, which assemble together to protect the top, side, and bottom edges of the electronic device. The lower case portion includes a battery to extend the battery life of the electronic device.

To assemble the case together, the upper case portion slides onto the electronic device and the lower case portion. The case has openings which allow a user with fully access the features of the portable electronic device. A front opening of the case for a screen of the electronic device is formed by a merging of partial openings in the upper and lower case portions. The case also allows the electronic device to synchronize with another device without removing it from the case.

In an implementation, a case for an electronic device includes a lower case or first case portion including: a base surface upon which a back of the electronic device will be placed against, where the base surface includes a top edge; a battery, enclosed in the lower case portion; electronic circuitry, connected to the battery; a lower sidewall, connected to the base surface at an end opposite of the top edge, that will be positioned against a bottom side edge of the electronic device; an inner connector, on the lower sidewall, positioned to connect to a connector of the electronic device, and connected through the electronic circuitry to the battery; and an outer connector, positioned on an outside bottom side of the lower case portion, connected through the electronic circuitry to the battery and inner connector.

The case includes an upper or second case portion including: an upper sidewall that will be positioned against a top side edge of the electronic device when the upper case portion is seated against the lower case portion; and an open side end, opposite of the upper sidewall. The upper case portion slides onto the lower case portion through the open side end in a direction along the base surface from the top edge to the lower sidewall. When the upper case portion is seated against the lower case portion, the upper and lower case portions meet at and form a seam which extends across a back of the case.

In various implementations, the upper case portion further includes a left sidewall having an opening through which buttons on a left side of the electronic device will be accessible. The lower case portion further includes a back surface having a button, connected to the electronic circuitry, positioned on a side of the seam line closer to the outside bottom side of the lower case portion. The lower case portion includes an opening through the base back surface against which a camera lens opening of the electronic device will be placed. The lower and upper case portion are made of rigid plastic material. In particular, the upper and lower portions are not made of a relatively flexible material such as rubber or silicone.

The lower case portion includes: a first group of openings, positioned on the lower sidewall on a first side from the inner connector, where a first speaker opening for the electronic will be placed against the first openings when electronic device is connected to the inner connector. There is a second group of openings, positioned on the lower sidewall on a second side from the inner connector, where a second speaker opening for the electronic will be placed against the second openings when electronic device is connected to the inner connector. There is a third plurality of openings, positioned on the outside bottom side, where each of the third openings is smaller than an opening for the outer connector.

When the upper case portion is seated against the lower case portion, a first open-polygon opening for the lower case portion merges with a second open-polygon opening for the upper case portion to form a front opening, having a closed-polygon shape, of the case through which a screen of the electronic device will be visible. When the upper case portion is seated against the lower case portion, on a back side of the case, the upper case portion overlaps at least one portion of the lower case portion to hold the upper case to the lower case portion.

The lower case portion has a button, connected to the electronic circuitry. By using the button, the case can be switch from one mode to another. For example, via the button, the case is placed in a first mode during which synchronizing with the electronic device will be permitted or in a second mode during which charging of the electronic device will be permitted.

The lower case portion includes some lighting indicators (e.g., LEDs), which are connected to the electronic circuitry. After pressing the button for a first time period, the lighting indicators will specify a level of charge remaining for the battery. After pressing the button for a second time period, longer than the first time period, the circuit enters the first mode (e.g., synchronization). When connecting a cable to the outer connector of the lower case portion, the cable does not pass through any opening of the upper case portion.

In an implementation, a method making an electronic device case includes: providing a lower case portion of the electronic device case including a base front surface and base back surface; enclosing a battery between the base front surface and base back surface; connecting electronic circuitry to the battery and an inner and outer connector; and providing an upper case portion for the electronic device case that slides onto the lower case portion, where when the upper case portion is seated against the lower case portion, the upper and lower case portions form a seam which extends across a back of the case.

In various implementations, the base back surface includes a base upper back surface and base lower back surface, the base back surface has a first side, a second side, and a first thickness between the first and second sides. The method further includes: enclosing the electronic circuitry between the base front surface and the base lower back surface; making a cavity in the base lower back surface, where the cavity extends from the second side toward, but not through to the first side, and a second thickness from an end of the cavity to the first side is thinner than the first thickness; and positioning a lighting source of the electronic circuitry facing toward the cavity, wherein when turned on, the lighting source emits visible light that passes through the second thickness, but not the first thickness, to the first side.

The method includes: providing a button in the base back surface, where the button is connected to the electronic circuitry and a surface of the button is flush with a surface of the base back surface; providing indicator lights in the base back surface, where the indicator lights are connected to the electronic circuitry; after holding the button for a first time period, using the indicator lights to show a charge level of the battery; and after holding the button for a second time period, longer than the first time period, entering a sync mode to establish a data path between the inner and outer connectors.

After entering the sync mode, pressing the button causes exiting of the sync mode. After entering the sync mode, at least one of the indicator lights is used to indicate the circuitry is in the sync mode. A metal shield is provided between the electronic circuitry and the base front surface.

In an implementation, a kit for case for an electronic device includes: a foam tray (e.g., black foam) including a first compartment and a second compartment; a cable, contained within the first compartment; and a case for a portable electronic device, contained within the second compartment.

The case includes: a lower case portion comprising a base front surface and base back surface; a battery, contained between the base front surface and base back surface; electronic circuitry, coupled to the battery; and an upper case portion, attached to the lower case portion. A a first open-polygon opening for the lower case portion merges with a second open-polygon opening for the upper case portion to form a front opening of the case through which a screen of the electronic device will be visible, the front opening having a closed-polygon shape.

The cable is a universal serial bus cable having a first end with a USB Type A plug connector and a second end having USB Mini-B plug connector. When the lower case portion is attached to the lower case portion, the upper and lower case portions meet at and form a seam which extends across a back of the case.

In an implementation, a case for an electronic device includes a lower case portion and upper case portion that slides onto the lower case portion. The lower case portion includes a battery; electronic circuitry, connected to the battery; a lower sidewall; and an inner connector, positioned on the lower sidewall and connected to the battery through the circuitry. A first opening is positioned on the lower sidewall in a first direction (e.g., left) away from the inner connector. A second opening is positioned on the lower sidewall in a second direction (e.g., right) away from the inner connector, where the second direction is opposite of the first direction. The first and second openings may be audio openings (e.g., stereo sound).

An outer connector is positioned on a bottom side of the lower case portion and connected to the battery and inner connector through the circuitry. A third opening is positioned on the bottom side, where a first line through the first opening, second line through the second opening, and a third line through the third opening are parallel to each other. The base front surface may include raised cushioning strips running a third direction, transverse to the first direction.

The upper case portion includes upper, first, and second sidewalls, and a seam edge extends from the first sidewall across a back of the upper case portion through to the second sidewall. The seam edge is generally transverse to the first line. The seam edge is generally transverse to the strips.

The back of the lower case portion can include a number of lighting indicators, connected to the circuitry; and a button, connected to the circuitry, where after pressing the button for a first time period (e.g., less than 3 seconds), the light indicators will specify a level of charge remaining for the battery, and after pressing the button for a second time period (e.g., 3 seconds or more), longer than the first time period, the circuit enters a sync mode.

There are a number of ways to exit the sync mode. After entering the sync mode, when the outer connector is not connected to another electronic device within a third time period (e.g., 30 seconds), longer than the second time period, the circuitry exits the sync mode. After entering the sync mode, when the button is pressed, the circuitry exits the sync mode. After entering sync mode, when the outer connector is disconnected from another electronic device, the circuitry exits the sync mode.

While in the sync mode, one of the lighting indicators flashes. At least one of the lighting indicators used to indicate a charge level of the battery is also used to indicate the circuitry is in the sync mode.

The lower case portion further includes a first camera opening on a base front surface, where the first camera opening is a closed polygon (e.g., circle, square, or hexagon) having a first area; and a second camera opening on a base back surface, where the second camera opening is a closed polygon having a second area, larger than the first area, and the battery is enclosed between the base front surface and base back surface.

A back of the lower case portion includes a number of lighting indicators (e.g., three, four, or five), connected to the circuitry, where a line extends between a first and second of the lighting indicators. A button is connected to the circuitry, and this button is positioned so the line (passing through the first and second of the lighting indicators) does not pass through the button.

A back of the lower case portion includes a number of lighting indicators, connected to the circuitry, where a line segment extends between a first and second of the lighting indicators. A button is connected to the circuitry and this button is positioned in a third direction (e.g., below) from the line segment, transverse to the first direction and is equidistant (e.g., centered between) to ends of the line segment.

After the upper and lower case portions are joined, a seam line divides the case so the lower case portion is from about 0.18 to about 0.38 of a length of the joined case. After the upper and lower case portions are joined, a seam line divides the case so for a front of the case, the lower case portion is about X of a length of the joined case and for a back of the case, the lower case portion is about Y of a length of the joined case, where X and Y are numbers and Y is greater than X. For example, X is about 0.23 and Y is about 0.27.

In an implementation, a method includes: providing a lower case portion of an electronic device case including a base front surface and base back surface; providing a first camera opening on the base front surface, where the first camera opening has a closed polygon shape; enclosing a battery between the base front surface and base back surface; providing electronic circuitry connected to the battery and an inner and outer connector; and providing an upper case portion for the electronic device case that slides onto the lower case portion, where the upper case portion comprises a seam edge that extends from a first front corner across a back of the upper case portion through to a second front corner.

The base back surface includes a base upper back surface and base lower back surface. The base back surface has a first side, a second side, and a first thickness between the first and second sides. The method further includes: enclosing the electronic circuitry between the base front surface and the base lower back surface; making a cavity in the base lower back surface, wherein the cavity extends from the second side toward, but not through to the first side, and a second thickness from an end of the cavity to the first side is thinner than the first thickness; and positioning a lighting source of the electronic circuitry facing toward the cavity, wherein when turned on, the lighting source emits visible light that passes through the second thickness, but not the first thickness, to the first side.

A second camera opening is provided on the base back surface, where the second camera opening has a closed polygon shape and a first area of the first camera opening is less than a second area of the second camera opening. The base back surface includes a sloped lens hood around the first camera opening, extending from the first camera opening to the second camera opening at least a thickness of the battery.

The method includes: providing a button in the base back surface, where the button is connected to the electronic circuitry and a surface of the button is flush with a surface of the base back surface; providing indicator lights in the base back surface, where the indicator lights are connected to the electronic circuitry; after holding the button for a first time period, using the indicator lights to show a charge level of the battery; and after holding the button for a second time period, longer than the first time period, entering a sync mode to establish a data path between the inner and outer connectors.

The method includes after entering the sync mode, pressing the button causes exiting the sync mode. The method includes after entering the sync mode, using at least one of the indicator lights to indicate the circuitry is in the sync mode.

In an implementation, a method includes providing a lower case portion. The lower case portion includes a front side, a back side, and a lower sidewall. The lower case has no indicator lights on a front side. The lower case has an inner connector having a first width (e.g., 22 millimeters) and an outer connector having a second width (e.g., 8 millimeters). The second width is less than the first width. The first width is from about 2 to about 2.75 times wider than the second width.

The lower case portion includes a number of indicator lights (e.g., five) on a back side. A button is centered (e.g., below a middle of the five indicator lights) on the back side. Holding the button for more than a time period (e.g., three seconds or more) indicates to the circuitry to enter a synchronization mode. The lower case portion has a battery and circuitry to charge the battery using power input through the outer connector. The battery charges a portable electronic device to be connected to the inner connector.

A first camera opening (e.g., a circle) on a base front surface of the lower case portion has a first diameter. A second camera opening (e.g., a circle) on a base back surface of the lower case portion has a second diameter greater than the first diameter. A first set of audio openings is positioned on the lower sidewall at a first side (e.g., left) of the inner connector. A second set of audio openings is positioned on the lower sidewall at a second side (e.g., right) of the inner connector A third set of audio openings on an exterior lower side of the lower case portion is at a second side of the outer connector. A first line passing through one of the first set of audio openings is parallel to a second line passing through one of the third set of audio openings.

The lower case portion has a first raised strip on the base front surface. The lower case portion has a second raised strip on the base front surface. The raised strips are made of the same material and provide some cushioning, compared to the base front surface.

In a specific implementation, when the phone is placed on the base front surface and connected to the inner connector, a top of the phone does not extend beyond an upper edge of the base front surface. A front opening of the assembled case is generally rectangular with rounded corners. The front opening has a first frame edge that extends in a vertical direction from a first seam line toward a first rounded corner at a bottom left of the lower case portion, through the first rounded corner to a second frame edge that extends in a horizontal direction toward a second rounded corner at a bottom right of the lower case portion, through the second rounded corner to a third frame edge, parallel to the first frame edge to a second seam line.

The first seam line is inline with the second seam line. The first seam line is transverse to the vertical direction. The first seam line is positioned at from about 0.15 to about 0.38 of a vertical length of the lower case portion. Further, when the upper case portion is on the lower case portion, the first seam line is positioned at about 0.23 of a length of a vertical length of the assembled case. When a portable electronic device is inserted in the inner connector, a lower edge of a screen is parallel to the first seam line.

When the upper case portion is on the lower case portion, there is a third seam line for a back of the case. The third seam line is positioned at a different ratio (e.g., 0.27 versus 0.23) of the vertical length of the assembled case.

On a left side, the upper case has a first slot opening. On a top side, the upper case has a circular opening and a second slot opening, smaller than the first slot opening. On a back, the upper case has a camera opening.

In an implementation, a back and side surface of the upper case portion is coated with a soft-touch coating. A front inside surface of the upper case portion is polished to a glossy finish. A front, back, and side surface of the lower case portion is coated with the soft-touch coating. The base front surface of the lower case portion is polished to a glossy finish.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 5 shows a left side view of the assembled case.

FIG. 6 shows a right side view of the assembled case.

FIG. 9 shows a front view of the upper case portion.

FIG. 10 shows a front view of the lower case portion.

FIG. 22 shows a right side view of the assembled case including the camera opening.

FIG. 23 shows a cross section of the lens hood between the camera openings of the upper and lower case portions.

FIGS. 27 and 28 show tables listing operational modes of the portable electronic device case.

FIG. 30 shows the rightmost indicator light turned on.

FIG. 31 shows the leftmost indicator light turned on.

FIG. 32 shows three indicator lights turned on.

FIG. 33 shows five indicator lights turned on.

DETAILED DESCRIPTION OF THE INVENTION

Figure 1:
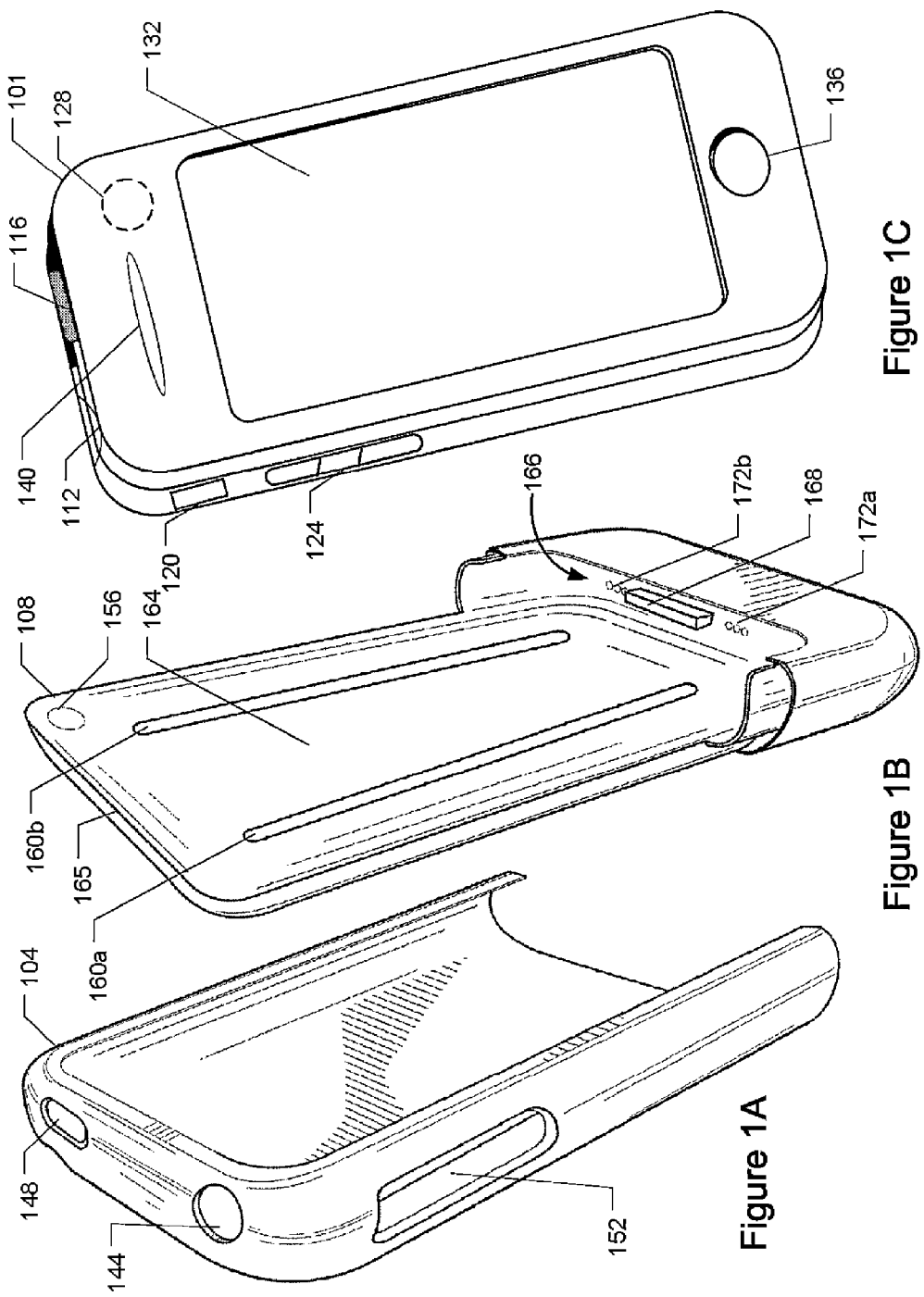
FIG. 1A shows an upper case portion for a case for a portable electronic device.
FIG. 1B shows a lower case portion for a case for the portable electronic device.
FIG. 1C shows an example of a portable electronic device.

FIGS. 1A-1C show a case that protects a portable electronic device 101 (e.g., smartphone, music player, or camera) from damage and also has a built-in battery to extend the battery life of the portable electronic device. FIG. 1A shows an upper case portion 104 of the case, FIG. 1B shows a lower portion 108 of the case, and FIG. 1C shows a representative portable electronic device 101. This figures show the case and electronic device in a portrait mode orientation. However, the orientation of the case may change (e.g., landscape mode orientation or upside-down orientation) or vary depending on the point of view or the orientation of the electronic device. So, the lower case portion may become the upper case portion, right-side case portion, or left-side case portion. The upper case portion may become the lower case portion, right-side case portion, or left-side case portion. Regardless of the orientation, the case has two portions, where one case portion encloses a built-in battery. The lower case portion may also be referred to as a first case portion and the upper case portion may be referred to as a second case portion.

Figure 2:
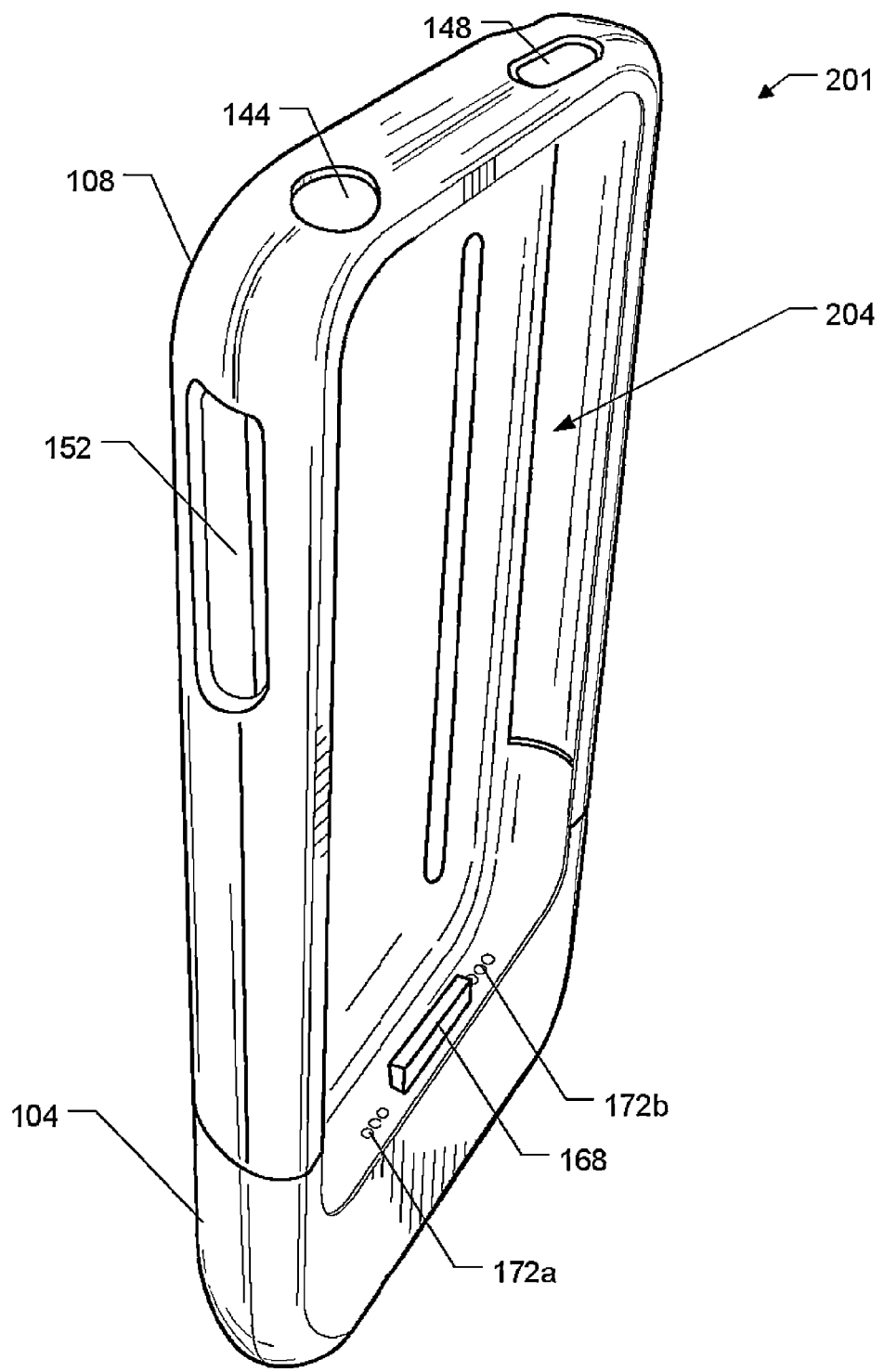
FIG. 2 shows the portable electronic device case, where the upper and lower case portions are assembled together. The portable electronic device is not shown in the case.

The portable electronic device fits into the lower case portion. The upper case portion slides over the portable electronic device and lower case portion to secure the portable electronic device in place. FIG. 2 shows an assembled case 201 with upper and lower case portions joined together, but without the portable electronic device in the case.

The case protects the portable electronic device and has openings which allow a user to access the features of the device. Further, the case includes a battery, enclosed within the lower case portion, to supplement the battery of the portable electronic device, thus increasing running time for the portable electronic device. Features and aspects of this case may be applied to cases for various portable electronic devices and device types.

In FIG. 1C, the portable electronic device is a smartphone. For purposes of discussion, this patent describes the case as being for a smartphone. Some examples of smartphones include the Apple® iPhone, Blackberry® Storm, Blackberry® Pearl, Samsung® Blackjack, LG® Touch phones, and LG® Dare, and there are many others.

However, the case can be used with any type of battery-powered portable electronic device, where this device does not necessarily provide telephony functionality. For example, in other implementations, the case may be for a portable or handheld gaming device (e.g., Sony® PlayStation® Portable or PSP®, or Nintendo® DS™), portable or palm-sized computer (e.g., OQO computer or Intel® Atom™ netbook), personal digital assistant (PDA), pager, audio player, video player, media player (Apple® Touch), cassette player, compact disc (CD) player, digital video disc (DVD) player, camera, video recorder, digital recorder, voice recorder, music recorder, digital audio recorder, or nonvolatile memory storage (e.g., Flash or phase-change memory).

Trademarks are the property of their respective owners. Apple is a trademark of Apple Computer Incorporated. Blackberry is a trademark of Research in Motion Limited. Samsung is a trademark of Samsung Electronics Company Limited. LG is a trademark of LG Electronics, Incorporated. Sony is a trademark of Sony Corporation. PlayStation and PSP are trademarks of Sony Computer Entertainment Incorporated. Nintendo is a trademark of Nintendo Company, Limited. Intel and Atom are trademarks of Intel Corporation. OQO is a trademark of OQO Incorporated.

In FIG. 1C, the smartphone has a top side edge where there is a headset jack 112 and a sleep/wake button 116. On a left side edge, there is a ring/silent switch 120 and volume buttons 124. On a back of the device (not shown in FIG. 1C), there is a camera lens 128 (indicated using broken lines).

On a bottom side edge of the device, there are speaker and microphone openings (not shown) and an electrical connector (not shown). Via the electrical connector, the phone can be charged or connected to another device, such as a computer or another smartphone, for synchronizing or transferring of files.

On a front of the device, there is a screen 132, which may be a touch screen. Below the touch screen, there is a button 136, and above the touch screen, a telephone receiver 140 (which a user can hold to an ear to hear a telephone conversation).

While the device is in the case, the user will still be able to access the features of the device. Specifically, for example, for accessing headset jack 112 and sleep/wake button 116, upper case portion 104 has on its top side (upper sidewall), a headset jack opening 144 and a button opening 148, respectively. For accessing ring/silent switch 120 and volume buttons 124, the upper case portion has on its left side (left sidewall), a side opening 152. For camera lens 128, lower case portion 108 has a camera opening 156 and upper case portion 104 also has a corresponding camera opening (not shown in FIG. 1A). The camera opening in the upper case portion lines up with the camera openings in the lower case portion.

As shown in FIG. 2, when assembled together, the upper and lower portions of the case define an opening 204 in the front, through which the user can view and access the touch screen, home button, and receiver. As shown in the figure, opening 204 has a closed-polygon shape.

The closed-polygon shape can have any shape (e.g., square, trapezoid, pentagon, hexagon, octagon, star, circle, arch, or oval). In a specific implementation, the closed-polygon shape is a rectangle with rounded corners. This closed-polygon shape is formed by the merging of two open-polygon shapes. The upper case portion has a first open-polygon front opening; this shape may generally be described as an upside down U. The lower case portion has a second open-polygon front opening; this shape may generally be described as a U. To assemble the case together, the upper case portion is seated or fitted against the lower case portion. Then the upside-down U of the upper case portion joins with the U of the lower case portion to form the rectangular closed-polygon-shaped front opening shown in FIG. 2.

The lower case portion has rubber strips 160a and 160b on a base front surface 164. The strips protect and cushion the phone in the case. When placed in the case, a back of the electronic device will be placed against base front surface 164. The base surface has a top edge 165. There is a lower sidewall 166 that is connected to the base front surface at an end opposite of the top edge. The lower sidewall will be positioned against the bottom side edge of the electronic device.

On the lower sidewall is an inside or inner connector 168, which is positioned and will connect to the electrical connector on the bottom side edge of the electronic device. To the left and right of the inner connector are left speaker openings 172a and right speaker openings 172b. Each of the speaker openings 172a and 172b may include one or more individual openings. A left speaker opening on the bottom side edge of the electronic device will be placed against left speaker openings 172a. A right speaker opening on the bottom side edge of the electronic device will be placed against right speaker openings 172b. The electronic device's microphone and speakers transmit sound through these speaker (or audio) openings. More details on the speaker or audio openings are below.

Figure 3:
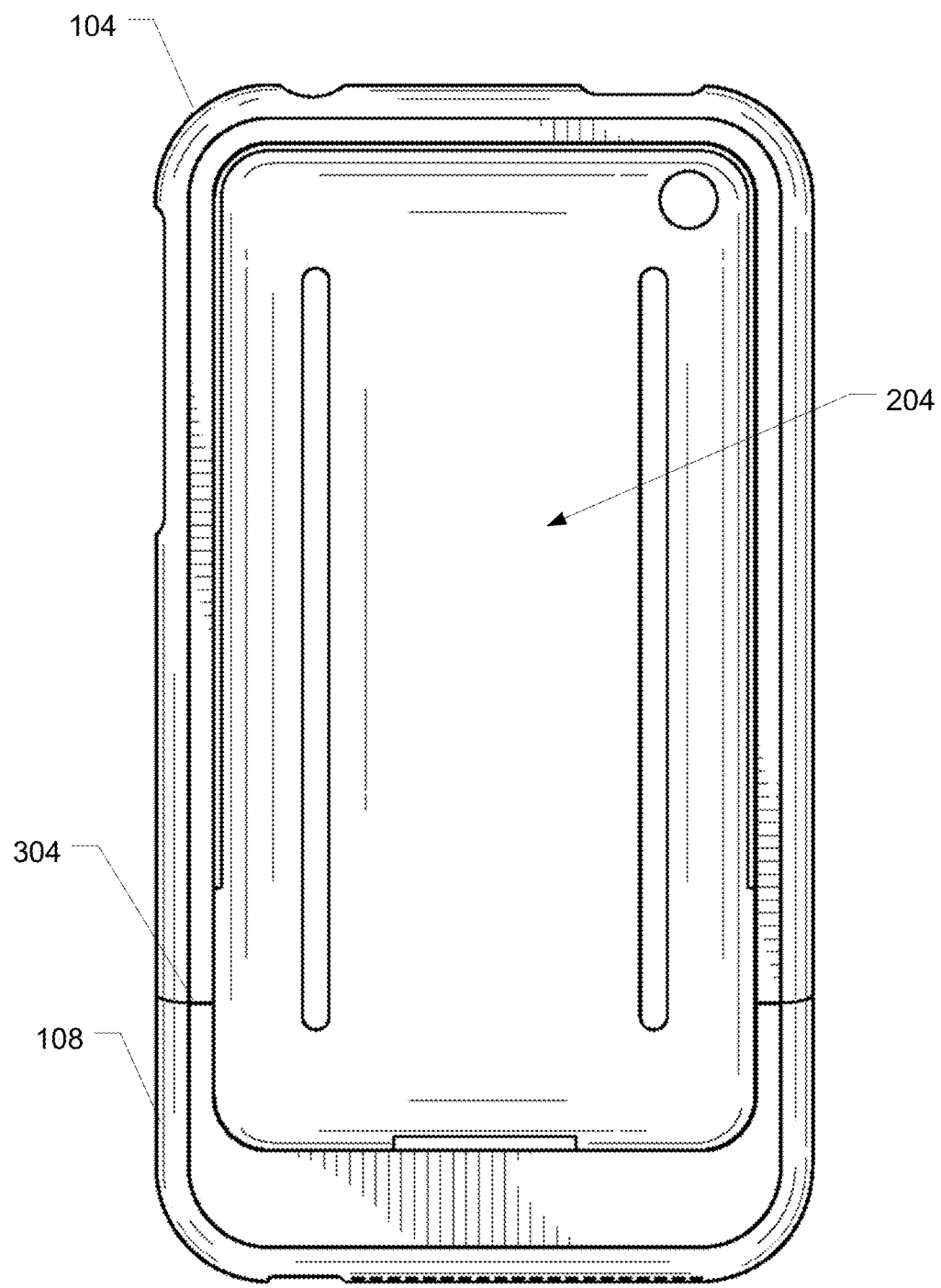
FIG. 3 shows a front view of the assembled case.

FIGS. 3-10 show various other views of the case. FIG. 3 shows a front view of the assembled case. Where upper 104 and lower 108 case portions meet, there is a seam line 304. There are seam lines on either side (opposite sides) of front opening 204.

Figure 4:
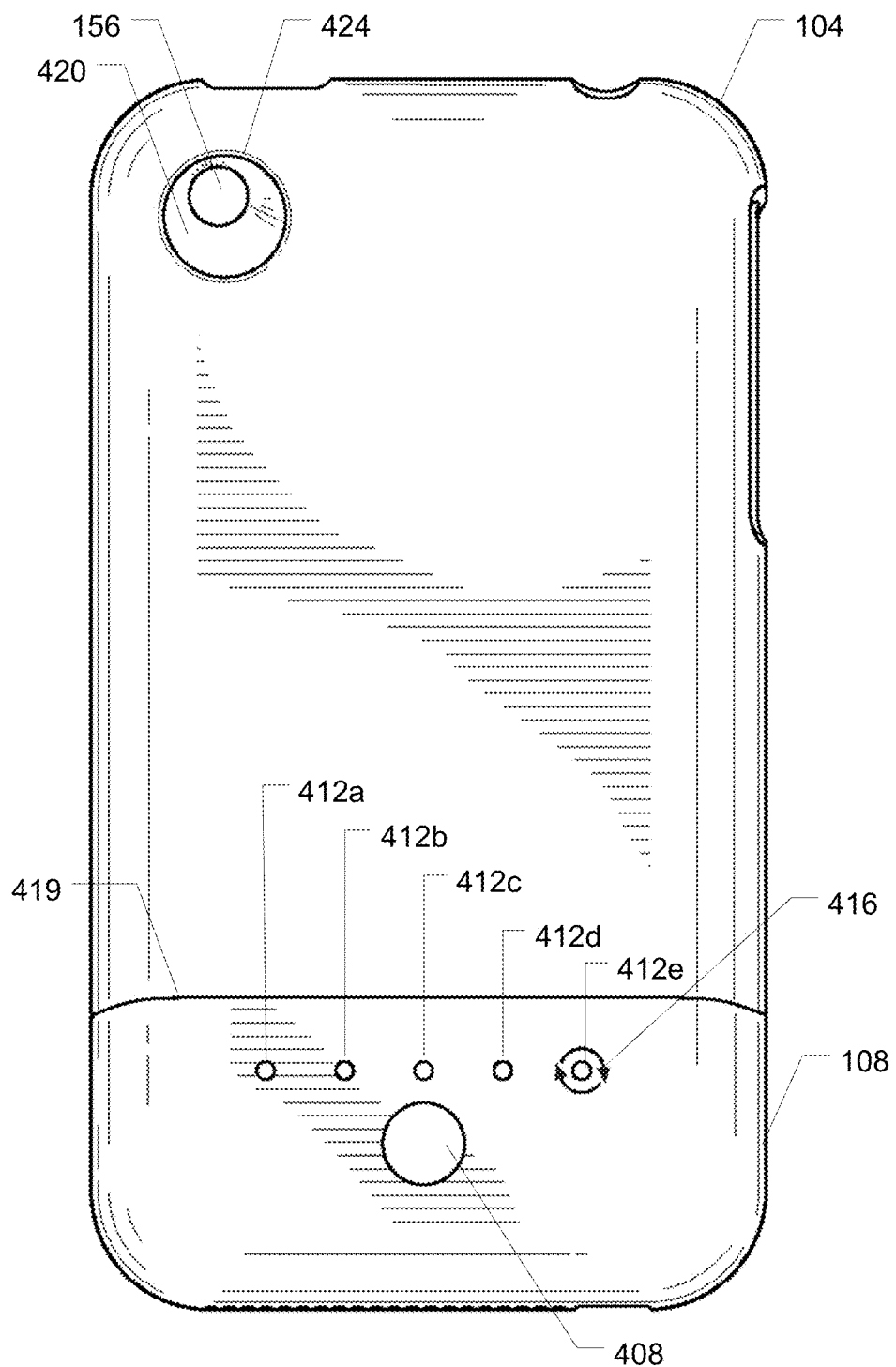
FIG. 4 shows a back view of the assembled case including a case button, indicator lights, a lens shield, and camera opening.

FIG. 4 shows a back view of the assembled case. For lower case portion 108, there are a case button 408 and indicator lights 412a-e (e.g., light emitting diodes (LEDs) or other lighting sources). A synchronization (or sync) marking 416 is around indicator light 412e; this marking is optional. When the upper case portion is seated or fitted against the lower case portion, the upper and lower case portions meet at and form a seam line 419 which extends across a back of the case.

The lower case portion includes a lens shield or lens hood 420 (see also FIG. 12), which extends from camera opening 156. Upper case portion 104 also has a camera opening 424 for the camera lens; camera opening 424 is larger (i.e., larger diameter) than camera opening 156. More details on the camera lens openings and lens shield are below.

FIG. 5 shows a left side view of the assembled case. Where the upper and lower case portions meet, there is a seam line that extends across the back and through the sides to the front. In a specific implementation, for the side of the case, seam line 304 is angled slightly with respect to a horizontal line. For the front of the case, a distance (SM1) is from the seam line to the bottom of the case. For the back of the case, a distance (SM2) is from the seam line to the bottom of the case. The angled seam line on the side is due to distance SM2 being greater than distance SM1.

Figure 7:
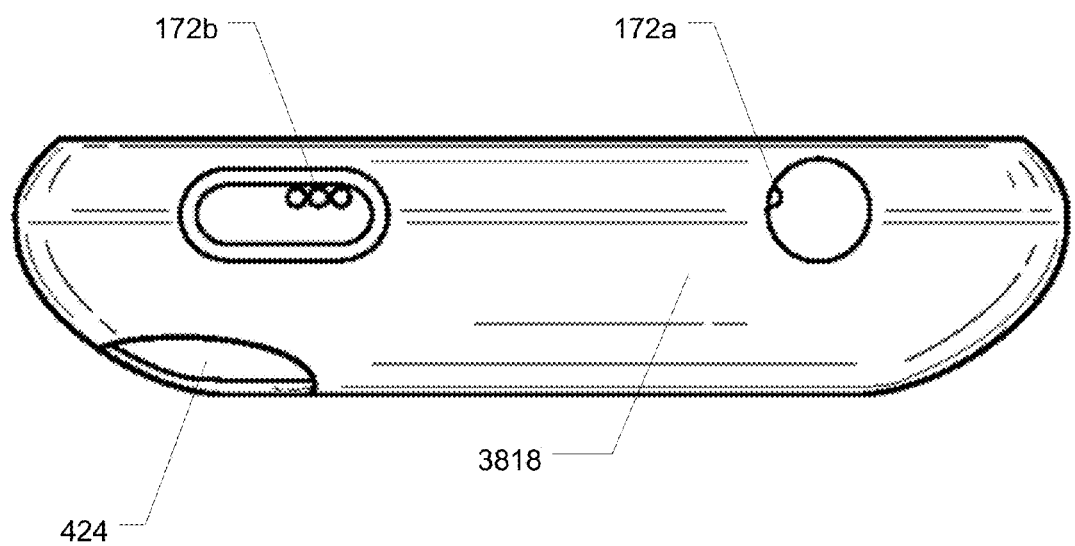
FIG. 7 shows a top side view of the upper case portion of the assembled case.

FIG. 6 shows a right side view of the assembled case. The seam line is also angled in this side view. FIG. 7 shows a top side view of the upper case portion of the assembled case. The speaker openings 172a and 172b are visible through the openings on the top side of the upper case portion. More details on camera opening 424 are below.

Figure 8:
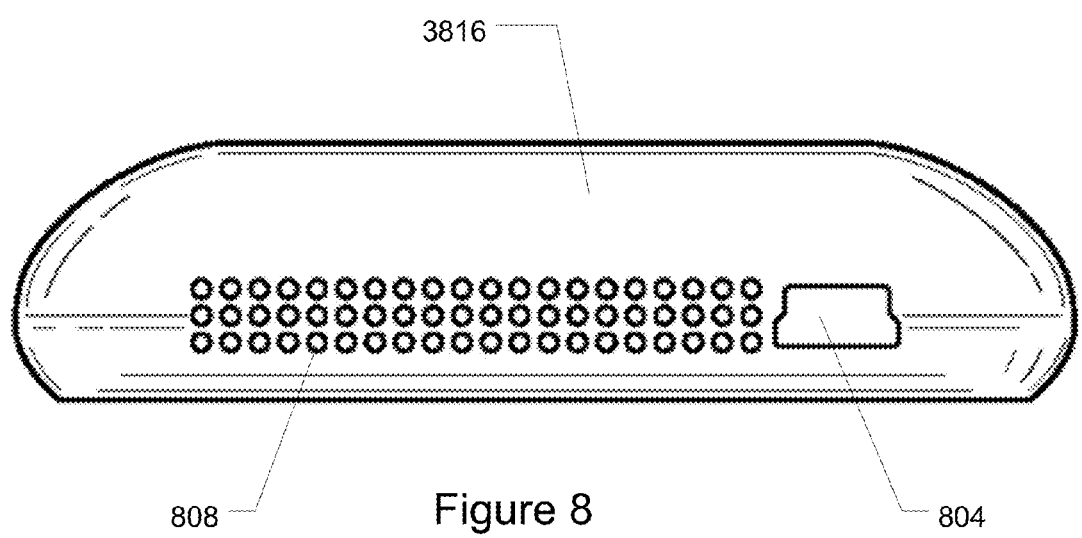
FIG. 8 shows a bottom side view of the lower case portion of the assembled case.

FIG. 8 shows a bottom side view of the lower case portion. The lower case portion has an outside or outer connector 804 (e.g., a mini-B USB connector) and a grille or outside speaker opening 808 that are positioned on an outside bottom side. The outer connector allows a user to connect the case and device via a cable (e.g., USB cable) to a power source or to synchronize with another electronic device. In the specific implementation in FIG. 8, the outer connector is positioned a bottom side edge of the lower case portion (or portion which encloses or conceals the battery). However, in other implementations, the outer connector may be positions at other locations. For example, the outer connector can be positioned on an outside right side edge of the lower case portion. The outer connector can be positioned on an outside left side edge of the lower case portion. The outer connector can be positioned on a back side (near or below the buttons and LEDs) of the lower case portion. The outer connector can be positioned on a front side (near or below the front screen opening) of the lower case portion. In alternative implementations, the outer connector may be position on the case portion which does not have enclose the battery (e.g., upper case portion); then the connector is connected to the battery via wires or other electrical connectors. The outer connector can be positioned on an outside top or upper side edge of the upper case portion. The outer connector can be positioned on an outside right side edge of the upper case portion. The outer connector can be positioned on an outside left side edge of the upper case portion. The outer connector can be positioned on a back side of the upper case portion. The outer connector can be positioned on a front side (near or above the front screen opening) of the upper case portion.

The outside speaker opening allows sound output (e.g., stereo sound output). Sound from the electronic device will travel through speaker openings 172a and 172b and output through openings 808. Openings 172a and 172b are aligned with openings 808, so a line passing through openings 172a and 172b will be parallel with lines passing through openings 808. Note that openings 808 are made up of individual circular openings that are each smaller than the opening for outer connector 804. In other implementations, however, there can be any number of openings, larger or smaller than the openings shown, and each opening may have a different shape. More details on the outer connector and outside speaker opening are below.

FIG. 9 shows a front view of the upper case portion. The upper case portion includes a left sidewall 904, a right sidewall 908 (opposite the left side wall), an upper sidewall 912, and an upper interior surface 916 which connects to the left, right, and upper sidewalls. Generally, the upper interior surface is approximately perpendicular to the sidewalls. Sidewalls 904, 908, and 912 generally form a three-sided rectangular frame with rounded corners (e.g., upside down U). The upper case portion also has an open side end 919 (which would be the fourth side of the rectangular frame) that is opposite of upper sidewall 912.

FIG. 10 shows a top view of the lower case portion. The lower case portion includes front base surface 164 with strips 160a and 160b that run in a vertical direction (when viewing the case in a portrait orientation) on its surface. The electronic device (e.g., phone) will be placed on front base surface 164 and inserted (e.g., by sliding) into inner connector 168, which holds the phone to the lower case portion. There are a left insert 1004a and a right insert 1004b which curve upward at a lower portion of the base. These inserts extend from a lower sidewall 1006, which is generally shaped like a three-sided rectangular frame with rounded corners (e.g., U).

After the electronic device is placed on the front base surface, to assemble the case, a person takes the upper case portion and slides it (through open side end 919 of the upper case portion) over the electronic device onto the lower case portion. The upper case portion slides onto the lower case portion through the open side end in a direction 1013 (i.e., vertical direction) along the base surface from the top edge to the lower sidewall.

In an implementation, the material of the case is a rigid hard plastic. Both upper and lower case portions are made of the same material. The upper case portion is formed of a shape to fit over the phone and lower case portions without need to stretch the upper case portion over the lower case portion. The case portions made of a relatively rigid material cannot be stretched as much as, for example, gel, silicone, or rubber, without cracking or breaking. More details on the material of the case are below.

The base front surface generally has a contour that matches or conforms to the back of the phone or other device which will lie on the base front surface. For example, if the phone has a convex curved back, then the base front surface will have a concave curved surface. The base front surface gives good support for the electronic device. A length of the base front surface is such that when an electronic device is placed on the base surface, the top edge base front surface is roughly aligned (e.g., same length, slightly longer, or slightly shorter) with a top side edge of the electronic device.

Strips 160a and 160b extend in the vertical direction along base front surface 164 of the lower case portion. Strips 160a and 160b are typically a different material than the base front surface material and rise slightly above the base front surface. These strips can be made of a material that has cushioning properties such as rubber, vinyl, polymer, plastic, foam (e.g., material with bubbles), or silicone. Depending on the material used, the strips may also be slightly tacky. These strips help cushion the electronic device and prevent it from becoming scratched or marred, especially when inserting the device into the lower case portion. The strips also help to gently grip the electronic device so that it does not inadvertently slide or become as easily dislodged from the lower case portion.

The figures show a specific arrangement and number of strips, but in other implementations, there can be any number of strips in any arrangement. For example, there can be three, four, or more strips running in the lengthwise direction. Or the strips can run diagonally or horizontally on the base front surface. Further, in an implementation, the strips can be omitted entirely.

Like a sleeve, the upper case portion slides over and onto the left and right inserts (1004a and 1004b) of the lower case portion until being stopped by a raised lip 1008 of the lower case portion. This raised lip extends from the left insert along the back (see also FIG. 12) to the right insert of the lower case portion. Where the upper and lower case portions meet, the exterior surfaces become flush with each other.

When the upper case portion is seated against the lower case portion, on a back side of the case, the upper case portion overlaps at least one portion of the lower case portion to hold the upper case to the lower case portion. The upper case portion overlaps inserts 1004a and 1004b and a back base surface 1204 (FIG. 12) of the lower case portion.

The upper case portion generally holds onto the left and right inserts of the lower case portion through friction. Further, a distance from an outer surface of the left insert to an outer surface of the right insert can be typically slightly greater than an inner width of the upper case portion (i.e., into which the inserts will fit). This allows the upper case portion to hold onto the left and right inserts by compression.

Once joined, sidewalls 904, 908, 912, and 1006 for the upper and lower case portions form front opening 204, which is generally a rectangular frame with rounded corners. The upper case portion's camera opening 424 aligns with the lower case portion's camera openings 156 and 1208. The camera lens of the phone will have an unobstructed view through the camera openings of the lower and upper case portions.

Figure 12:
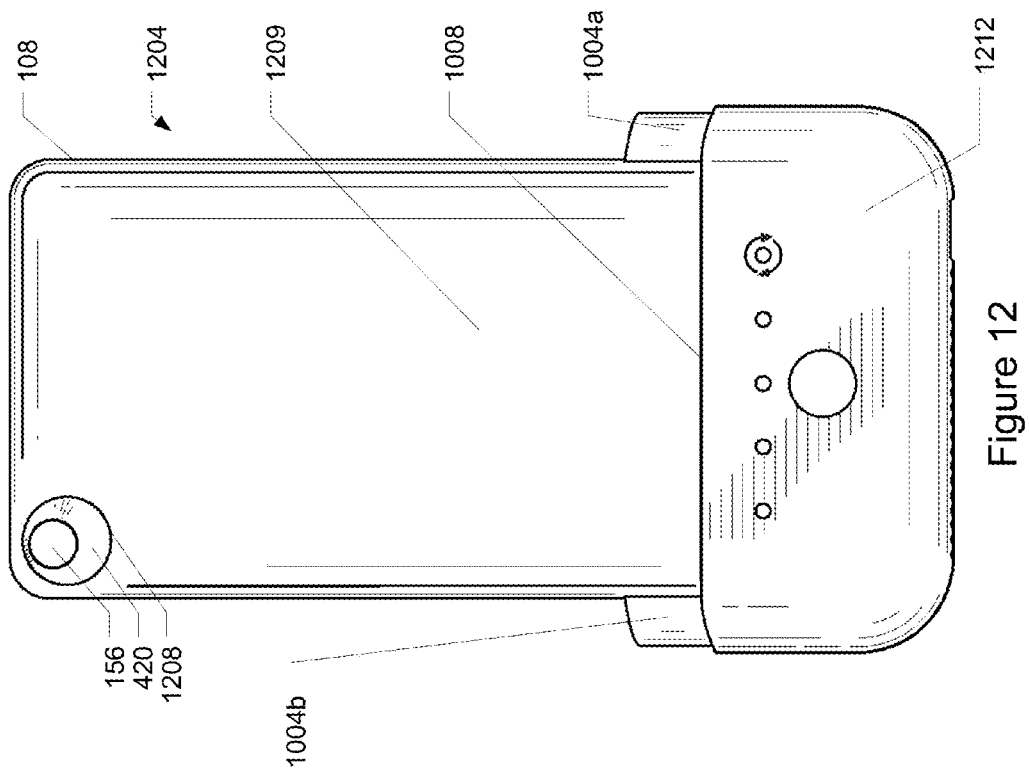
FIG. 12 shows a back view of the lower case portion.
Figure 11:
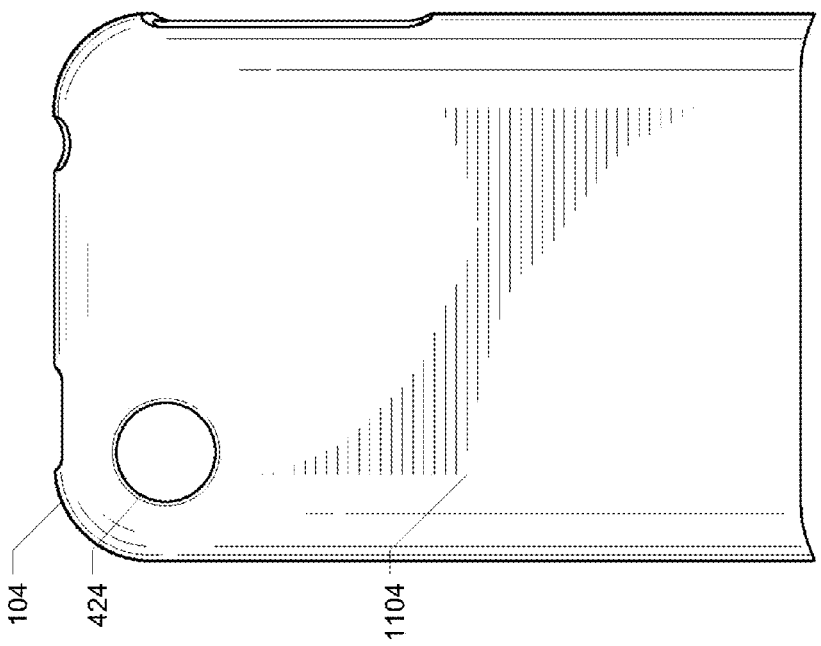
FIG. 11 shows a back view of the upper case portion

FIG. 11 shows a back view of the upper case portion. There is an upper exterior surface 1104, which is the opposite side of upper interior surface 916. FIG. 12 shows a back view of the lower case portion. Lens shield 420 extends from camera opening 156 at base front surface 164 to opening 1208 at a base back surface 1204. Camera opening 156 is smaller (i.e., smaller diameter) than camera opening 1208. Note that if the base surface is sufficiently shorter than the electronic device, camera opening 156, lens shield 420, and camera opening 1208 may be omitted or partially omitted from the lower case portion.

In a specific implementation, the base back surface is a single piece (e.g., plastic) that has a base upper back surface 1209 and a base lower back surface 1212. The base upper back surface and base lower back surface can be different sections of the base back surface. In another implementation, base upper back surface 1209 and base lower back surface 1212 are individual pieces (e.g., two plastic pieces) that make up the base back surface (e.g., see FIG. 38).

Figure 16:
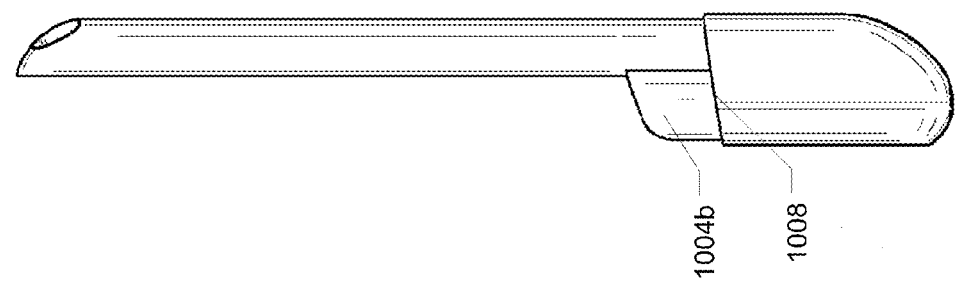
FIG. 16 shows a right side view of the lower case portion.
Figure 15:
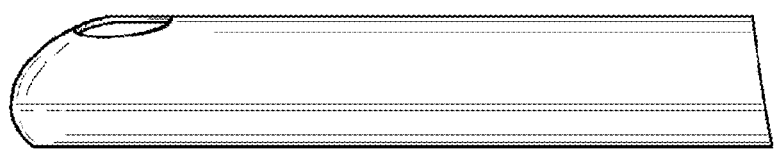
FIG. 15 shows a right side view of the upper case portion.
Figure 14:
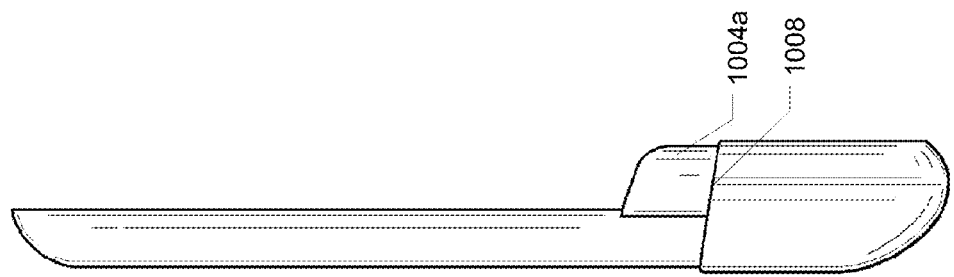
FIG. 14 shows a left side view of the lower case portion.
Figure 13:
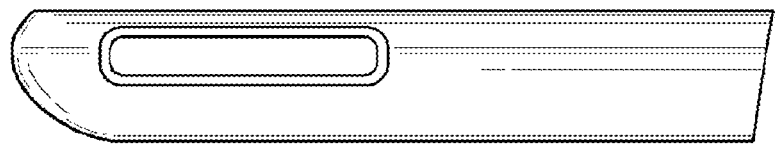
FIG. 13 shows a left side view of the upper case portion.

FIG. 13 shows a left side view of the upper case portion. FIG. 14 shows a left side view of the lower case portion. FIG. 15 shows a right side view of the upper case portion. FIG. 16 shows a right side view of the lower case portion.

Figure 17:
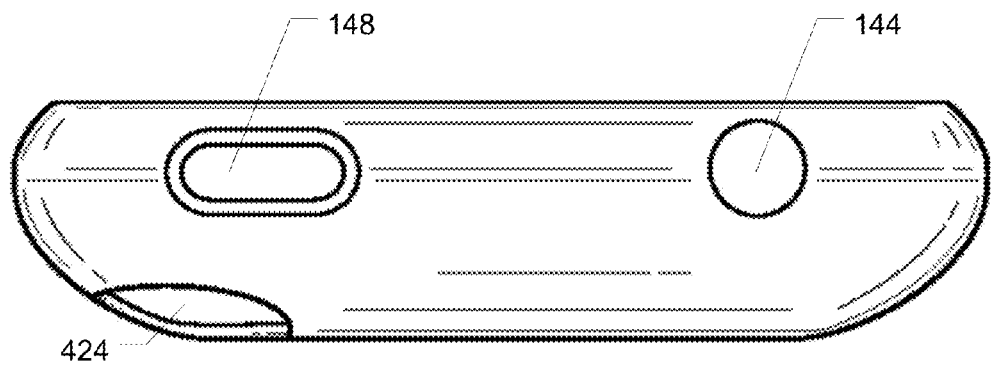
FIG. 17 shows a top side view of the upper case portion only.
Figure 18:
FIG. 18 shows a bottom side view of the upper case portion only.
Figure 19:
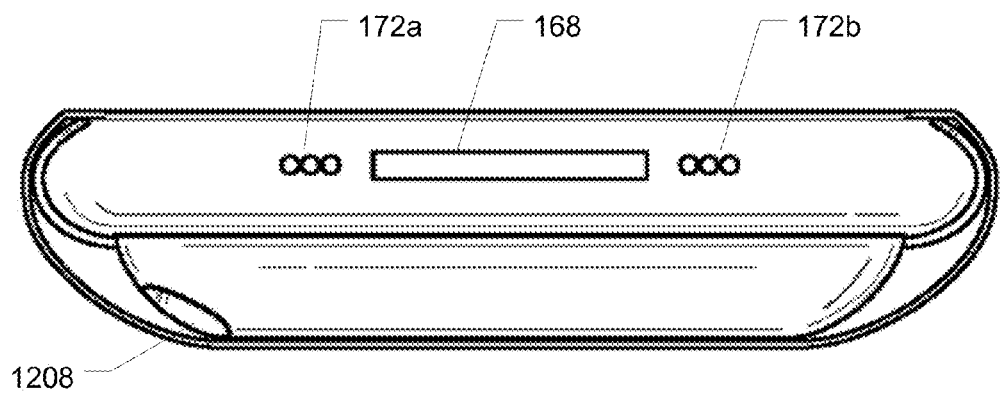
FIG. 19 shows a top side view of the lower case portion only.

FIG. 17 shows a top side view of the upper case portion (case not assembled), including headset jack opening 144, button opening 148, and camera opening 424. FIG. 18 shows a bottom side view of the upper case portion. FIG. 19 shows a top side view of the lower case portion, showing inner connector 168, left speaker opening 172a, right speaker opening 172b, and camera opening 1208.

The case shown has specific openings sized, shaped, and positioned at particular locations. These openings are customized for smartphone 101 as described above and shown in FIG. 1C. It should be appreciated that there may be any number of openings in the upper and lower portions of the case to allow features of a portable electronic device to be accessible to a user. The openings may have any size, any shape, any combination of sizes, or any combination of shapes. There can be more, fewer, or different openings from those shown for the case in the figures. The openings can be positioned at different locations than that shown.

Figure 20:
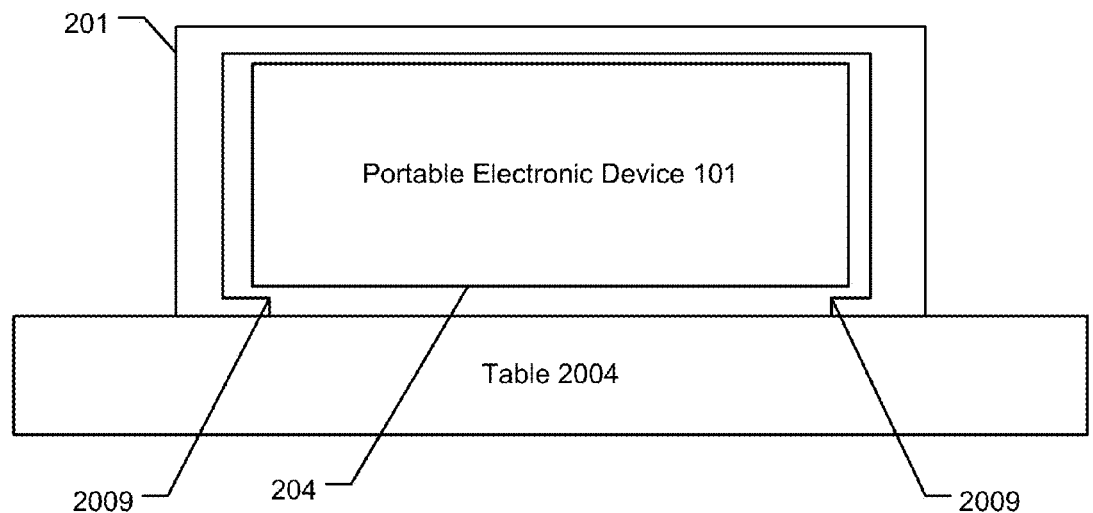
FIG. 20 shows a cross section of the case holding a phone when placed face down on a flat surface.

FIG. 20 shows a cross section of a case with a phone, when placed face down on a table 2004 or other flat or relatively flat surface. For example, the case with phone may be placed on a countertop, vanity, hot tub edge, window sill, chair, sofa, or floor. The front of the case has front opening 204 (see FIG. 2) and along a border of this opening are frame edges 2009. These frame edges hold the phone in the case and also raise the phone slightly off the surface of the table.

This feature helps protect the front face of the phone from damage (e.g., scratching) since the front face does not touch the surface when in the face-down position. Thus, for example, the user can rub the face-down case and phone on the surface (as if sanding the surface using a sanding block), and the phone's front face and screen will not be damaged.

In a specific embodiment, the frame edges of the case form a plane. This plane is generally, depending on a flatness of the table surface, approximately planar with a plane of the table surface. The frame edges raise the phone's screen from about 0.25 millimeters to about 2.5 millimeters above the plane of the frame edges. For example, a distance from the phone's screen to the table's surface can be 0.5, 0.8, 1, 1.2, or 1.5 millimeters. In a specific implementation, the phone's screen is coplanar to the table and a distance from the table to the screen is approximately 1 millimeter. This distance will vary depending on the flatness of the surfaces.

Also, generally, front opening 204 is smaller than the phone's front face. In other words, for example, a length of the front opening is less than a length of the phone's front face. A width of the front opening is less than a width of the phone's front face. In a specific implementation, the front opening is generally rectangular and has a length of about 109.5 millimeters and a width of about 55 millimeters. The corners of the front opening can also be rounded (or square in other implementations).

Figure 21:
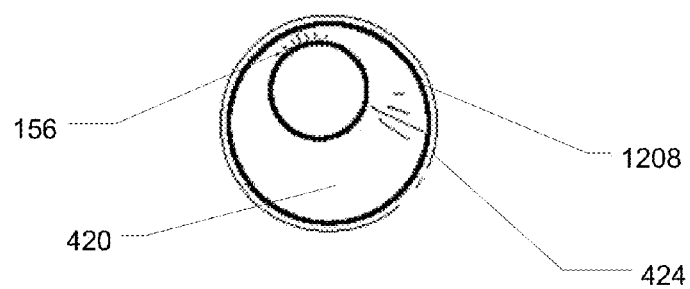
FIG. 21 shows a close-up top view of the built-in lens hood and the camera openings of the upper and lower case portions.

FIG. 21 shows a close-up top view of built-in lens hood 420 and the camera openings of the upper and lower case portions. FIG. 22 shows a side view of a camera opening 2230 for the assembled case. FIG. 23 shows a cross section of the lens hood between the camera openings of the upper and lower case portions.

Within box 2305 is the lower case portion which includes base front surface 164 and base back surface 1204. Base front surface 164 (see also FIG. 1) has camera opening 156. Base back surface 1204 has camera opening 1208. Also, the base front surface and base back surface form an enclosure 2309 between them, within which a battery 2317 for the case is housed. More details on the battery are below.

Base back surface 1204 has lens hood 420 which extends from camera opening 1208 toward base front surface 164. Base front surface 164 joins with base back surface 1204, and camera opening 156 aligns with lens hood 420. When the case is assembled together, camera opening 424 of upper case portion 104 aligns with the camera openings in the lower case portion.

In a specific implementation, the lens hood has about a 31 degree field of view. In other implementations, however, the field of view can be any desired number of degrees, less than or greater than 31 degrees. The angle of view provided by the case will depend on the field of view of the camera of the phone and will generally be at least as wide as the camera's field of view, so that the lens hood will not appear in the photos taken by the camera. In an implementation, the camera has a field of view of about 30-32 degrees, and the corresponding camera opening in the case is at least about 30-32 degrees or wider. For example, the angle of view of the camera opening can range from about 25-60 degrees.

In a specific implementation, the lens hood for the lower case portion has a length of about 3.7 millimeters from opening 156 to opening 1208. However, the length of the lens hood can be any desired length and vary on a number of factors such as a thickness of the battery. For example, in other implementations, the hood length can vary from about 2.8 millimeters to about 5 millimeters. The length can be less than 2.8 millimeters (e.g., for a thin battery) or greater than 4.5 millimeters (e.g., for a jumbo battery). Generally, the thicker battery 2317 is, the longer the lens hood. A thicker battery (for the same two-dimensional area) also usually means greater battery capacity.

The case has the camera openings to allow a user to take pictures with the phone's camera without removing the phone from the case. When the phone is placed in the case, the phone's camera lens aligns behind the lower case portion's camera openings 156 and 1208, and the upper case portion's camera opening 424 so that the camera lens' view is unobstructed. A picture taken with the phone in the case will not capture the sides or edges of the camera openings.

The built-in lens hood of the case is a feature that improves the picture taking of the camera. Without a lens hood, sun or other light can more easily strike the camera lens and cause unwanted flaring, glare, uneven lighting, and shadows in the photos. The lens hood of this case helps prevent such undesired effects.

The lens hood also protects the lens of the camera. The lens hood protrudes from the camera lens a certain distance, preventing inadvertent touches and scratches to the lens. Without a lens hood, the camera lens is more vulnerable to accidental contact (e.g., bumping against a surface), potentially resulting in damage to the camera lens. The lens hood also helps to shelter the camera lens from dust, rain, and other elements. Without a lens hood, for example, rain drops can more easily hit the camera lens. The lens hood of this case helps prevent such damage.

The area of camera opening 1208 is greater than the area of camera opening 156. A lens hood surface between the two camera openings is conical or frustoconical. The greater the size of camera opening 1208 is as compared to camera opening 156 helps to increase the peripheral field that can be captured by the camera and helps to ensure that the camera does not capture the sides or edges of camera opening 1208 when taking pictures. The area of camera opening 424 is greater than the area of camera opening 1208.

It is desirable to have the diameter of the upper case portion camera opening larger than the camera openings of the lower case portions. Similarly, it is desirable to have the camera opening in the back of the lower case portion larger than the camera opening in the front of the lower case portion.

In a specific embodiment, camera openings 156, 424, and 1208 are circular. However in other implementations, the camera openings can be any shape or closed polygon (e.g., not a semicircle or arc), such as a triangle, square, rectangle, trapezoid, or other. Generally, openings 156, 424, and 1208 will have a similar shape and openings closer to the camera lens will be smaller than those further away. Generally, a cross-sectional area of a closed-polygon opening 156 will be less than a cross-sectional area of a closed-polygon opening 1208, which will be less than a cross-sectional area of a closed-polygon opening 424.

For a circular camera opening, in a specific embodiment, the inside diameter of camera opening 156 is approximately 6 millimeters, the diameter of camera opening 1208 is approximately 11-12 millimeters, and the diameter of camera opening 424 is approximately 12.2 millimeters. In other implementations, the diameters of the openings can have any desired size or shape. For example, opening 156 can range from about 2 millimeters to about 12 millimeters. Opening 1208 can range from about 4 millimeters to about 24 millimeters. Opening 424 can range from about 5 millimeters to about 25 millimeters. A ratio of opening 1208 to opening 156 is from about 1.7:1 to about 2.25:1. Generally, the openings are larger than the camera lens and sufficiently large so that the case does not appear in photographs.

Figure 24:
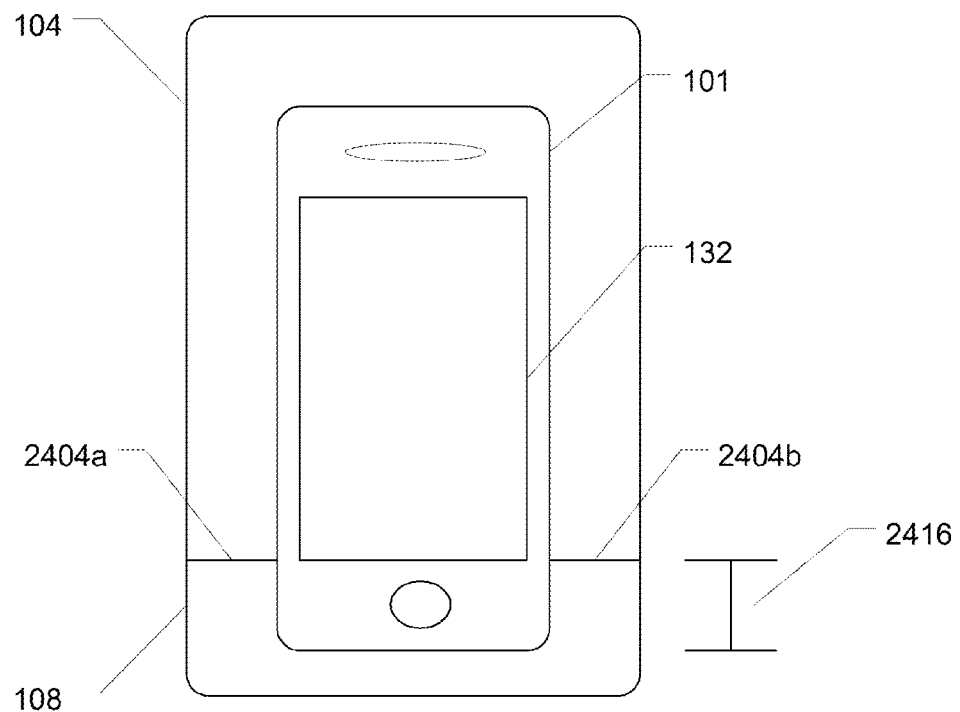
FIG. 24 shows a diagram of the front of the assembled case with a portable electronic device in the case. There is a seam line where the upper and lower case portions meet.

FIG. 24 shows the front of a case with an electronic device in the case. As described above, the upper case portion slides over the lower case portion. Where the upper and lower case portions meet, there are seam lines 2404a and 2404b in the front of the case (see also FIG. 3). The seam line (from 2404a to 2404b) runs around the entire case (e.g., across the back of the case). FIG. 4 shows the seam line for the back, and FIGS. 5 and 6 show the seam lines for the sides. At the seam, the surfaces of the lower and upper case portions are relatively flush with each other. The seam line remains visible and can be felt tactilely.

The seam line for the case is positioned to ensure the upper and lower case portions are securely attached to each other. In a specific implementation, seam lines 2404a and 2404b are positioned so that they align with a bottom edge of screen 132 of the phone. As shown in FIG. 24, with the phone in the case, the bottom edge of touch screen 132 is in-line with lines 2404a and 2404b. In other implementations, the seam lines can be at other positions. For example, the seam line can be aligned with an upper edge of screen 132, or anywhere between the upper and lower edges of the screen.

The upper case portion securely engages (e.g., by overlapping) to the phone and lower case portion, so the upper case portion will not inadvertently slide off or otherwise detach. Also, in an implementation, when the user grips the phone in a portrait orientation, part of the hand (e.g., thumb and forefinger) is holding onto the upper case portion, while the palm of the hand is pushing against the lower case portion (urging the lower case portion toward the upper case portion).

Further, aligning seam lines 2404a and 2404b with the bottom edge of the touch screen provides for a symmetrical arrangement and appearance of the visual elements of the phone and case. This enhances the smartphone experience for the user, allowing the user to easily locate the display both visually and tactilely (because the user can feel for the seam).

In an implementation, for the front of the case (see FIG. 3), the seam line is at about 30 millimeters from a bottom edge of the case. A case length is about 130 millimeters. This seam line divides the case at about 0.23 of the whole. In other implementations, the seam line can be at other positions (e.g., ranging from about 15 millimeters to about 50 millimeters) and have other ratios (e.g., ranging from 0.10 to 0.50 of the whole).

In an implementation, for the back of the case (see FIG. 4), the seam line is at about 35 millimeters from a bottom edge of the case. A case length is about 130 millimeters. This seam line divides the case at about 0.27 of the whole. In other implementations, the seam line can be at other positions (e.g., ranging from about 15 millimeters to about 50 millimeters) and have other ratios (e.g., ranging from 0.10 to 0.50 of the whole).

In a specific implementation, seam lines 2404a and 2404b in the front of the case are about X of a length of the joined case, and a seam line for the back of the case is about Y of a length of the joined case. X and Y are numbers and Y is greater than X.

The seam line for the front and back differ because the seam line is angled on the sides of the case (see FIGS. 5 and 6). In other implementations, the seam line can be angled even more on the sides so that a difference between the ratios in the front and back is greater. The seam line can be angled less on the sides so that a difference between the ratios in the front and back is less or 0, or the ratio is larger in front and less in back.

Further, a distance 2416 between a bottom edge of front opening 204 and the seam line is about 16 millimeters. A length of front opening 204 is about 109.5 millimeters. Therefore, the seam line divides the front opening at about 0.146 of the whole. In other implementations, distance 2416 can vary, depending on for example the screen size, in a range from about 8 millimeters to about 32 millimeters. The seam line will divide the opening in a range, for example, from about 0.10 to about 0.50 of the whole.

Figure 25:
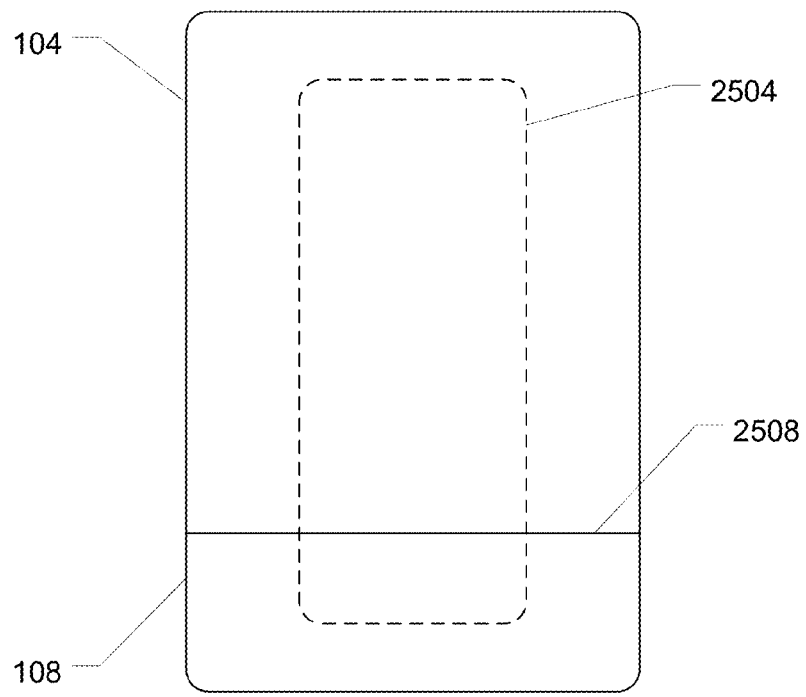
FIG. 25 shows a back view of the assembled case where a region of the back surface is relatively flat.

FIG. 25 shows a back view of the assembled case where a region of the back surface, indicated by box 2504, is relatively flat. The flat portion of the back surface ensures the electronic device and case will be stable (e.g., not rock back and forth) when the case is placed on its back on a table. See also FIGS. 5-8 which show various views of the case's flat back surface. Even if the electronic device does not have a flat back, the flat portion of the case ensures the electronic device will be stable when placed on a table.

As shown in the figure, both the upper and lower case portions have sections which are flat. Where the upper and lower case portions meet, a seam line 2508 divides the upper and lower case portions. As shown, the flat case section of the lower case portion is smaller in terms of area than the flat section of the upper case portion. The seam where the upper and lower case portions meet is flush, so the seam does not cause the case to be unstable.

The flat back surface ensures stability when the case is placed on its back, regardless of how the back of the phone is shaped. This feature creates a steady and stable surface and ensures that the electronic device will not slide or wobble as a result of being placed, for instance, on a table. For example, an electronic device may be curved in all directions (e.g., no flat surfaces at all) or have a design where the back will not be stable when placed on a table. The design may have notches, indentations, or other structures (possibly ornamental) that cause the phone to not lie stably on its back. Despite this, when the phone is in the case, because of the flat back, the case will rest securely on its back.

As shown in FIG. 25, rectangular flat surface 2504 is centered in back of the assembled case. That is, the distance surrounding the flat back surface is equal at opposite sides. In other implementations, however, the flat back surface may be located anywhere on the back of the case portions. Further, the flat back surface may be of any size, any shape, any combination of sizes, or any combination of shapes. For example, the flat back surface may have a circular or oval shape. The flat region may be rectangular with rounded corners.

The flat back surface is typically sufficiently sized to make the case stable when placed on its back. In an implementation, the size of the flat back surface can vary and the proportion of the area (2504) that is flat to the area that is not flat (case back outside box 2504) can vary. In another implementation, the flat back surface area is larger than the electronic device the case is holding. The flat back surface area can be larger than a flat back surface area provided by the electronic device itself.

In a specific implementation, dimensions for flat surface section 2504 are about 100 millimeters by about 40 millimeters. Dimensions for the case are about 130 millimeters by about 66.2 millimeters. The area ratio between the flat surface section 2504 and the total case dimensions is about 0.465 (i.e., 4000 square millimeters/8606 square millimeters). However, in other implementations, the ratio can be in the range from about 0.333 to about 0.6.

For the centered square section, a distance between a bottom edge of the lower case portion and a bottom edge of the flat back surface is about 13 millimeters. Likewise, a distance between a top edge of the upper case portion and a top edge of the flat back surface is about 13 millimeters. Further, a distance between a left edge of the assembled case and a left edge of the flat back surface is about 15 millimeters. Likewise, a distance between a right edge of the assembled case and a right edge of the flat back surface is about 15 millimeters.

Figure 26:
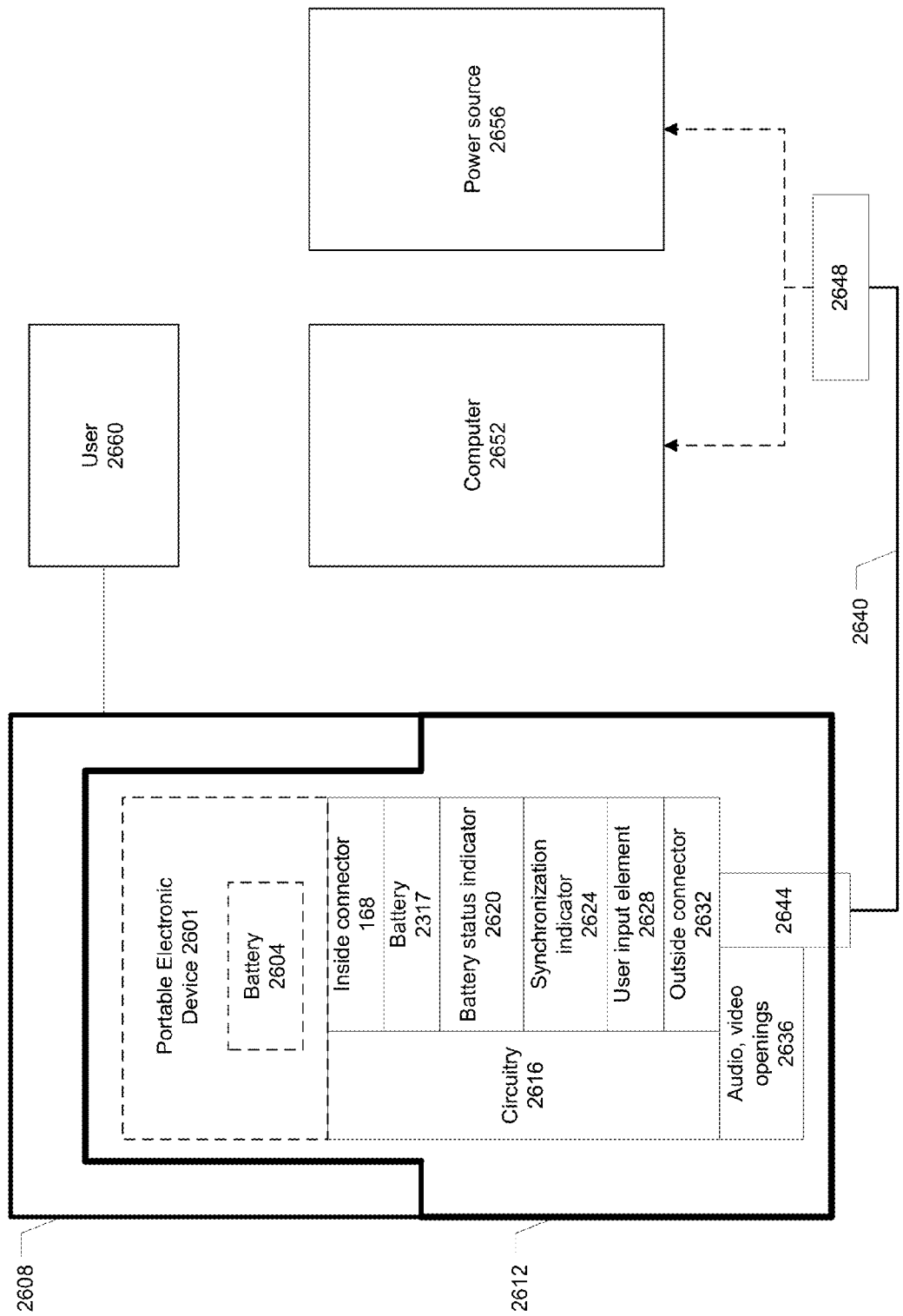
FIG. 26 shows a functional block diagram of the portable electronic device case with a battery that extends the battery life of the portable electronic device.

FIG. 26 shows a functional block diagram of a case for holding a portable electronic device 2601 having a battery 2604. As discussed above, the case has an upper case portion 2608 and a lower case portion 2612. The electronic device is inserted into the lower case portion and is connected to inner connector 168, and the upper case portion slides over the electronic device and a portion of the lower case portion.

The lower case portion includes a circuitry 2616 which is connected to inner connector 168, a case battery 2317, a battery status indicator 2620, a synchronization indicator 2624, a user input element 2628, an outer connector 2632, and audio-video (AV) openings 2636. A cable 2640 having connectors 2644 and 2648 may be used to connect the case to a computer 2652, a power source 2656, or both.

As a specific example, this application discusses the portable electronic device as being a smartphone. However, as already discussed above, it should be understood that this is merely for discussion, and that the portable electronic device can be any device type and may be a device other than a telephony device.

In addition to making and receiving telephone calls, many modern smartphones and other portable electronic devices include a multitude of other features. These features include data storage, music playing, picture taking, video recording, and games. Further, these devices include vivid color displays, cameras, speakers, speakerphone, nonvolatile storage, touchscreens, and others. Such features use power. And the more such features are used, the shorter the battery life.

Many users depend on their smartphones to coordinate their schedules, check and read e-mail, send e-mail, browse Web pages, talk to their loved ones and family (e.g., calling mom on Mother's Day), talk to business associates, record video, upload a video onto a social networking Web site, map their locations, navigate using GPS and voice guidance of the phone, edit documents, and much more. Therefore, it is important that a smartphone has sufficient power capacity to last through the day until the smartphone can be recharged.

While smartphone capabilities have increased dramatically in recent years, batteries have not kept pace. Furthermore, since smartphones are used for so many different things, it can be catastrophic if the smartphone runs out of power. Compounding the problem is that many of today's smartphones have integrated or proprietary batteries that cannot be easily replaced. Moreover, even if the batteries are designed to be replaced by the user, it is cumbersome to carry around extra batteries.

The case, with its built-in battery (i.e., battery 2317), alleviates this problem by providing additional power to the phone. Various implementations of the case double, triple, or quadruple the battery life of the phone or the amount of time that the user can use the phone.

The case has numerous modes of operation. FIGS. 27 and 28 show tables listing the various modes. For the case to provide extended battery life, the user charges the case battery. To do so, the user connects a power source via a cable (e.g., USB cable) to the case's outer connector (e.g., mini-B USB connector). Upon connecting the cable, the case will be in a power-up mode (described in FIG. 27) during which at least one of the indicator lights (e.g., LEDs) of the case lights momentarily. To enter this mode, the phone does not need to be in the case; but if the phone is in the case, the user will be able to use the phone normally. This may be referred to as a normal operating mode for the phone.

When entering the power-up mode, the indicator lights turn on in order to indicate to the user that the case has been powered up. Power-up may be indicated to the user using any visual (or audible) indication. In a specific implementation, for example, one of the LEDs turns on for a short time and then turns off. In another implementation, each of the LEDs may turn on and off in sequence. In another implementation, at least one LED turns on and stays on while the case is connected to a charging source. In this implementation, the number of lights turned on is proportional to the battery life and the number of lights increases as the battery life increases.

Figure 29:
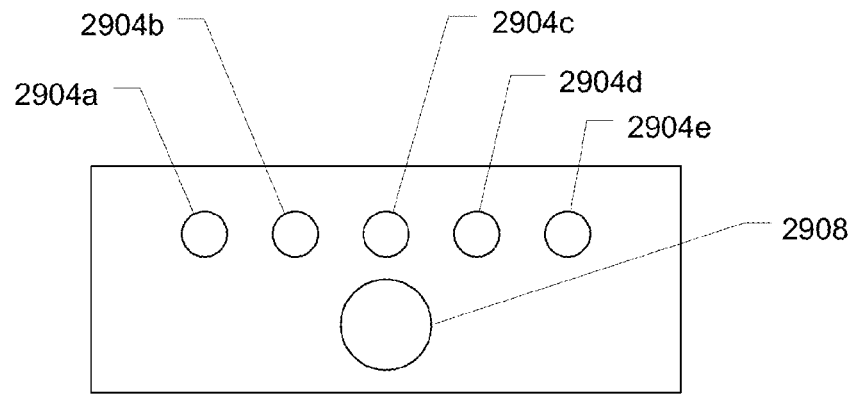
FIG. 29 shows an arrangement of indicator lights and a case button below the indicator lights.

FIG. 29 shows a specific arrangement of indicator lights 2904a-e (e.g., LEDs, laser diodes, light bulbs, neon bulbs, or other lighting) for the case, where a case button 2908 is centered below the indicator lights. In this specific arrangement, a line extending between indicator light 2904a and 2904b does not pass through case button 2908. In a specific implementation, the indicator lights are positioned horizontally on the back of the lower case portion and a line segment extends from indicator lights 2904a-e. The case button is positioned transverse to the line segment and equidistance to ends of the line segment.

The indicator lights and case button have a circular shape. In an implementation, the indicator light cover and case button are flush with the case surface. Generally, the case button is located near the indictor lights. However, in other implementations, the case button can have any shape (e.g., square, rectangle, triangle, and oval) and may be located anywhere on the case. There can be any number of case buttons (e.g., one, two, three, or four or more).

Further, although the indicator lights are positioned horizontally on the back of the lower case portion (see FIGS. 4 and 12), in other implementations the indicator lights can be in a different location or be arranged differently (e.g., off-center or vertically arranged). Also, there may be any number of lights (e.g., 0, 1, 2, 3, 4, 5, 6, 7, or more than 8) and the openings for the indicator lights may have any shape (e.g., circle, square, rectangle, or triangle).

Figure 30:
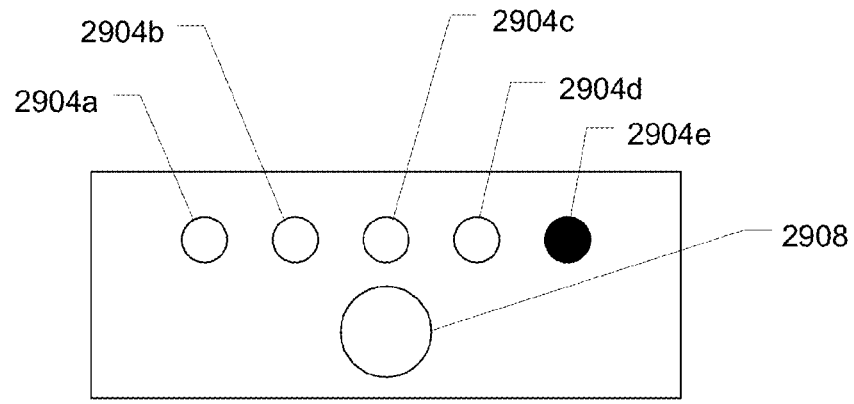

In a specific implementation of the power-up mode, as shown in FIG. 30, the right-most indicator light (2904e) turns on momentarily and then turns off (e.g., flashes or blinks) to indicate that the case is connected to a power source.

The power source may be a power socket, power receptacle, or power outlet in the user's home or office. As another example, the cable may be connected to a cigarette lighter socket in the user's car or boat. This allows, for example, the user to charge the case battery while driving. The cable can be connected to a computer's USB port or any other power source.

From the power-up mode, the case can enter the charge case battery mode. FIG. 27 describes the charge case battery mode. Power from the cable connected to the case outer connector will charge the case battery. Circuitry (described below) in the case will control charging of the battery until it is fully charged.

While in the charge case battery mode, the user can press the case button and determine the battery life remaining in the case battery by reading the fuel gauge. Upon pressing the case button, the case will be in a fuel gauge mode as described in FIG. 27. If the case battery is charged, an appropriate number of indicator lights will light to indicate a charge level of the case battery. To enter this mode, the phone does not need to be in the case; but if the phone is in the case, the phone will be in normal operating mode.

While in fuel gauge mode, the case battery life may be indicated to the user using any visual (or audible) indication.

In a specific implementation, the indicator lights turn on from left to right and each indicator light that turns on indicates an additional level of charge for the case battery. In this specific implementation, the number of LEDs lighting up is proportional to the case battery life. In another specific implementation, the indicator lights turn on from right to left and each indicator light that turns on indicates an additional level of charge for the case battery.

In a specific implementation, the lighting indicators emit a blue or bluish light (e.g., blue LED). However, in other implementations, the lighting indicators can emit any color or wavelength of light as desired. For example, the color can be red, green, yellow, white, or purple, or any combination of these. Also, two different indicator lights of the same case can emit two different colors. The color of the light may be a result of the LED color itself or a cover over the LED light (e.g., white LED light is covered by a bluish lighting cover).

Figure 31:
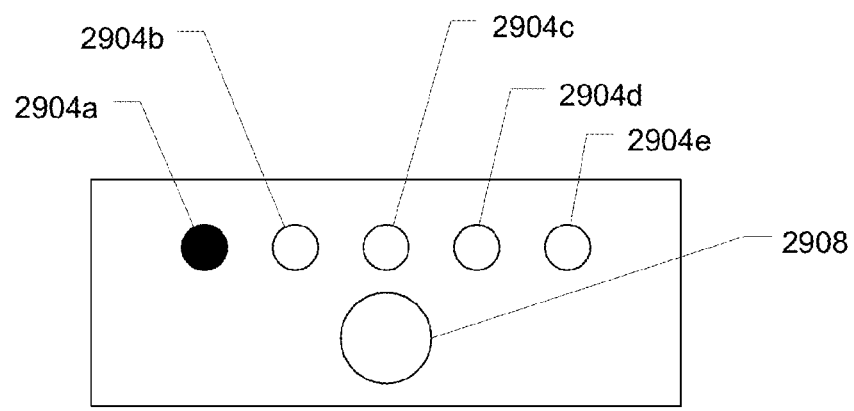

FIG. 29 shows a specific implementation where no indicator lights turn on, indicating the case battery is discharged or has a very low level of charge. FIG. 31 shows the leftmost indicator light (2904a) turning on, indicating that the case has a minimal charge. More indicator lights turn on in FIG. 31 than in FIG. 29, indicating that the case battery in FIG. 31 has a higher level of charge than the case battery in FIG. 29.

Figure 32:
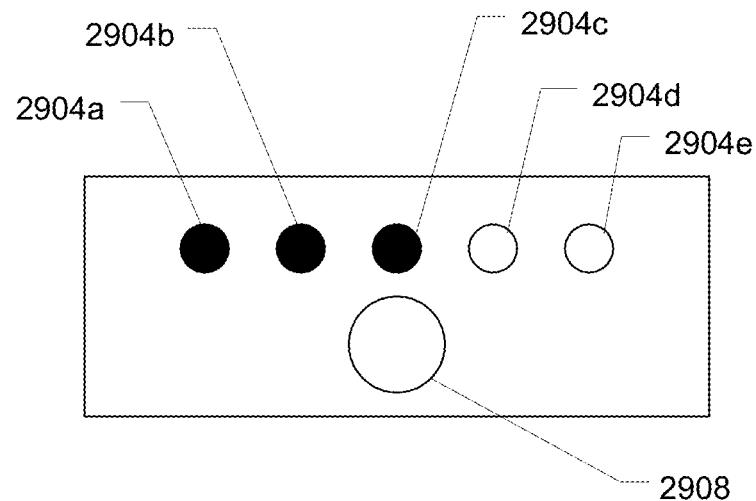
Figure 33:
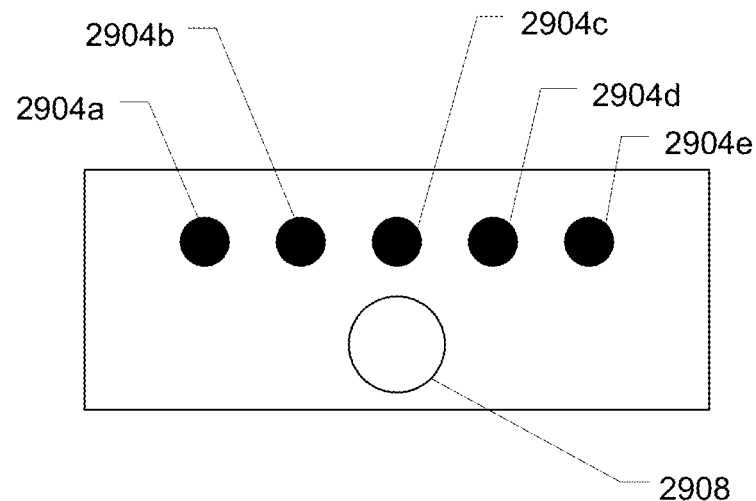

FIG. 32 shows three indicator lights (2904a-c) turning on to indicate an approximately half-charged battery. A greater number of lights turn on in FIG. 32 than in FIGS. 29 and 31, indicating that the case battery in FIG. 32 has a higher level of charge than the case battery in FIGS. 29 and 31. FIG. 33 shows a specific implementation of five indicator lights (2904a-e) turning on to indicate a fully charged battery. A greater number of indicator lights turn on in FIG. 33 than in FIG. 32, indicating that the case battery in FIG. 33 has a higher level of charge (e.g., more juice) than the case battery in FIG. 32.

While charging the case battery in the charge case battery mode, the phone does not need to be in the case. If the phone is in the case, the case will also be in the charge phone battery mode listed in FIG. 27. When the phone battery becomes discharged, the case battery will, via inner connector 168, charge and top off the phone's battery as needed. The case will continue to charge the phone battery as needed until the case battery becomes completely discharged.

If the outer connector is not connected to power, the case can be in the charge phone battery mode as long as there is charge in the case battery, but the case will no longer be in the charge case battery mode.

When the user connects a power source via a cable (e.g., USB cable) to the case's outer connector, the case will be placed in charge phone battery mode. The case will continue to charge and top off the phone battery as needed. Also see discussion regarding sleep mode below.

The phone may indicate to the user that the phone is charging. In a specific implementation, the phone's screen displays an icon (e.g., lightning bolt) to indicate that the phone is charging. When the phone becomes fully charged, the phone's screen informs the user (e.g., icon changes from a lightning bolt to a plug symbol).

As discussed, the case also has a battery gauge such as shown in FIG. 29. While in the charge phone battery mode, the user can press the case button and determine the case battery life remaining by reading the fuel gauge. Upon pressing the case button, the case will simultaneously be in the fuel gauge mode. The fuel gauge mode is described in FIG. 27 and above.

If the case is not connected to a power source and the case battery is at a charge level below a certain threshold (i.e., a sleep mode level of charge), the case will enter a sleep mode. For example, when the case battery is completely discharged, the case will be in sleep mode.

The sleep mode is described in FIG. 27. While in the sleep mode, the case becomes inactive (e.g., the case button and case indicator lights are not functional) and the user will be unable to get a battery reading. The sleep mode will not affect the phone. The phone will be in normal operating mode as long as the phone has sufficient charge. The case will not draw any power from the phone.

In an implementation of the sleep mode, the user connects power to the outer connector of the case in order to charge the case battery. The case battery will be charged for some amount of time before charging of the phone battery begins. For example, this amount of time may be about five minutes, but the exact amount of time (e.g., two, three, six, or more minutes) will depend on a number of factors including the charging current and the level of charge remaining in the battery. The amount of time will vary depending on how long it will take for the case battery to be charged to a level above the sleep mode level of charge.

When the case battery has been charged above the sleep mode level of charge, the case exits sleep mode and enters power-up mode. The case battery will be used to charge the phone battery, as needed. The case button and case indicator lights will work. When the user presses the case button, the user will get a battery reading from the fuel gauge.

Note that if the phone battery is completely discharged, similar to the situation with the sleep mode discussed in this implementation, the phone battery may need to be charged to some level before becoming active and operate normally. For example, this amount of time may be about five minutes, but will vary depending on the charging current and level of charge of the phone battery.

In another implementation of the sleep mode, when the user connects a power source via a cable (e.g., USB cable) to the case's outer connector, the case will immediately charge the phone battery and the case battery. Both the phone and case batteries will be charged in parallel. The power from the USB cable is used to charge the phone battery even if the case battery does not have a minimum level of charge.

In an implementation, the case has an extended sleep mode, which is not the same as the sleep mode described above. The extended sleep mode is described in FIG. 28. The case enters the extended sleep mode when no phone is connected to the case and power is not connected to the outside connector of the case. When in the extended sleep mode, circuitry of the case will use less power so the case will retain its battery power for relatively longer periods of time. For example, for the extended sleep mode, some inactive circuits or portions of the circuit will be turned off so they do not draw power.

The extended sleep mode extends the case battery life. In a specific implementation, the case will retain charge seven weeks or more (when starting with a fully charged case battery). However, in various implementations, the battery life during extended sleep mode can vary and may be one week, ten days, two weeks, three weeks, six weeks, less than one week, or more than seven weeks.

When the case is in the extended sleep mode, the user can exit the extended sleep mode by any one of three ways. An implementation of a case of the invention can have any one of or a combination of the following three ways to exit the extended sleep mode.

1. Connecting a phone to the case. Then, the case will return to the charge phone battery mode.

2. Pressing the case button. Then the case will go to the fuel gauge mode, and the case will display the status of the case battery. After a period of time after the button press, the case can reenter the extended sleep mode.

3. Connecting the case via the cable to a power source. Then the case will go to the charge case battery mode.

To charge the phone battery, the user will insert the phone into the case. When the phone is initially inserted into the case and the case battery and phone battery are charged, the case enters initial phone connect mode (described in FIG. 28) during which the circuitry in the case authenticates with the phone.

In a specific embodiment, the case circuitry includes an authentication chip which allows the case to communicate with the phone. If the case does not have this authentication chip, the case is not authenticated.

In another specific embodiment, the case circuitry implements a handshaking protocol by sending a self-identification signal to the phone. If the phone recognizes the signal, the phone can accept the signal and authenticate the case. If the phone does not recognize the signal, the case is not authenticated.

In another embodiment, the authentication process uses certificates, which get exchanged with the electronic device and opens up communication channels once these certificates have been exchanged and authenticated.

Upon putting the phone in the case, if the case authenticates with the phone, the phone will display its normal screen and no warning messages regarding the case will appear on the phone screen.

In a specific implementation, if the phone does not authenticate the case, it cannot be presented as a valid accessory and the phone screen displays a warning message. This warning message may be referred to as a "nag message," informing the user that the case is not a valid accessory or has not been approved by the manufacturer of the phone. In a specific implementation, the warning message is "This accessory is not designed for this phone. This accessory might cause interference, do you wish to enable airplane mode?" and will appear on the phone's screen.

In some embodiments, regardless of the authentication results, after the warning message is displayed, the phone will enter a normal operating mode and the user can continue using the phone normally. The case battery will provide extended battery life for the phone.

While the phone is in the case (e.g., in the charge phone battery mode), the user can synchronize the phone with a second electronic device. To do so, the user pushes and holds the case button for about three seconds. The case will enter a synchronization or sync mode described in FIG. 28. The period of time for which the user holds the case button for to enter the sync mode can be set to any value, such as in a range from two to fifteen seconds; the longer the time period, the less likely the user can accidentally enter the sync mode.

In a specific implementation, the second electronic device is a computer. While in the sync mode, the case is ready for the phone to synchronize with the computer. If the case is connected to a computer via the cable (e.g., USB cable), the user can synchronize data between the phone and the computer, send data from the phone to the computer, send data from the computer to the phone, or any combination of these. Synchronization includes synchronizing calendar information, contact information (e.g., names, addresses, phone numbers), music files, video files, and e-mail between the phone and the computer.

While the case is in the sync mode, the phone is also in a sync mode when the phone is ready to transfer or receive data from the computer. In a specific embodiment, the user can determine the status of the phone by looking at its screen. In a specific implementation, to indicate the phone is in the sync mode, the phone's screen may display a sync status symbol or a not charging symbol, or both.

In another implementation, the second electronic device may be an electronic device (e.g., mobile phone, PDA, smartphone, pager, audio player, media player, portable media player, game console, server), software (e.g., iTunes or Windows Media Player), or a service (e.g., iTunes Store, Urge, or Rhapsody).

The case does not need to be connected to a computer to enter the sync mode. If the user connects the case via the cable to a computer within about 30 seconds, then the user will be able to synchronize the phone with the computer. If the user does not connect the cable to a computer within 30 seconds, however, the case will automatically exit the sync mode (e.g., returning to the charge phone battery mode). An automatic time out of 30 seconds for the synchronization mode is provided as an example, and the time out value can vary from about 3 seconds to about 3 minutes. For example, the time out value can be 15, 40, 50, 60, 180, or 360 seconds.

In a specific implementation, upon entering the sync mode, the case exits other modes. For example, if the case is in the charge case battery mode, the case will exit this mode upon entering the sync mode and the case battery will stop charging. Similarly, if the case is in the charge phone battery mode, the case will exit this mode upon entering the sync mode and the case will stop charging the phone battery.

The sync mode may be indicated to the user using any visual (or audible) indication. A synchronization indicator indicates to the user that the phone is ready to be synchronized with the computer. The synchronization indicator may also indicate when the phone is not ready to be synchronized, whether or not the synchronization is complete, whether or not there was an error in synchronization, and so forth.

Synchronization can be indicated via the indicator lights. For example, a lighting of an LED will indicate to the user that the case is in the sync mode. In a specific embodiment, for example, one of the LEDs blinks continuously. In other embodiments, a different number of LEDs blink continuously or a number of LEDs blink twice and turn off. In a specific embodiment of the sync mode, as shown in FIG. 30, LED 2904e will blink continuously to indicate to the user that the phone is ready to synchronize with another device.

The case may be unable to enter the sync mode under certain circumstances. For example, when the case is in the sleep mode, the case button and indicator lights do not work. The phone cannot synchronize with another electronic device because the case requires a minimal amount of power for its electronic board to support the synching mechanism. So, if the user pushes and holds the case button for three seconds, this will have no effect on the case and the case will not enter the sync mode.

When the case is in the sync mode, the user can exit the sync mode (described in FIG. 28) by any one of three ways. An implementation of a case of the invention can have any one of or a combination of the following three ways to exit the sync mode.

1. Not connecting the case via the cable to the computer within thirty seconds (or other time out value). After thirty seconds elapses, the case will return to the charge phone battery mode.

2. Disconnecting the cable from the case or the computer. Since the case is no longer connected to the computer, the phone can no longer synchronize with the computer. The case will return to the charge phone battery mode.

3. Pressing the case button. Then the case will go to the fuel gauge mode, and the case will display the status of the case battery. Then, the case will return to the charge phone battery mode.

In a specific implementation, for example, the user can only exit the sync mode using the first two options and not the third option. So, once the case is in the sync mode, the user cannot exit the sync mode by pressing the case button. This prevents the user from inadvertently exiting the sync mode by intentionally or unintentionally pressing the case button.

When the case exits the sync mode, the indicator lights will turn off (or turn on) to indicate that the case is no longer in the sync mode. For example, when indicator light 2904e blinks continuously to indicate the sync mode, this indicator light turns off to indicate the case is no longer in the sync mode.

When the case exits the sync mode, the phone will also exit the sync mode and no longer transfer data to and from the computer. Upon exiting the sync mode, the phone will enter the normal operating mode and the user can use the phone normally (e.g., make a phone call to Claudia Schiffer, send a text message to Beyonce, play a Nena song, play computer baseball with Tim Lincecum, or call Jenny at 867-5309).

Referring back to FIG. 26, the case battery is typically a rechargeable type. In a specific embodiment, the case battery is a rechargeable lithium-ion polymer battery. This battery can be charged, used, and recharged many times (e.g., about 500 times). Other rechargeable battery types may be used. For example, some other rechargeable type batteries include nickel cadmium (NiCd), nickel metal hydride (NiMH), lithium ion, lithium polymer, lead acid, and other rechargeable battery chemistries.

In an implementation, the case battery is integrated with the case and the battery is not replaceable by the user. One benefit of this design is that it allows for a smaller and more compact case as compared to a case with a replaceable battery because there is no additional interface (e.g., battery cover) that interferes with the profile of the case.

In another implementation, the battery is replaceable by the user. For example, the battery may be a rechargeable type such that after the battery has been drained and recharged after a threshold number of cycles, the battery is replaceable by the user. As another example, the battery may be a disposable battery (e.g., N, AA, AAA, or C cell battery) such that after the battery is drained, the user removes the drained battery from the case, and installs a new battery.

The user input element (e.g., case button) allows a user to communicate with the case. In a specific embodiment, the user input element is a button that the user can push. Pushing the button displays the battery status indicator, the synchronization indicator, or both. In a specific embodiment, at least one LED functions as a battery status indicator and as a synchronization indicator. In this specific embodiment, pushing the button for a first threshold time period lights a first LED in a first mode. In the first mode, the LED is solid and indicates a battery status. Pushing the button for a second threshold time period (e.g., 2, 3, 4, 5, 6, 7, or 8 seconds), greater than the first threshold time period, lights the first LED in a second mode, different from the first mode. In the second mode, the LED is blinking and indicates a synchronization status.

The modes associated with a pattern may vary. For example, to indicate a battery status, an LED may blink twice or all the LEDs may flash one after the other from left to right. Also, a blinking LED in a first pattern may indicate that the phone is ready to be synchronized. A blinking LED in a second pattern, different from the first pattern, may indicate that synchronization is complete.

Further, the blinks may be in any pattern. Some examples of patterns include a long blink, followed by a short blink; two long blinks followed by three short blinks; one short blink, followed by two long blinks. In a specific implementation, all the LEDs blink twice to indicate there is a problem with recharging the battery.

It should be appreciated that there may be any number of user input elements or buttons. It should also be appreciated that the user input elements may not necessarily be a button. For example, the user input element may be a microphone to accept a voice command from the user. As another example, the user input element may be a touch screen or a sliding switch that the user slides back and forth.

The audio-video (A/V) openings include one or more holes or openings in the lower case portion, the upper case portion, or both. These openings direct audio information, video information, or both from the phone to the user. These openings also allow the phone to receive audio information, video information, or both.

The cable may be any type of cable having any number of wires that can electronically connect the case to the computer or power source. In a specific embodiment, the cable is a USB cable (e.g., USB 2.0 cable) where connector 2644 is a USB mini-A plug (or male connector) and connector 2648 is a USB type-B plug (or male connector). The cable allows battery 2317, battery 2604, or both to be charged by the computer, power source, or both. The cable also allows the portable electronic device and the computer (or other device) to be synchronized.

In another embodiment, connector 2648 is plugged into an automotive cigarette lighter plug (e.g., 12 volt automotive lighter plug, 6 volt automotive lighter plug), a type A flat blade electrical plug, or a type B flat blade with round grounding pin plug. However, different parts of the world use different types of electrical plugs. For example, a type C plug is common in Europe. The U.S. Department of Commerce, International Trade Administration publication *Electric Current Abroad*, 1998 edition, reprinted 2002, which is incorporated by reference, describes different types of electrical plugs used in different parts of the world, which are suitable for use as connector 2648 of the present invention.

The length of the cable ranges from about 0.3 meters to about 5 meters. The cable may also be less than 0.3 meters or more than 4.9 meters. The variations in cable length reflect the many different preferences that users may have. For example, some users may desire a longer cable so that they can place the case further away from the second electronic device. Other users may desire a shorter cable to lessen the likelihood that the cable will become tangled.

The cable, however, is optional and is not included in some implementations of the invention. In this specific embodiment, the outer connector includes wireless capabilities. For example, the outer connector may be a wireless transceiver, a wireless receiver, or a wireless transmitter. This allows the case and computer or power source to communicate wirelessly. Such wireless communication may be accomplished using any wireless technology (e.g., infrared, Wi-Fi, Bluetooth, radio frequency, microwave, 802.11, 802.11a, 802.11b, 802.11g, 802.11-2007, and 802.11n, or wireless USB). Such wireless features may also allow batteries 2317, 2604, or both to be wirelessly charged (e.g., resonance charging).

Figure 34:
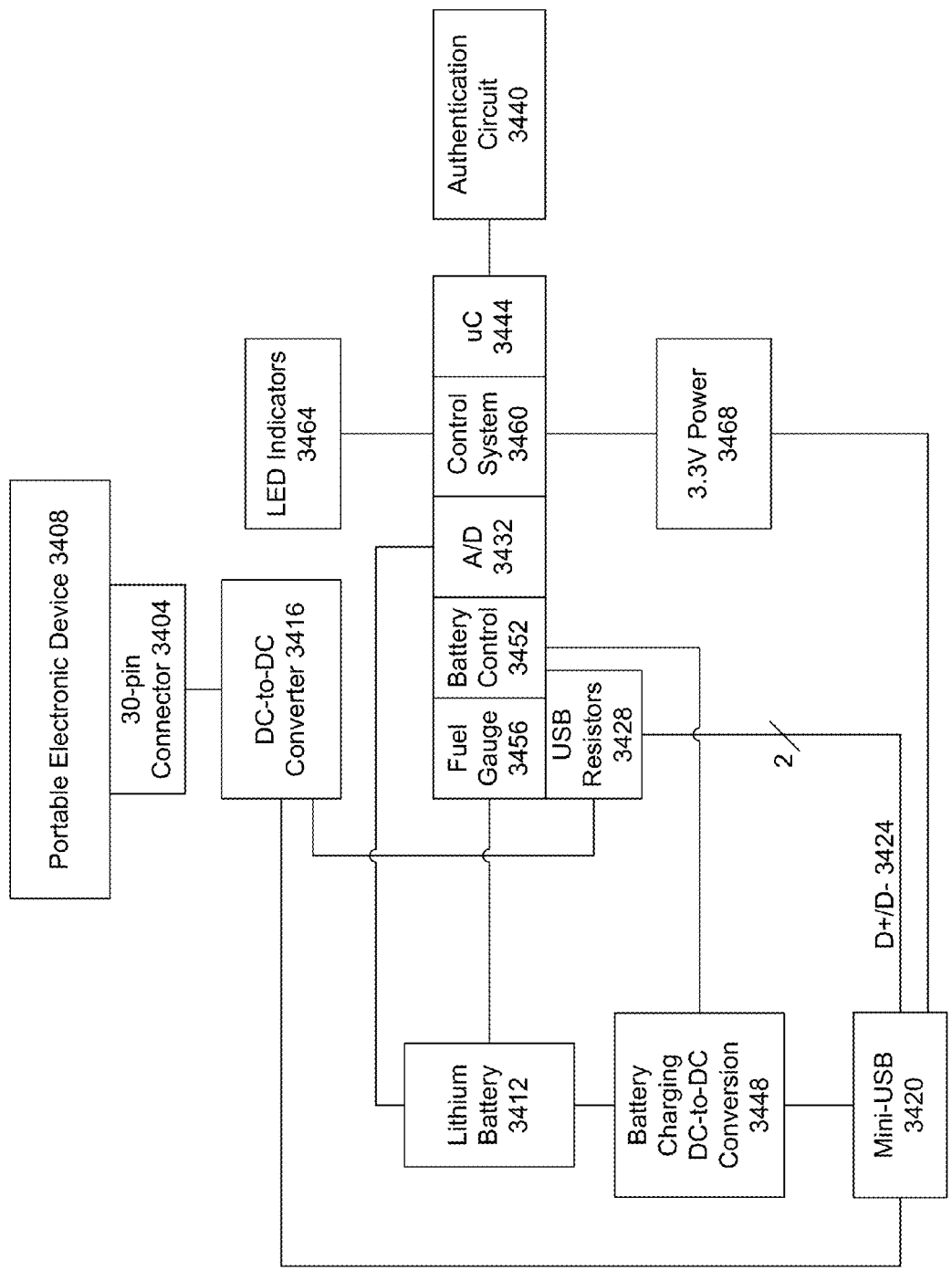
FIG. 34 shows a circuit block diagram for electronic circuitry of the portable electronic device case.

FIG. 34 shows a circuit block diagram for the case. This diagram shows more details of circuitry 2616 and components of lower case portion 2612. The circuit blocks in this figure implement the functionality and modes of the case described above.

The case has a connector 3404 for connecting to a portable electronic device 3408 which the case is designed for. In a specific implementation, the portable electronic device is a smartphone having a 30-pin connector. So, the case has a corresponding 30-pin inner connector that fits into the phone's connector. For example, the case includes a male inner connector that fits into the phone's female connector. In other implementations, however, the case's inner connector can have any number or combination of pins and shapes in order to interface with the portable electronic device that the case is designed for.

Through connector 3404, the case circuitry interfaces with the phone, such as for charging the phone's battery and synchronizing. To charge the phone battery, power from a lithium battery 3412 is passed through a DC-to-DC converter block 3416 and connector 3404 to the phone. To synchronize data, input-output (I/O) via a mini-USB connector 3420 is passed through wires 3424 (i.e., differential D+ and D− signals) through USB resistors 3428, converter 3416, connector 3404 to the phone.

An implementation of the case uses a mini-USB connector (e.g., USB mini-B). However other connectors may be used such as USB type A, type B, mini-A, micro-AB, or micro-B. Also, other types of connectors such as FireWire (i.e., an IEEE 1394 interface, i.LINK, or Lynx), eSATA, or a proprietary connector may be used instead or in addition.

Through an analog-to-digital (A/D) converter circuit 3432, analog data can be converted to digital data for the phone. Digital data from the phone can be converted into analog form for further processing, or vice versa. For example, A/D converter circuit 3432 is connected to battery 3412 and is used to collect analog measurement information (e.g., voltage level) about the battery. This information is converted to digital form by the A/D converter and used in the fuel gauge algorithms (see discussion on fuel gauge mode above) to determine and indicate the charge level of the battery.

In a specific implementation, when an electronic device is connected to the case, the electronic device looks for an authentication or handshaking signal (e.g., sending of an authentication code). If the device does not receive the proper authentication, the device may display a message (e.g., nag message) that the case is not an authorized peripheral for the device or the device can simply not allow the case circuitry to interface with the phone (e.g., not allow charging or synchronization).

An authentication circuit 3440 can be included in the circuitry to provide proper authentication to the electronic device. This authentication circuit can connect to the other circuitry of the case through a microcontroller (uC) 3444 interface. In a specific implementation, microcontroller 3444 is the ATMega32 from Atmel.

When the authentication circuit is present, the user, for example, will not see a nag message on the phone. In an implementation, when the authentication circuit is not present, the user will see a nag message, but afterwards, the case will still function (e.g., provide the functionality described in the tables in FIGS. 27 and 28) with the device.

The case has lithium-ion polymer battery 3412 to provide extra charge and capacity for the phone. See above discussion for more detail on the functionality. In an implementation, case battery 3412 has a nominal capacity of 1390 milliamp-hours. The capacity can range from about 1330 milliamp-hours to about 1490 milliamp-hours. In comparison, the electronic device's battery capacity is approximately 1150 milliamp-hours. So, with the addition of case battery 3412, the device's battery life will approximately double.

In a specific implementation, the case battery has a length of about 74 millimeters, a width of about 41 millimeters, and a thickness of about 4.2 millimeters (after swelling). A weight of the battery is about 28 grams. A discharging operating temperature for the battery is about −20 degrees Celsius to about 60 degrees Celsius. The battery can be recharged using a standard charging current (665 milliamps at 4.2 volts) in about 2.5 hours or a rapid charging current (1330 milliamps at 4.2 volts) in about 1.5 hours. The battery provides an output voltage of about 3.7 volts.

The case includes circuitry for charging case battery 3412. Power is supplied through USB connector 3420 to a battery charging circuit 3448, which is connected to the battery. The battery charging circuit supplies the voltages and currents to the battery for charging, and can detect when the battery is fully charged (at which point circuit 3448 stops charging the battery). The charging circuit can also include a DC-to-DC converter to convert the voltage received at the USB connector (e.g., 5 volts) to the voltage used to charge the battery (e.g., 4.2 volts). Battery charging circuit 3448 may be implemented using an integrated circuit manufactured, for example, by Linear Technology Corporation, Maxim Integrated Products, Incorporated, or National Semiconductor Corporation.

A battery control circuit 3452 is connected to battery charging circuit 3448 to control its operation. For example, the battery control circuit can direct the charging circuit to charge the battery or stop charging the battery, such as when the user wants to enter the synchronization mode.

Via DC-to-DC converter 3416, case battery 3412 is used to charge the battery of the electronic device. Converter 3416 is used to convert the output voltage of the battery (e.g., 3.7 volts) to the voltage level used by the phone (e.g., 3.3 volts or 5 volts). In a specific implementation, the phone uses 5 volts and converter 3416 converts the output voltage of the battery to 5 volts.

A fuel gauge circuit 3456 is connected to case battery 3412, which will determine a charge level of the battery. The determined charge level is passed to a control system circuit 3460, which appropriately lights LED indicators 3464 to show the user the charge level. In an implementation, the control system uses a 3.3 volt level, and there is a 3.3 volt power converter circuit 3468 that takes power (e.g., 5 volts) from the USB and converts it to the desired level.

Control system circuit 3460 controls the case's overall operational modes as described above. For example, the control system controls the battery charging, battery level, authentication, and synchronization operations. The control system can be implemented using a microcontroller and firmware. The firmware may be encrypted. The microcontroller will decrypt the firmware before utilizing it.

Some examples of microcontrollers include processors from Intel Corporation, International Business Machines Corporation, MIPS Technology Incorporated, ARM Limited, and Atmel Corporation. For example, Atmel manufactures the AVR® 8-bit microcontroller products, which is described in data sheets and other product literature published by Atmel, which is incorporated by reference along with all other references cited in this application. Such a controller can be used to control operation of the case.

The figure shows a functional block diagram that can be implemented using any number of integrated circuits and any number of circuit boards. For example, battery charging circuit 3448 can be one integrated circuit. Authentication circuit 3440 can be another integrated circuit. The fuel gauge, battery control, A/D, control system, and UC can be implemented using a single integrated circuit. The integrated circuit or chips can be placed on one or more printed circuit boards (PCBs) connected by wiring. The architecture may depend on many factors, such as the cost, availability, and time to market.

Figure 35:
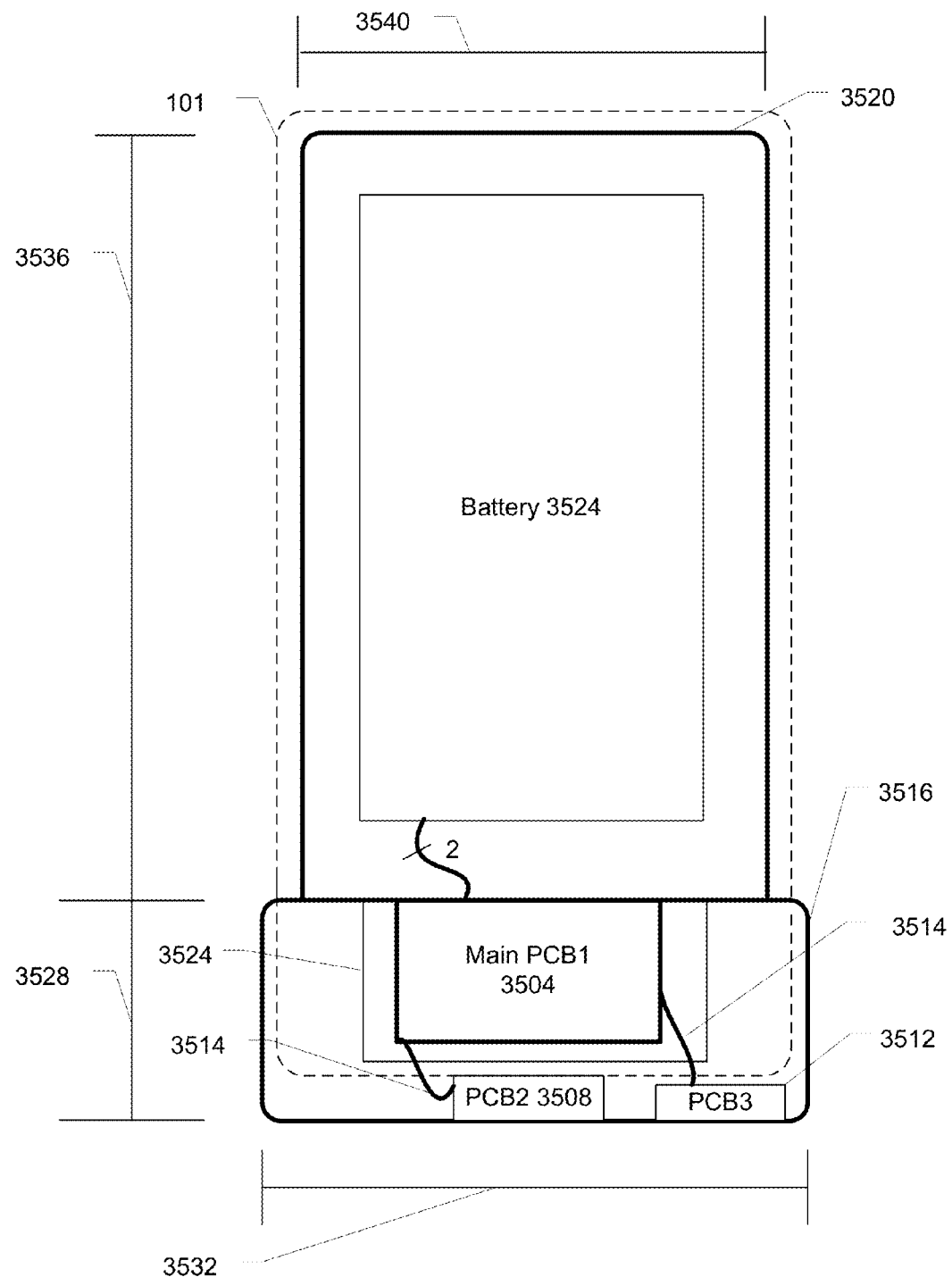
FIG. 35 shows a layout view of the components for the lower case portion, as viewed from a back side of the lower case portion.

FIG. 35 shows a layout view of the components for the lower case portion, as viewed from a back of the lower case portion. There are three PCBs, PCB1 3504, PCB2 3508, and PCB3 3512. PCB1 3504 is the main PCB, which contains the controller, firmware, authentication chip, battery charging circuit, and LEDs. PCB2 3508 contains the case connector (e.g., 30 pin connector). PCB3 3512 contains the USB connector. PCB1 3504 connects to PCB2 3508 through a cable 3514. PCB1 3504 connects to PCB3 3512 through a cable 3514.

In a specific implementation, cables 3514 are flexible printed circuit (FlexPC) cables. In another implementation, cables 3514 are not flexible printed circuit cables, but other connections or cabling such as ribbon cables or wires.

A first section 3516 of the lower case portion holds the PCBs, while a second section 3520 holds a case battery 3524. The case battery is connected to PCB1 3504. In an implementation, the battery has plus (e.g., red) and minus (e.g., black) wires that are connected to the appropriate points of PCB1 3504. Below the battery, on the other side of the lower case portion, is the portable electronic device 101 (indicated with broken lines). Note that the portable electronic device extends below PCB1 3504.

Figure 36:
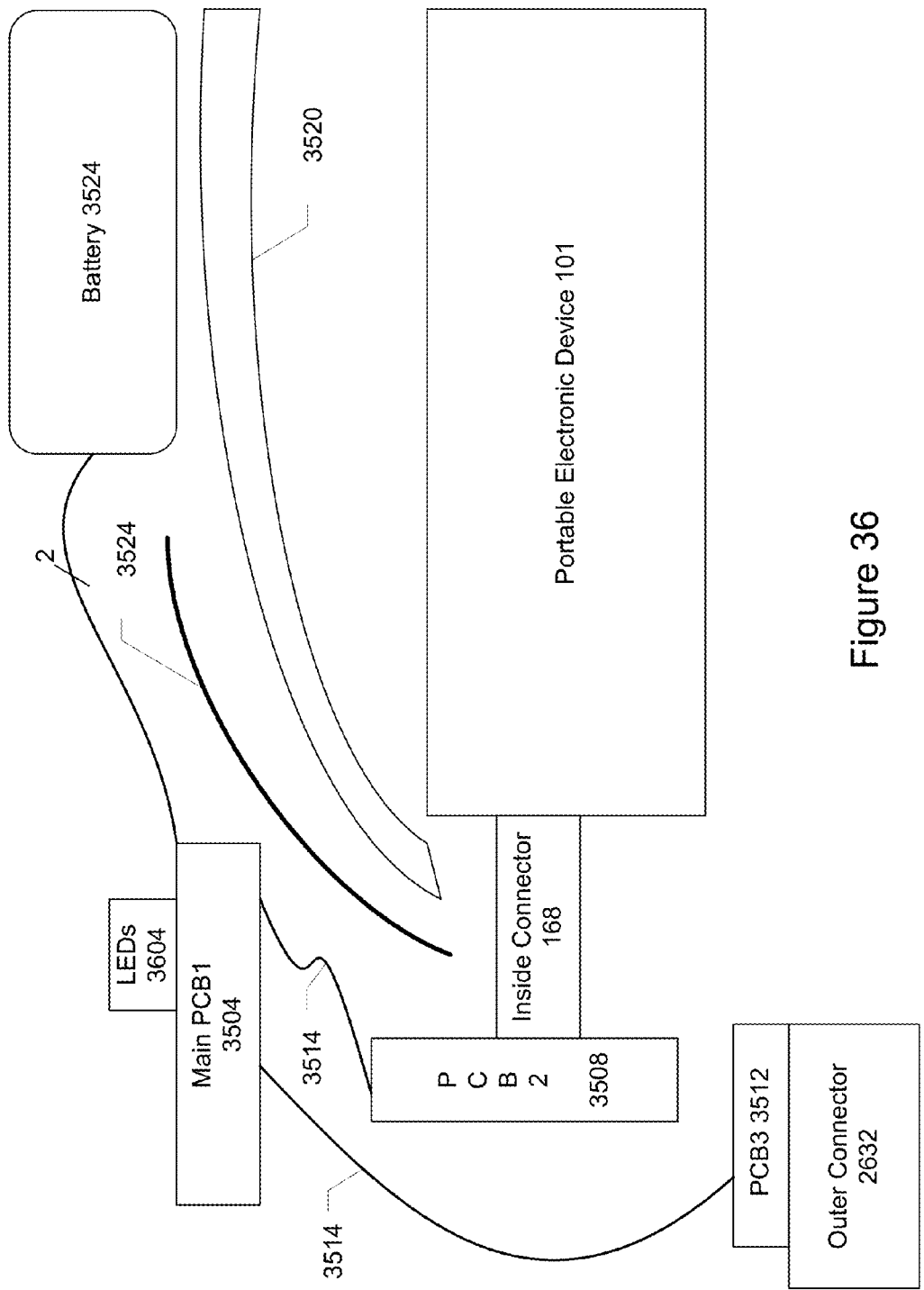
FIG. 36 shows a cross section of a portion of the lower case portion.

Beneath PCB1 3504 is a shield 3524. FIG. 36 shows a cross section of first section 3516. As shown, the shield is between PCB1 3504 and the portable electronic device. In particular, the shield is between the case circuitry and the base front surface. This copper shield serves to protect the portable electronic device from any electrical or radio interference (RF) generated by PCB1 3504, and vice versa. When there is less interference or noise interfering with the portable electronic device's operation, the portable electronic device will have better operating characteristics. For example, a phone will have better reception and transmission (e.g., less drop outs and voice conversations will be clearer).

In a specific implementation, shield 3524 is made of copper, but in other implementations, this shield can be made of any conductive materials such as aluminum, platinum, gold, or silver.

In a specific implementation, a length 3528 and width 3532 of the first section is about 35 and 63 millimeters. An area of the first section is about 2205 square millimeters. A length 3536 and width 3540 of the second section is about 87 and 54 millimeters. An area of the second section is about 4698 square millimeters. A ratio of the first section to the second section is about 0.469 (i.e., 2205 square millimeters/4698 square millimeters). In other implementations, however, the ratio can be in the range from about 0.333 to about 0.6. Generally, the greater the ratio, the battery will be larger and can provide longer battery life.

As shown in FIG. 36, PCB1 3504 is placed in a first orientation (e.g., horizontal), while PCB2 3508 is positioned in a second orientation, which is transverse (e.g., vertical) to PCB1 3504. PCB3 3512 is also positioned in the first orientation.

PCB2 3508 has the internal case connector 168 (e.g., 30-pin connector), which is connected to the portable electronic device. PCB3 3512 has the USB or an outer connector 2632.

Portable electronic device 101 is connected to inner connector 168, which is connected to the PCB2. The case also has outer connector 2632 to allow connections to a power source or computer. The outer connector is connected to the PCB3.

Both the PCB2 and PCB3 are connected to the main PCB1 through cables 3514. The main PCB1 also includes LEDs 3604.

The PCBs and shield are attached to base lower back 3704 of the lower case portion. The lower case portion also includes a base front back 3708 which covers the PCBs and shields. The base lower back and base front back form a space which encases the PCBs, shield, and other components of the case. The base lower back and base front back can be made of plastic.

Figure 37:
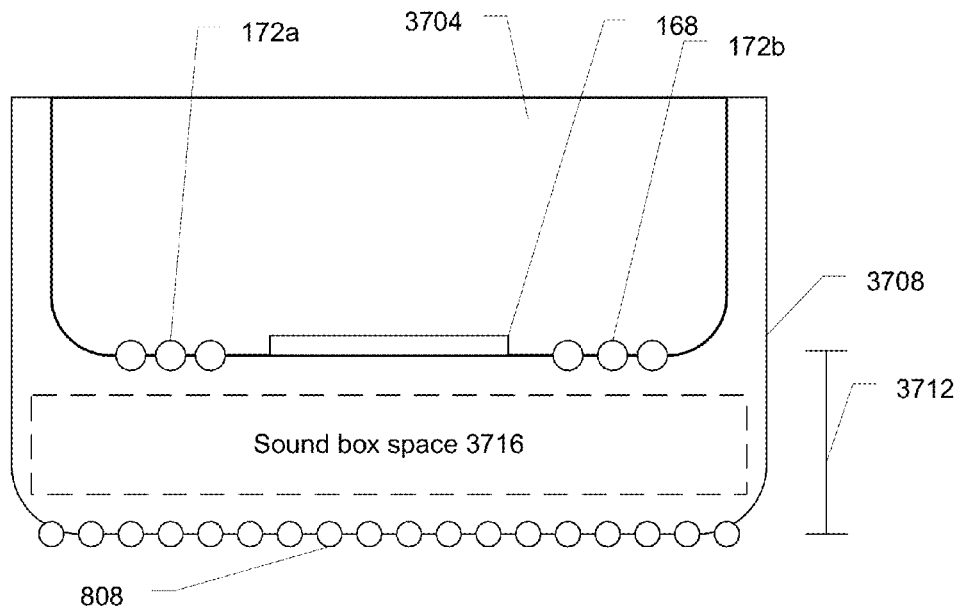
FIG. 37 shows a top view of a sound box portion of the case.

FIG. 37 shows a top view of a sound box formed by base lower back 3704 and base front back 3708. In addition to housing the circuitry, the base lower back and base front back provides a sound box, which enhances the sound and audio characteristics of the portable electronic device.

In particular, base lower back 3704 has audio openings (for a speaker or microphone, or both) 172a and 172b. The openings can be for two channels for stereo sound. See FIG. 1B which show the speaker openings for a specific implementation.

A base front back 3708 has audio openings or grille 808. See FIG. 8 for a specific implementation. A distance 3712 between the audio openings in the base lower back and base front back is about 12 millimeters. Between the openings in the base lower back and base front back is the enclosure space that enhances the sound. This space may be referred to as a sound box space 3716. For example, this space helps deepen the bass (e.g., better low frequency response) of the audio and generally enhances the sound.

Distance 3712 can be any value, such as 9, 10, 11, 13, 14, 15, 16, or greater than 20 millimeters. The greater distance 3712 is, the better the low frequency response generally will be because the enclosure is larger.

Generally, it is desirable to locate the openings such that they are aligned, parallel to, or coaxial with a direction that the sound is traveling. This helps to improve the transmission quality and clarity of the sound.

In a specific implementation, openings 172a and 172b and grille 808 are located near the case circuitry. This location helps heat released from the circuit escape from the case.

These audio openings may be of any size, any shape, any combination of sizes, or any combination of shapes. Some examples of shapes include circles, squares, rectangles, crescents, and ovals. An opening may be bounded on all sides by the case. Or, an opening may be partially bounded by the case. There may be any number of openings and these openings may be located anywhere on the case.

Figure 38:
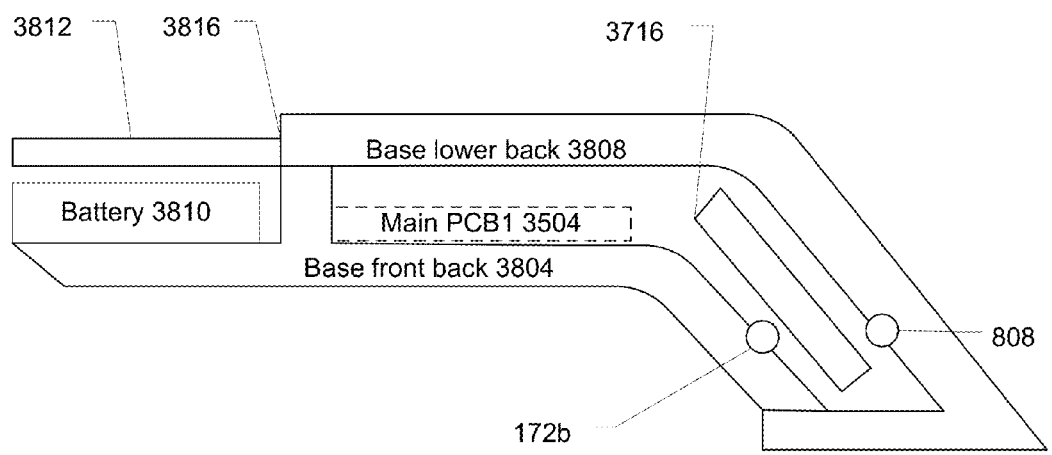
FIG. 38 shows a cross section of the sound box.

FIG. 38 shows a side view of the sound box formed by a base front back 3804 and a base lower back 3808. FIG. 38 shows sound box 3716 and main PCB1 3504 enclosed between base front back 3804 and base lower back 3808. A case battery 3810 is between base front back 3804 and a base upper back 3812.

Base lower back 3808 and base upper back 3812 meet at a seam line 3816 and are not flush with each other. The base lower back rises slightly above the base upper back so that when the upper case portion and lower case portions meet, the exterior surfaces of the upper case portion and the base lower back become flush with each other.

In a specific implementation, the case material is hard or rigid plastic or a nonelastomeric material such as a polycarbonate (e.g., Bayer PC2405 or Makrolon® by Bayer Material Science LLC). The case material can be a plastic such as a high density polyethylene, low density polyethylene, thermoplastic, amorphous thermoplastic, or other resin or polymer.

Some examples of thermoplastics includes acrylonitrile butadiene styrene (ABS), acrylic, celluloid, cellulose acetate, ethylene-vinyl acetate (EVA), ethylene vinyl alcohol (EVOH), fluoroplastics, ionomers, Kydex®, liquid crystal polymer (LCP), polyacetal (POM or acetal), polyacrylates (acrylic), polyacrylonitrile (PAN or acrylonitrile), polyamide (PA or nylon), polyamide-imide (PAI), polyaryletherketone (PAEK or ketone), polybutadiene (PBD), polybutylene (PB), polybutylene terephthalate (PBT), polycaprolactone (PCL), polychlorotrifluoroethylene (PCTFE), polyethylene terephthalate (PET), polycyclohexylene dimethylene terephthalate (PCT), polyhydroxyalkanoates (PHAs), polyketone (PK), polyester, polyethylene (PE), polyetheretherketone (PEEK), polyetherketoneketone (PEKK), polyetherimide (PEI), polyethersulfone (PES), polysulfone, polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polytrimethylene terephthalate (PTT), polyurethane (PU), polyvinyl acetate (PVA), polyvinyl chloride (PVC), polyvinylidene chloride (PVDC), and styrene-acrylonitrile (SAN).

A soft-touch or rubberized coating may be applied to the case surface to help improve a user's grip on the case. The soft-touch coating can make the case surface tacky or slightly tacky. In an implementation, both upper and lower case portions are made from the same material. However, in other implementations, the upper and lower case portions may be made of different types of materials (e.g., different types of plastics). In other implementations, the case material may be (or include), rather than a hard or rigid plastic, a compliant or rubber-like material such as a gel, elastomeric, silicone, or rubber.

When a hard plastic is used, some portions of the case can be polished to have a high gloss finish (e.g., similar to a glossy black piano), while other portions will have the soft-touch coating (which is a matte finish). In other implementations, all surfaces can have a high gloss finish. Or, all surfaces can be coated with the soft-touch coating.

In an implementation, base front surface 164 (FIG. 10), upper interior surface 916 (FIG. 9), inserts 1004a and 1004b (FIG. 10), have a high gloss finish. Surfaces 1104 (FIG. 11), 1212 (FIG. 12), 1208 (FIG. 12), 3812 (FIG. 10), 408 (FIG. 4), 412a-e (FIG. 4), 420 (FIG. 12), 3816 (FIG. 8), 3818 (FIG. 7), 3827 (FIG. 5), and 3831 (FIG. 6) have the soft-touch coating.

The high gloss finish can be obtained or achieved by polishing, sanding, rubbing, or buffing the surface with a relatively fine grit material (e.g., sandpaper, polishing cloth, or paste). One can polish the plastic with successively finer grit materials until the desired finish is obtained. Polishing can be performed using a buffing machine, such as a rotary buffing machine or other buffing machine.

The soft-touch coating can be applied by, for example, spraying, brushing, or painting an appropriate coating on the desired surfaces. In a specific implementation, the coating has a thickness of about 0.1 millimeters. But the thickness of the coating can vary, for example, due to manufacturing variations. In other implementations, for example, the thickness can be from about 0.05 millimeters to about 0.3 millimeters. In further implementations, the coating can be less than 0.05 millimeters or greater than 0.3 millimeters. Generally, the surfaces where the soft-touch coating will be applied do not need to be polished before the coating is applied. However, it may be desirable to buff slightly before applying the coating to ensure the surface is smooth (but not necessarily a high gloss finish) before applying the coating.

As shown in FIG. 10, base front surface 164 may include strips 160a and 160b, which are parallel to each other and vertical (when viewing the case in a portrait orientation). As discussed above, these strips help protect the finish of the back of the portable electronic device.

In other implementations, the case can be a material other than plastic. Some examples of case materials include metal (e.g., stainless steel or titanium), glass, transparent or translucent plastic, sapphire, diamond, leather, vinyl, quartz, granite, and many others.

Some specific flows and techniques are described for making a case of the invention in this application, but it should be understood that the invention is not limited to the specific flows and steps presented. A flow of the invention may have additional steps (not necessarily described in this application), different steps which replace some of the steps presented, fewer steps or a subset of the steps presented, or steps in a different order than presented, or any combination of these. Further, the steps in other implementations of the invention may not be exactly the same as the steps presented and may be modified or altered as appropriate for a particular application or based on the data.

Figure 39:
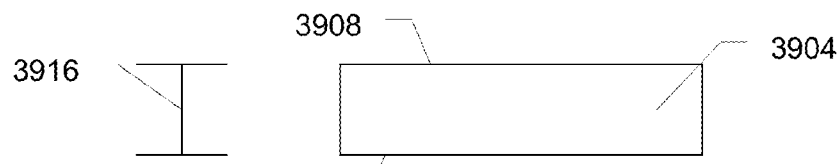
FIGS. 39-42 show steps in a process of making a flush indicator light covering for the case.

In an implementation, the back of the lower case portion has a flush-mounted case button and flush lighting indicators. FIGS. 39-42 show steps in a process for making a flush lighting indicator on a surface of the case (e.g., 412*a-e* of FIG. 4). In an implementation, the process includes:

1. Providing a starting material having a uniform thickness. As shown in FIG. 39, the case material is a plastic 3904 having a certain thickness. This plastic is about 95 percent or greater opaque, which means visible light (e.g., LED light) will not shine through it easily. The plastic can be less than 95 percent opaque. For example, the material may be transparent or translucent.

The plastic has two sides, a first side 3908 and a second side 3912. The first side is the side which the user will see and can touch. The second side is the underside, which faces the circuitry and is generally hidden from the user. Between the first side and second side is a thickness 3916. In a specific implementation, thickness 3916 is about 1.4 millimeters. Thickness 3916 can vary. In other implementations, for example, thickness 3916 is from about 0.95 millimeters to about 2 millimeters. In further implementations, the thickness is less than 0.95 millimeters or greater than 2 millimeters.

Figure 40:
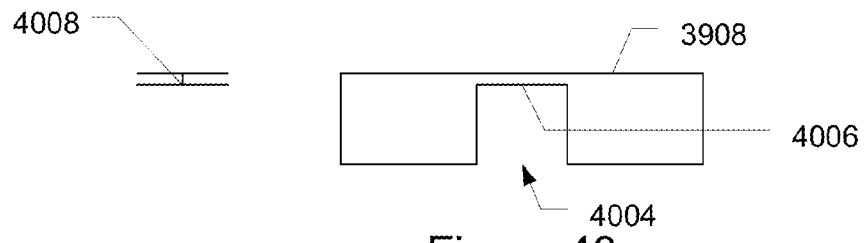

2. Forming a cavity in the material. As shown in FIG. 40, a cavity 4004 (e.g., trench or lacuna) is formed in the starting material. Cavity 4004 is a partial opening and does not go through the entire thickness of material 3904. The cavity may be formed using any process for creating an opening including molding, melting, drilling, and etching. For example, cavity 4004 is created by drilling into the plastic from the second side to the first side but not through the first side.

A thickness from a bottom 4006 of the cavity to the first side is a thickness 4008. In a specific implementation, thickness 4008 is about 0.4 millimeters. However, thickness 4008 can vary depending, for example, on manufacturing variations. For example, the thickness can vary from about 0.2 millimeters to about 0.7 millimeters.

A ratio of thickness 4008 to thickness 3916 is about 0.286 (i.e., 0.4 millimeters/1.4 millimeters). If thickness 4008 remains at 0.4 millimeters, the ratio can vary depending on the thickness 3916. As thickness 3916 increases, the ratio will decrease. In other implementations, a ratio of thickness 4008 to thickness 3916 is about 0.05, 0.12, 0.15, 0.18, 0.20, 0.22, 0.28, 0.32, 0.33, 0.38, or 0.42, or any other ratio.

Thickness 4008 will be sufficiently thin so the plastic will be much less than 95 percent opaque, so light can very easily pass through a thin portion 4008, but not through the thick portion 3916. The light will be visible from the first side through thickness 4008. For example, for thickness 4008, the opacity can be in a range from about 5 percent to about 30 percent.

The degree of opaqueness can be varied by varying a thickness 4008. A thinner 4008 will generally allow greater light transmission, while a thicker 4008 will block light transmission. Thus, depending on the material, and by selecting an appropriate thickness 4008, the brightness of the indicator lights can be adjusted as desired.

Figure 43:
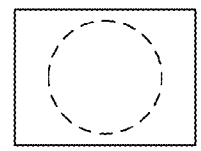
FIG. 43 shows a top view of the flush indicator light covering.

In an implementation, the cavity is circular to create a circular indicator light, such as shown in FIG. 43. But in other implementations, the cavity can be other shapes. For example, the cavity shape can be a triangle, trapezoid, square, rectangle, oval, pentagon, hexagon, octagon, or other.

Figure 41:
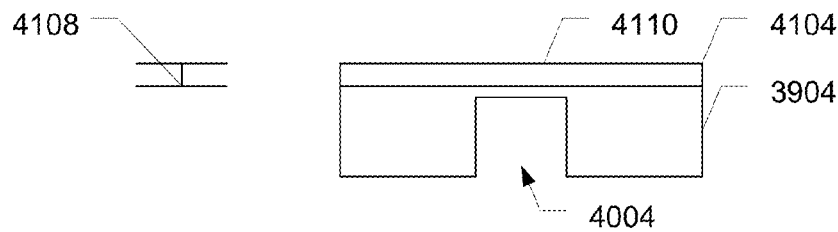

3. Coating one side of the material. As shown in FIG. 41, the first side of the plastic, which is the side opposite the opening, is applied (e.g., painted, sprayed, or brushed on) with a coating 4104. The coating sprayed has a thickness 4108, less than thickness 3916. In a specific implementation, the coating is sprayed over the first side of the plastic including the surface above the opening. Before and after applying the coating, the exterior surface (3908 and 4104) of the case is smooth.

In a specific implementation, the coating is clear and allows visible light from the second side to pass through and be visible from the first side. Coating 4104 is the same soft-touch coating that is applied to the exterior of the rest of the case. This soft-touch coating allows visible light from the second side to pass through and be visible from the first side. In another specific implementation, coating thickness 4108 and the coating of the case both have the same thickness. In this specific implementation, coating 4108 and the coating of the case have a thickness of about 0.1 millimeters. As discussed above, this thickness may vary.

Figure 42:
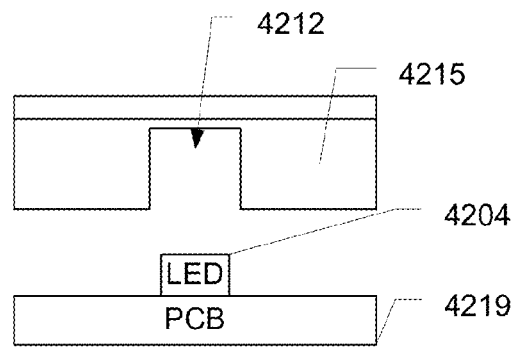

4. Positioning the cavity over a lighting source. As shown in FIG. 42, the opening is positioned above a lighting source 4204 such as an LED. The opening can be above the lighting source (e.g., offset or to the side) as long as light from the light source can pass through the opening and be visible from the first side. In a specific implementation, the opening is directly above the lighting source. In another specific implementation, the lighting source is positioned facing toward the cavity such that when the lighting source emits visible light, it passes through thickness 4008 and 4108, but not thickness 3916, to the first side.

When the LED lights up, the light from the second side is visible through the opening and coating (4212) from the first side. But light is not visible through other portions (4215) where the case material is thicker. The LED may be on a printed circuit board PCB 4219.

FIG. 43 shows a top view of the lighting indicator from the first side of the plastic. The lighting indicator is shown using broken lines to indicate it is hidden when it is not lighted. Specifically, when LED 4204 lights up, a user can see light through the opening and coating. The shape of the cavity will be the shape of the light. With the flush lighting cover of the invention, when the LED is not lighted up, the user may not even realize that the lighting indicator is there. When not lighted, the surface of the case over the opening (4212) appears the same as the thicker portions (4215).

Therefore, the lighting indicator does not project out from the surface, resulting in a smooth back surface and a smooth tactile feel (e.g., completely flush). In other implementations, the lighting indicators may bulge above or be recessed in the surface of the case.

Figure 44:
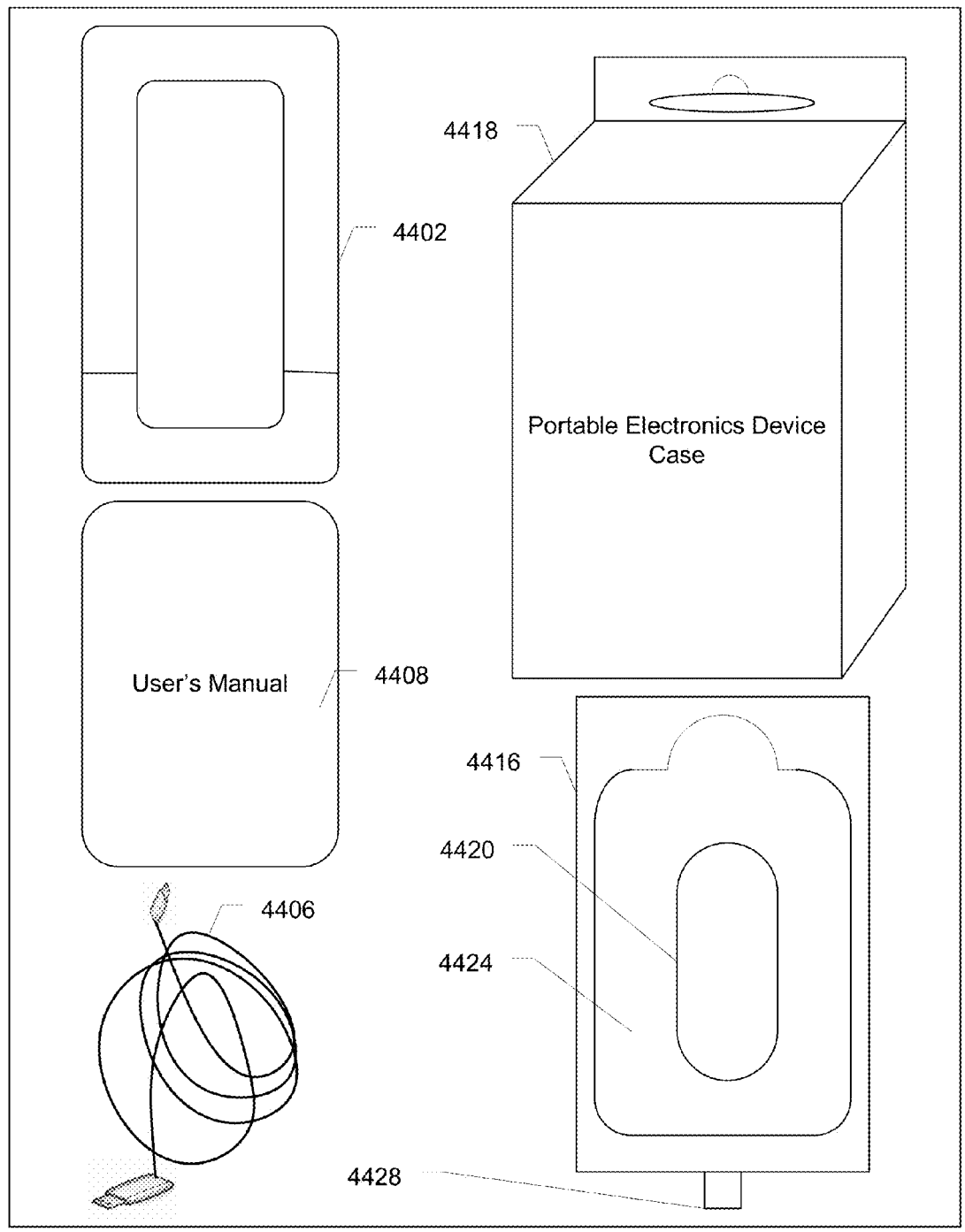
FIG. 44 shows a kit for a portable electronic case with a battery including a tray to hold the case and a cable.

FIG. 44 shows a kit including a portable electronic device case with a battery (as described above). The kit includes a portable electronic device battery case 4402, a cable 4406 (e.g., USB cable), a user manual 4408, a tray 4416, and a box 4418. The portable electronic device battery case can be a case as described in this application. The tray holds the case, cable, and user manual. The tray with components slides into the box. The user manual describes the features of the case and how to use them. The cable is for charging the case and also for synchronizing. The cable can be a USB or a universal serial bus cable having a first end with a USB Type A plug connector and a second end having USB Mini-B plug connector.

Figure 45:
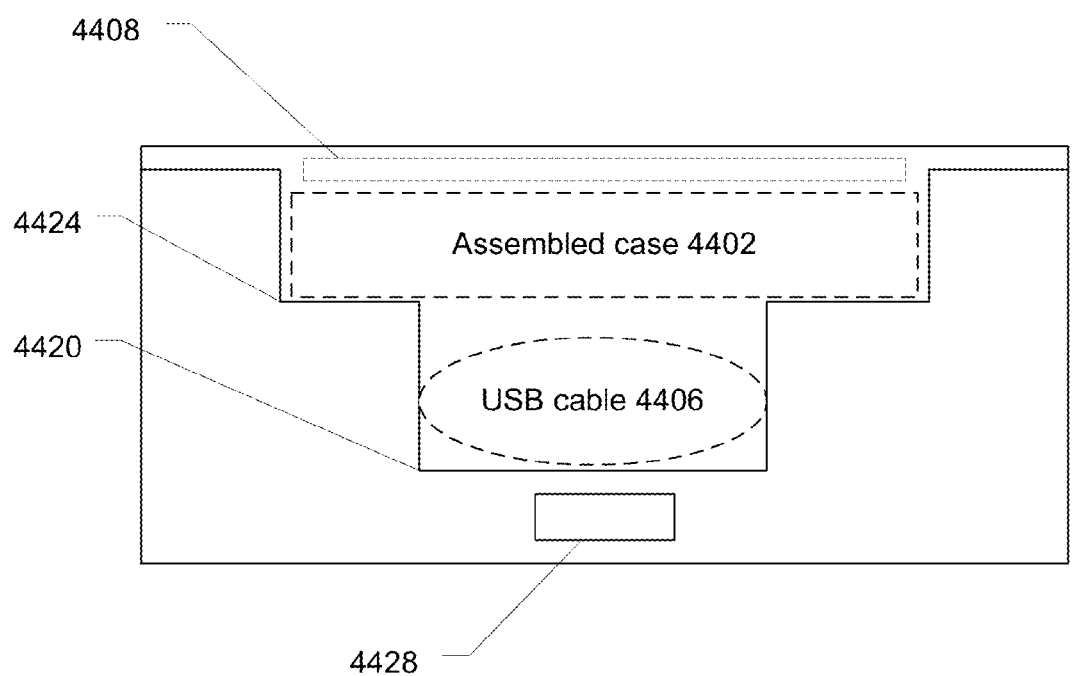
FIG. 45 shows a cross section of an implementation of a tray for the kit. This tray has multilevel compartments.

The tray is designed with compartments to hold the case, cable, and user manual neatly. FIG. 44 shows a top view of the tray and multilevel compartments, while FIG. 45 shows a cross-sectional view. The shape and depth of each compartment is customized for the component which it will hold (i.e., case or cable). In other implementations, the trays are not multileveled, but on a single level or on the same level, so that each item is accessible without removing another item first. The tray can be made of a foam material (e.g., black foam) or nonfoam material.

The tray has a first level compartment 4420 to hold the cable. Above the first level compartment is a second level compartment 4424 to hold the case. The second level compartment is larger in area than the first level compartment. Generally, a bigger or larger area compartment is needed to store the case than the cable. The user manual can be placed between the case and cable compartments. Or the user manual may be placed over both the case and cable such as shown in FIG. 45.

On a side of the tray (e.g., top or bottom) is a loop 4428. When assembling the kit, the tray is inserted into the box so that loop 4428 is immediately visible and accessible to the user when the user opens the box. After the user opens the box top, the user will see loop 4428 and can easily grab the loop to pull the tray out of the box.

In other implementations, however, there may be any number of cavities with different arrangements. In another specific implementation, the tray has a separate cavity (e.g., on a single level) for the user manual, case, and cable. The cavity levels allow the kit to have a thin and organized packaging.

The kit was described as having the box, user manual, cable, and tray. In other implementations, however, components of the kit can include any combinations of these components and can contain more components. For example, a kit can contain two USB cables, a tray, and a box.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method of making a smartphone case with a battery, the method comprising:
   providing a first case portion of a smartphone case comprising a base front surface and base back surface, wherein a housing of a smartphone will be placed against the base front surface;
   enclosing a battery between the base front surface and base back surface;
   connecting electronic circuitry to the battery, an inner connector, and an outer connector, wherein the inner connector is adapted to interface with a connector of the smartphone;
   providing a second case portion for the smartphone case that couples onto the first case portion;
   forming at least one sound channel in the case between a bottom inner side surface comprising the inner connector and a bottom outer side surface comprising the outer connector;
   forming a right inside audio opening through the bottom inner side surface on a right side of the inner connector and configured to align with a speaker or a microphone of the smartphone, and forming a left inside audio opening through the bottom inner side surface on a left side of the inner connector and configured to align with a speaker or a microphone of the smartphone, wherein the right and left inside audio openings are coupled to the at least one sound channel; and
   forming outside audio openings on the bottom outer side surface, wherein the outside audio openings are coupled to the at least one sound channel, the outside audio openings are adapted to receive sound waves from outside the case, such that the sound waves pass through the at least one sound channel to the right or left inside audio openings, thereby allowing the sound waves to be received by the microphone of the smartphone, and such that the speaker of the smartphone transmits sound through the at least one sound channel.

2. The method of claim 1, further comprising providing cushion strips that comprise a material that has cushioning properties to protect and cushion the smartphone when in the case.

3. The method of claim 2, wherein the base front surface includes the cushion strips.

4. The method of claim 2, wherein the cushion strips comprise one or more of rubber, vinyl, polymer, plastic, foam, a material with bubbles, and silicone.

5. The method of claim 1, wherein the case includes a front opening when the second case portion is coupled to the first case portion, the front opening configured such that a display of the smartphone is visible through the front opening, the front opening having a vertical length in a vertical direction from the bottom inner side surface toward a top of the case.

6. The method of claim 5, further comprising providing cushion strips extending along the vertical direction and having a vertical length that is more than half the vertical length of the front opening, the cushion strips comprising a material that has cushioning properties to protect and cushion the smartphone when in the case.

* * * * *